(12) United States Patent
Masuoka et al.

(10) Patent No.: US 8,129,796 B2
(45) Date of Patent: Mar. 6, 2012

(54) SEMICONDUCTOR DEVICE

(75) Inventors: Fujio Masuoka, Tokyo (JP); Hiroki Nakamura, Tokyo (JP)

(73) Assignee: Unisantis Electronics Singapore Pte. Ltd., Peninsula Plaza (SG)

( * ) Notice: Subject to any disclaimer, the term of this patent is extended or adjusted under 35 U.S.C. 154(b) by 0 days.

(21) Appl. No.: 13/070,028

(22) Filed: Mar. 23, 2011

(65) Prior Publication Data
US 2011/0241122 A1 Oct. 6, 2011

Related U.S. Application Data

(60) Provisional application No. 61/341,659, filed on Apr. 2, 2010.

(30) Foreign Application Priority Data

Mar. 31, 2010 (JP) .................................. 2010-83104

(51) Int. Cl.
*H01L 27/11* (2006.01)
(52) U.S. Cl. . 257/369; 257/334; 257/401; 257/E27.099; 257/E29.262; 257/E27.01
(58) Field of Classification Search .................. 257/369, 257/334, 401, E27.099, E29.262, E27.01
See application file for complete search history.

(56) References Cited

OTHER PUBLICATIONS

Watanabe, Shigeyoshi et al., "A Novel Circuit Technology with Surrounding Gate Transistors (SGT's) for Ultra High Density DRAM's," IEEE Journal of Solid-State Circuits, vol. 30, No. 9, Sep. 1995, 12 pages.

*Primary Examiner* — Long Pham
(74) *Attorney, Agent, or Firm* — Brinks Hofer Gilson & Lione

(57) ABSTRACT

There is provided a high-integrated complementary metal-oxide semiconductor static random-access memory including an inverter. The inverter includes: a first pillar that is formed by integrating a first-conductivity-type semiconductor, a second-conductivity-type semiconductor, and an insulating material disposed between the first-conductivity-type semiconductor and the second-conductivity-type semiconductor, and that vertically extends with respect to a substrate; a first second-conductivity-type high-concentration semiconductor disposed on the first-conductivity-type semiconductor; a second second-conductivity-type high-concentration semiconductor disposed under the first-conductivity-type semiconductor; a first first-conductivity-type high-concentration semiconductor disposed on the second-conductivity-type semiconductor; a second first-conductivity-type high-concentration semiconductor disposed under the second-conductivity-type semiconductor; a gate insulating material formed around the first pillar; and a gate conductive material formed around the gate insulating material.

6 Claims, 73 Drawing Sheets

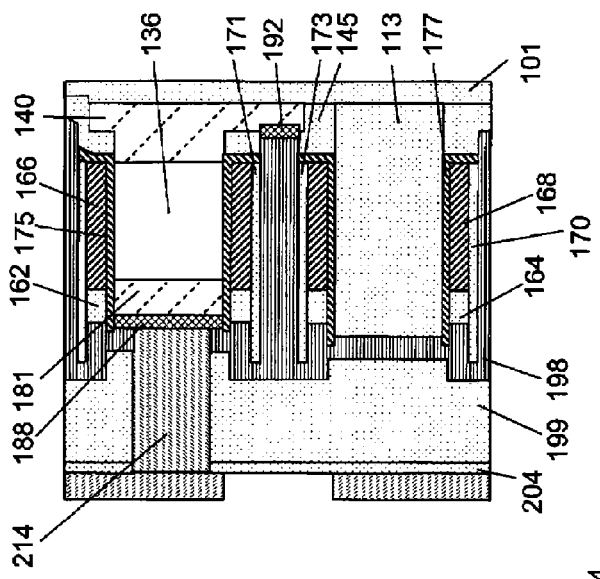
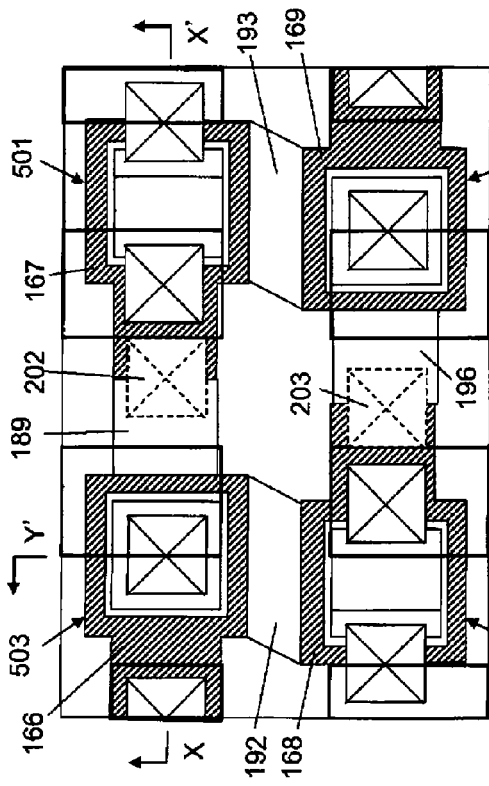
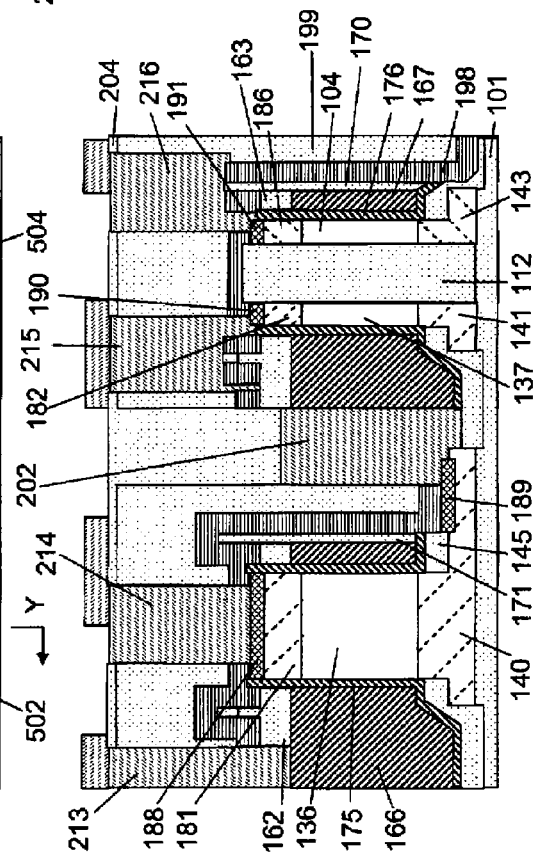
FIG. 1C
FIG. 1A
FIG. 1B

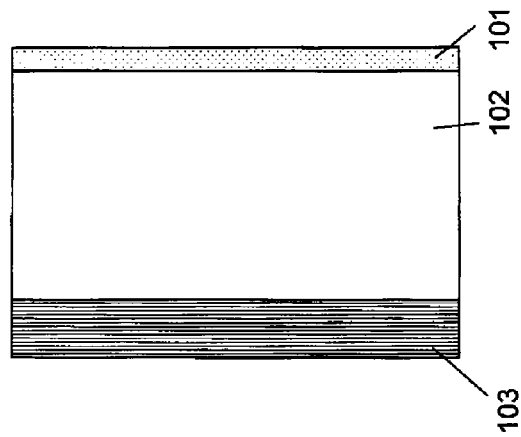
FIG. 2C
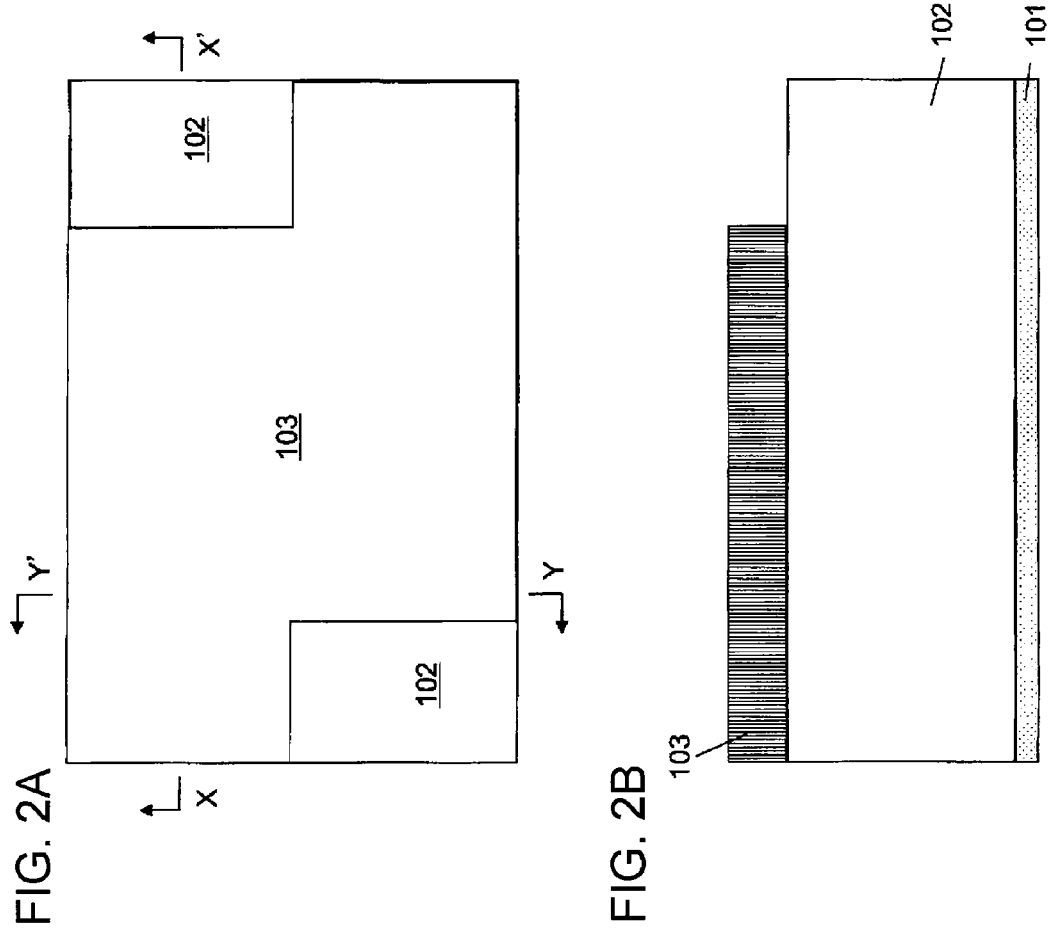
FIG. 2A
FIG. 2B

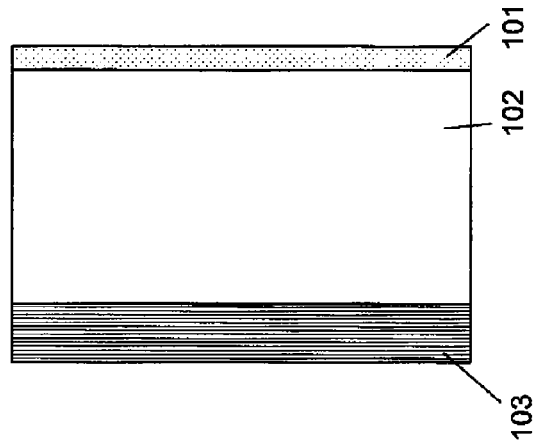
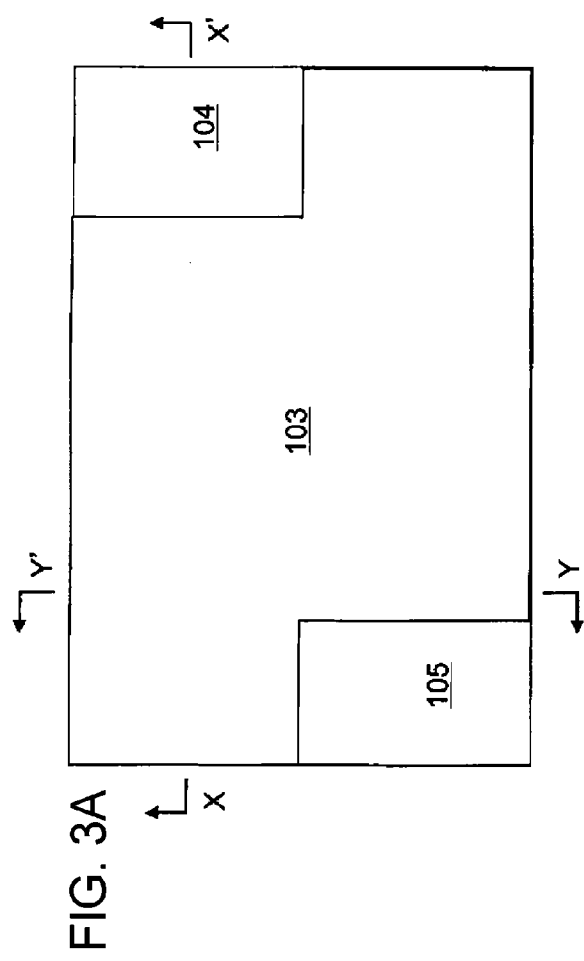
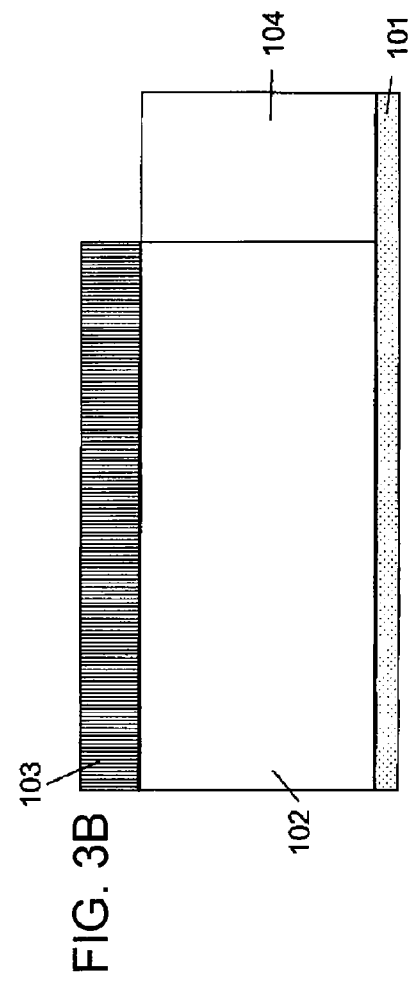

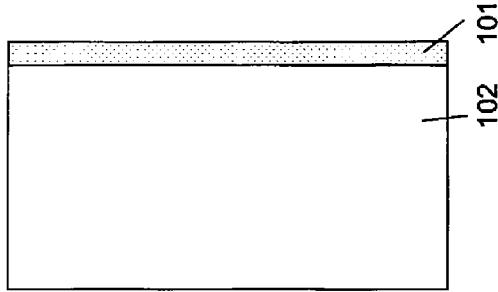
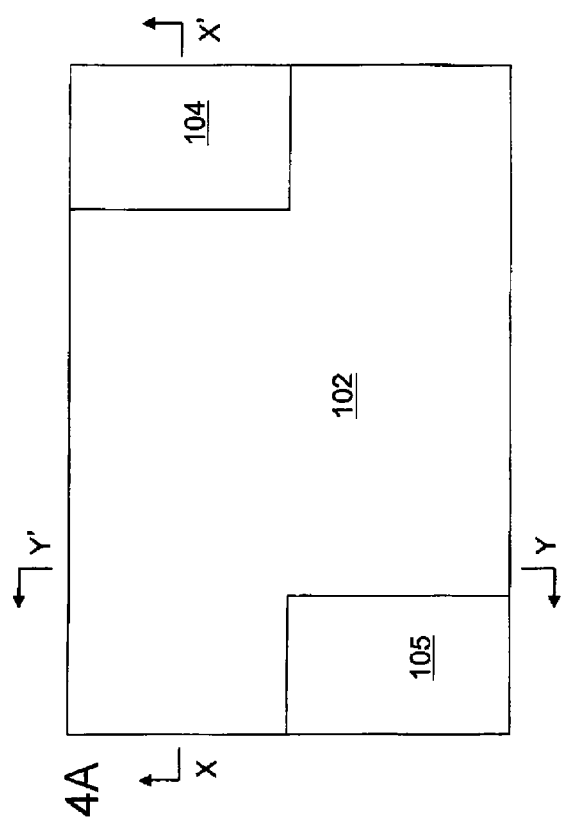
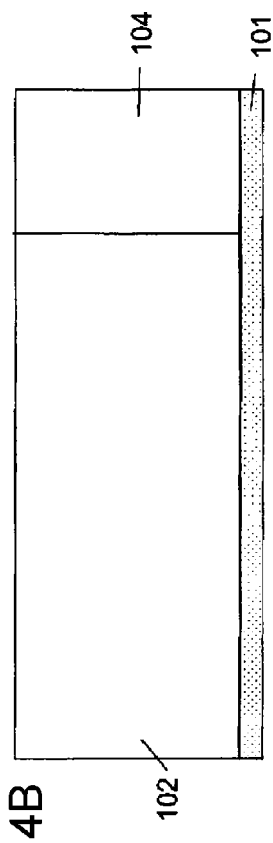

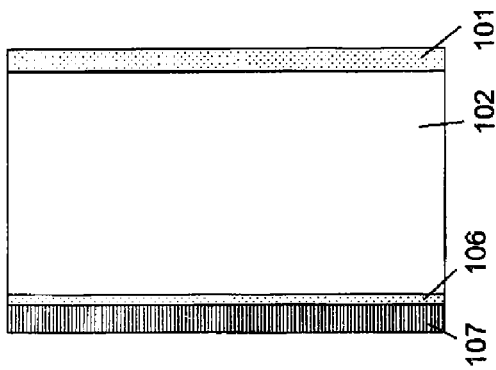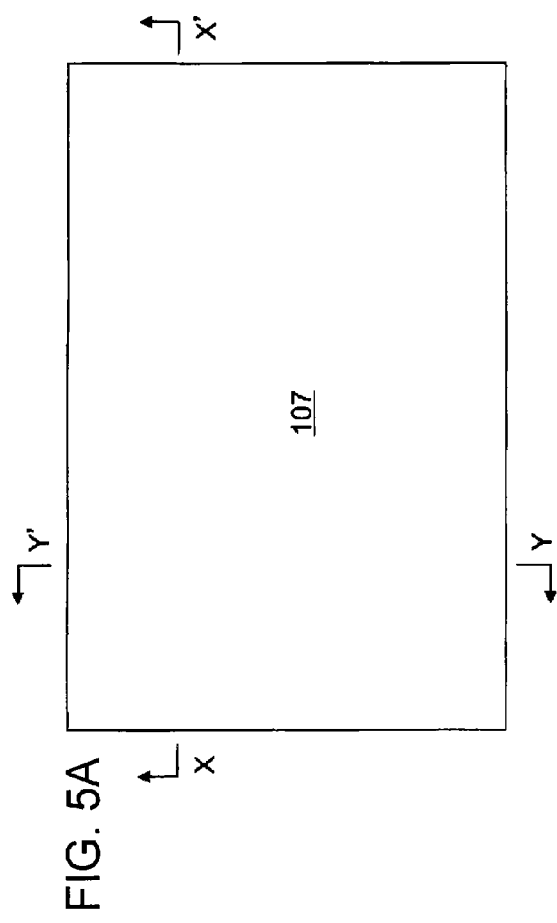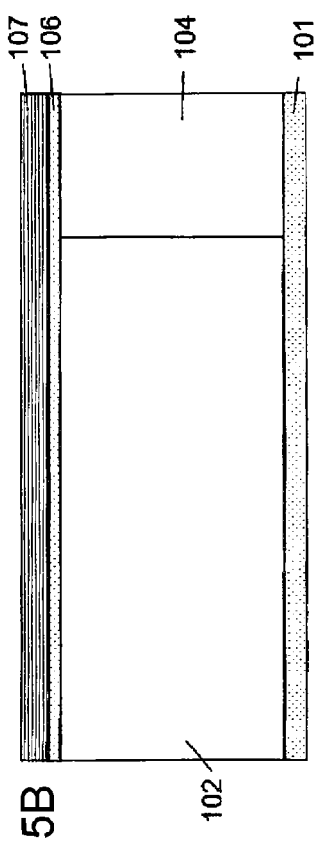

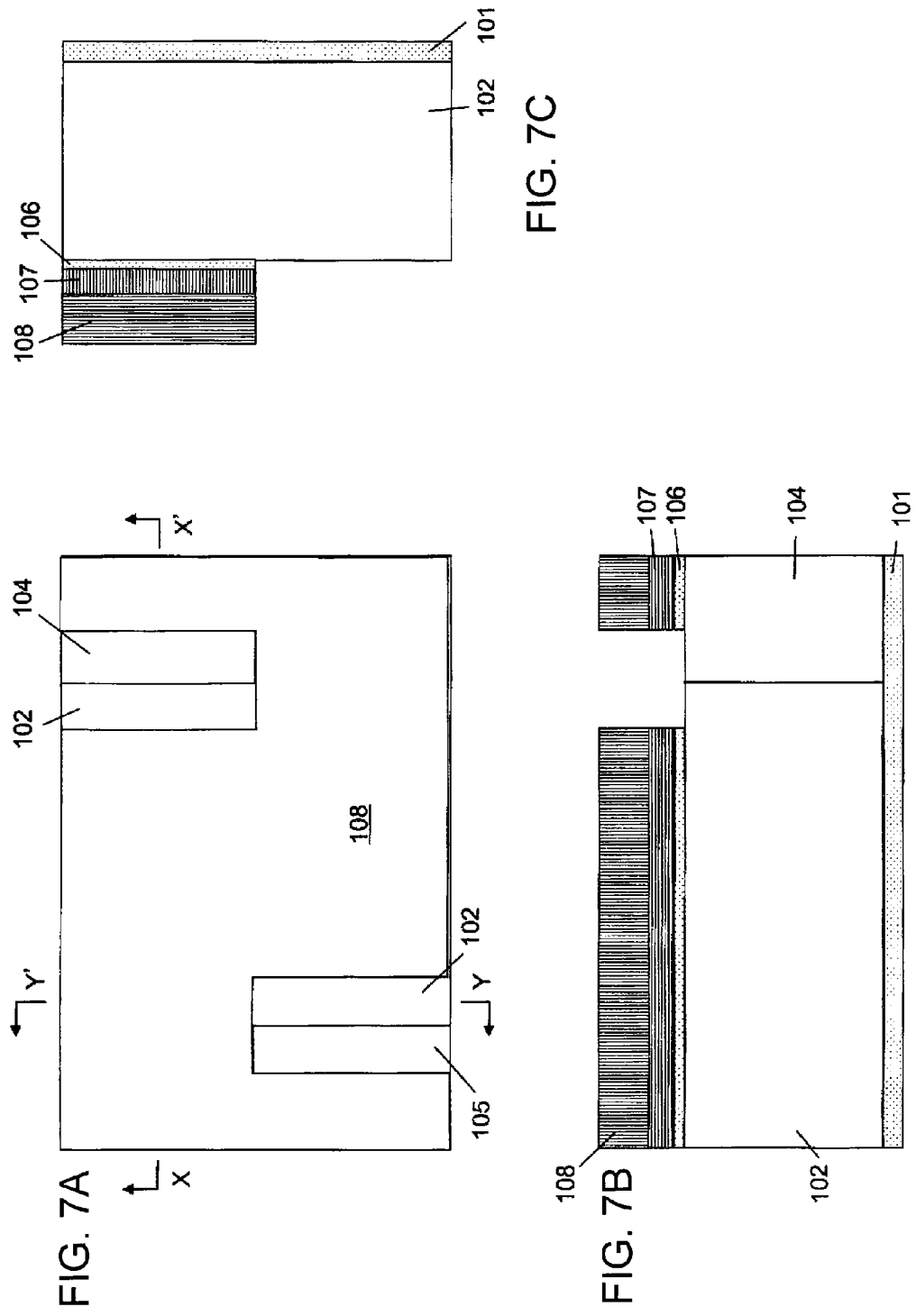

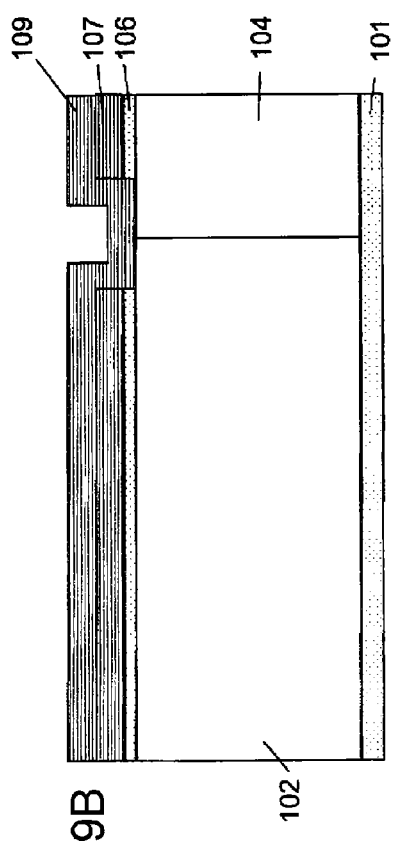
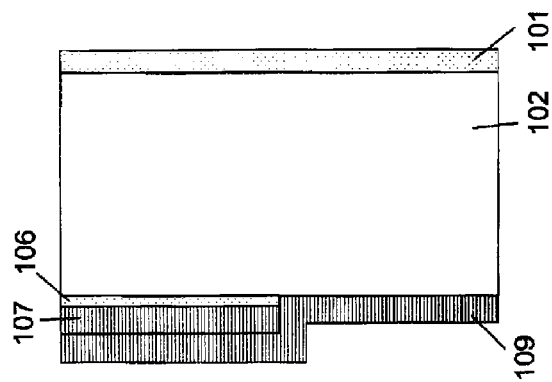
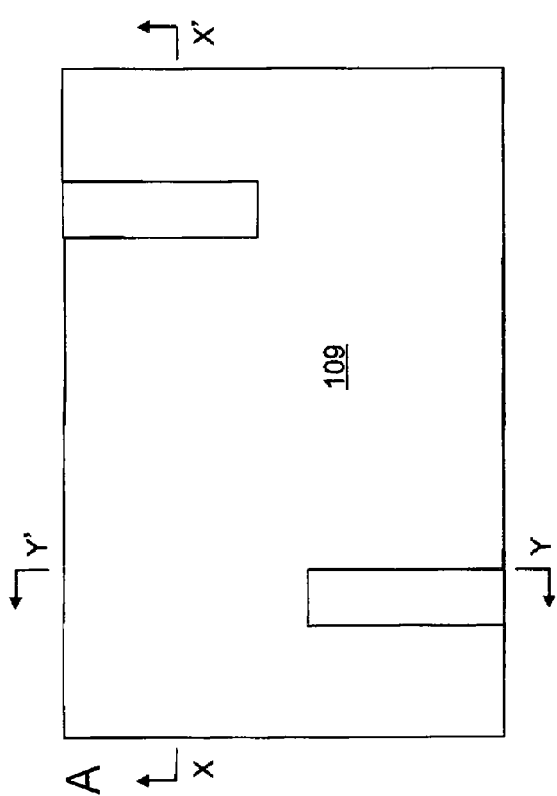

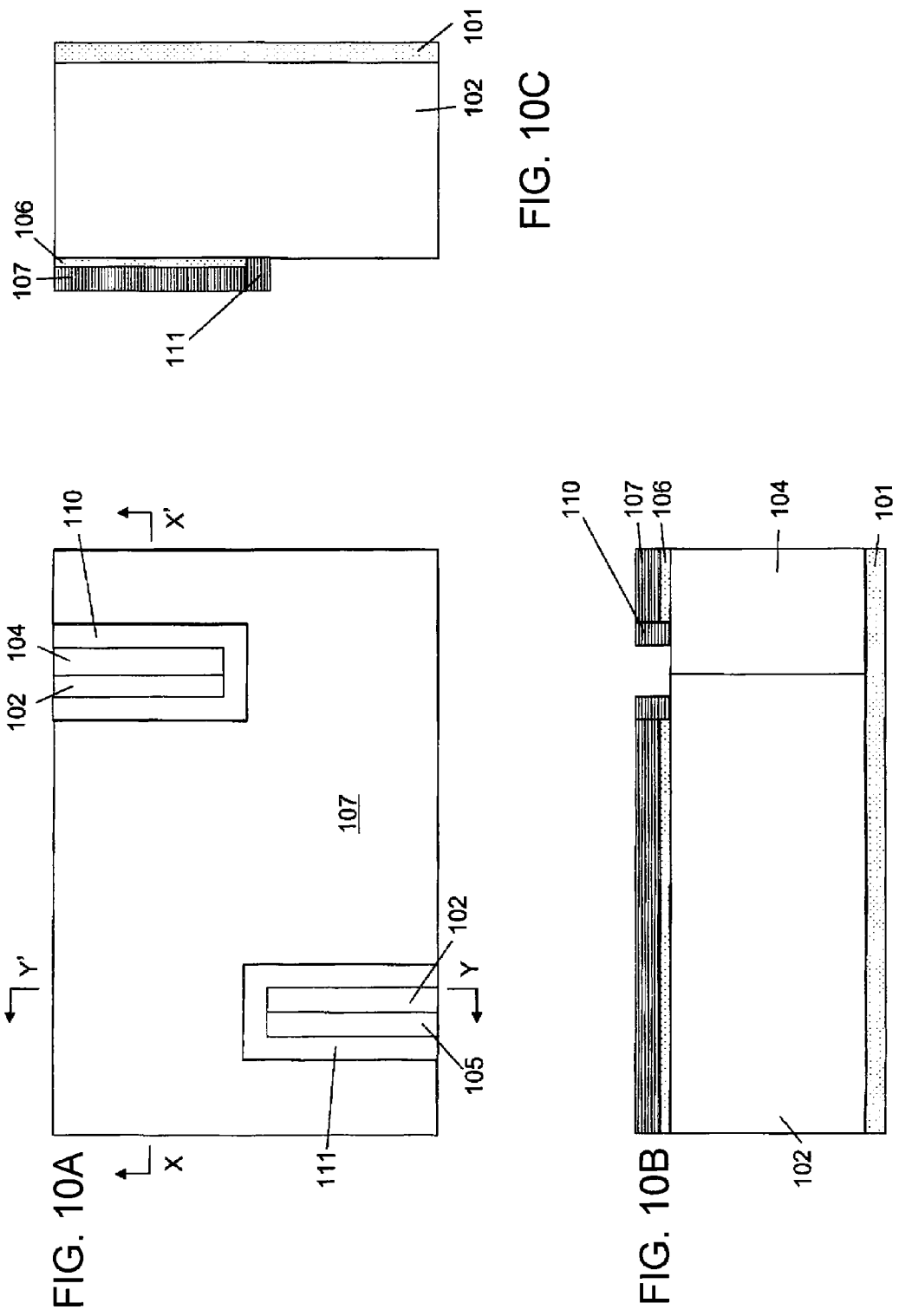

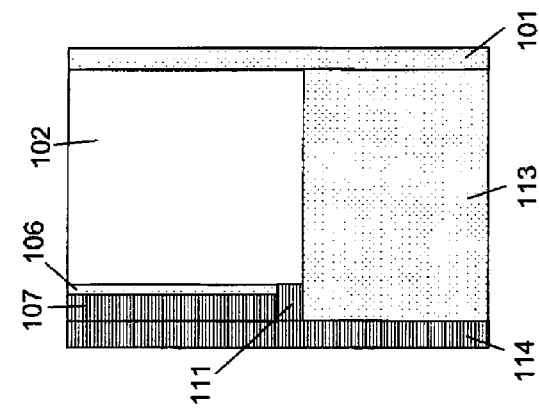
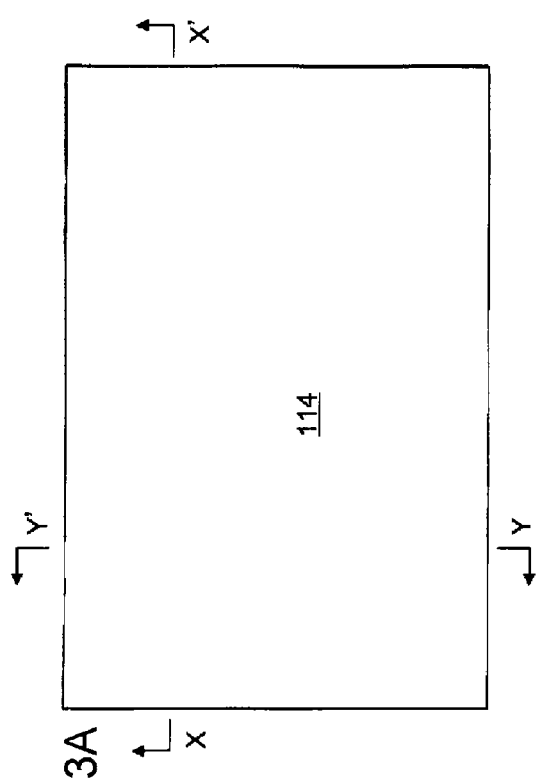
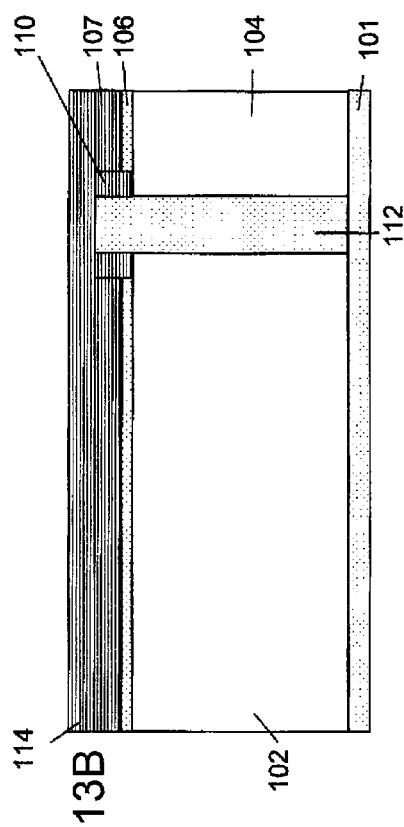
FIG. 13A
FIG. 13B
FIG. 13C

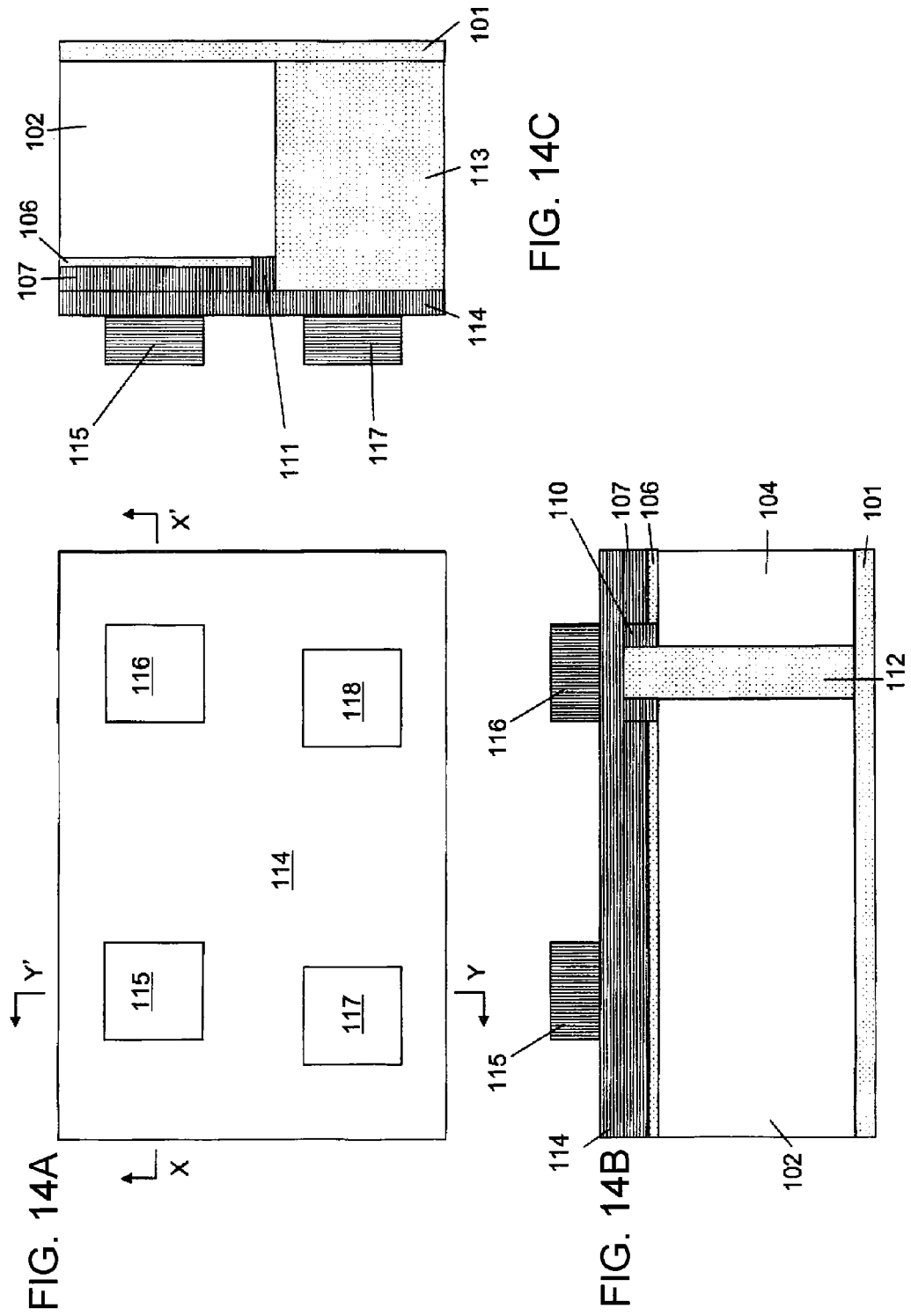

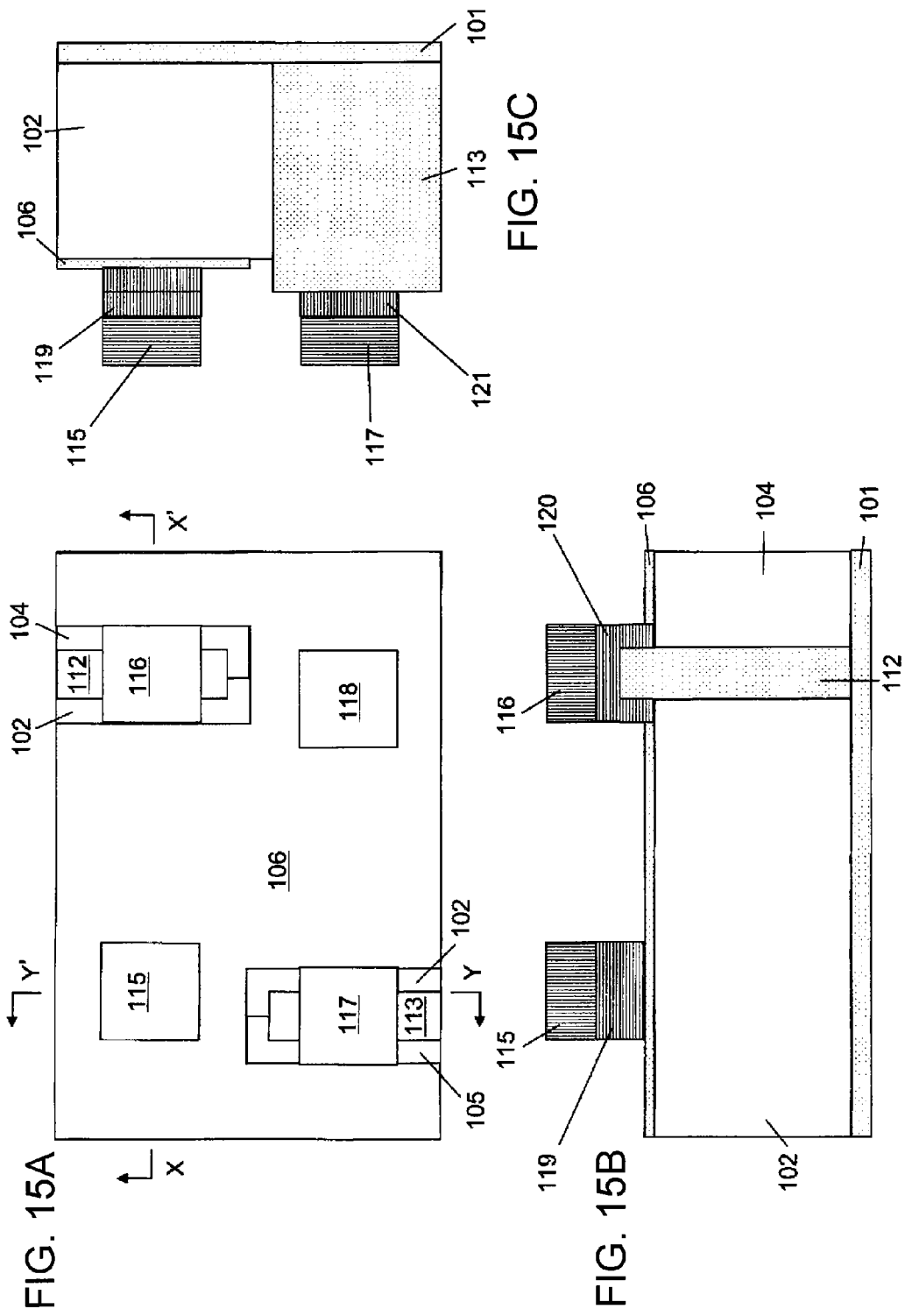

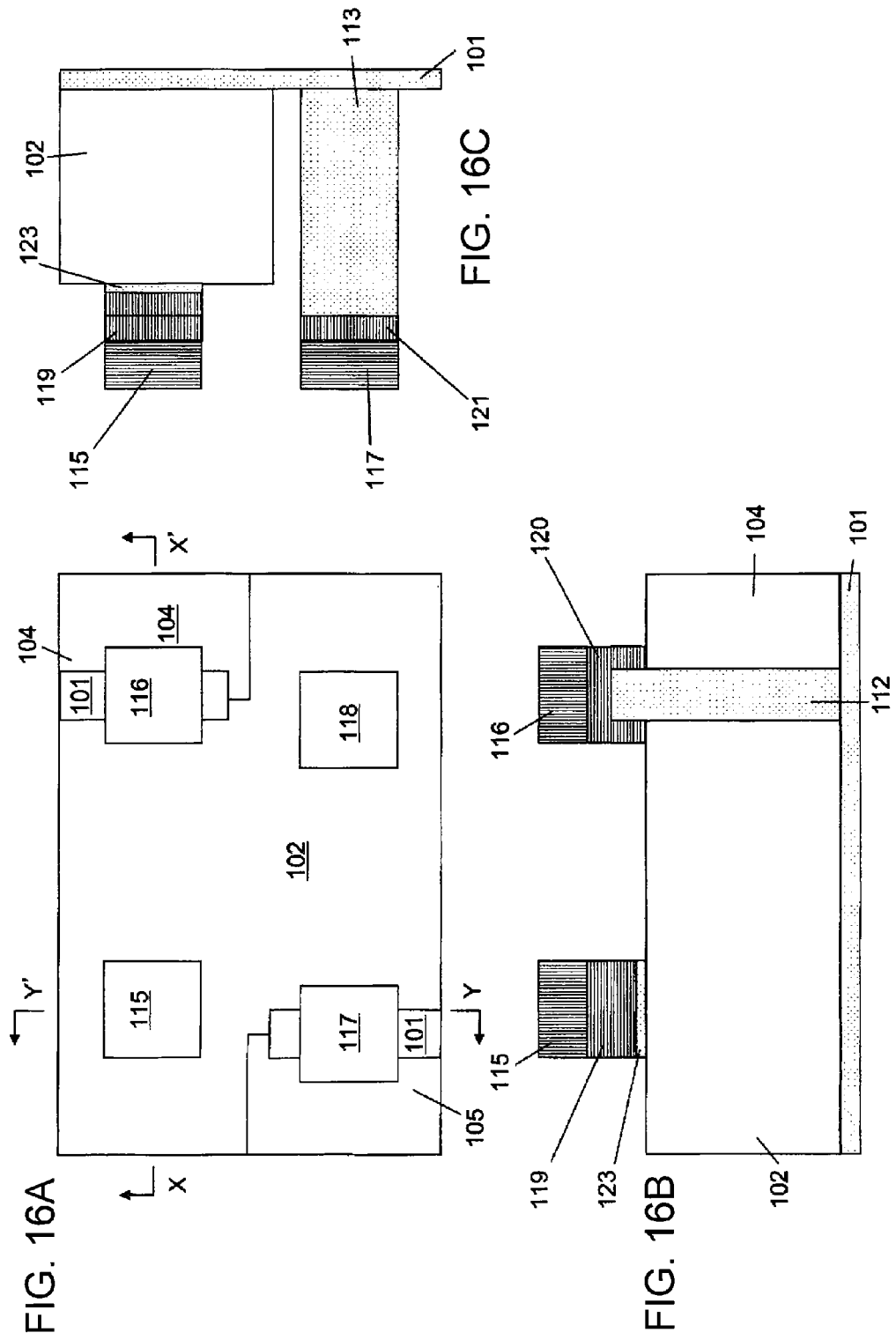

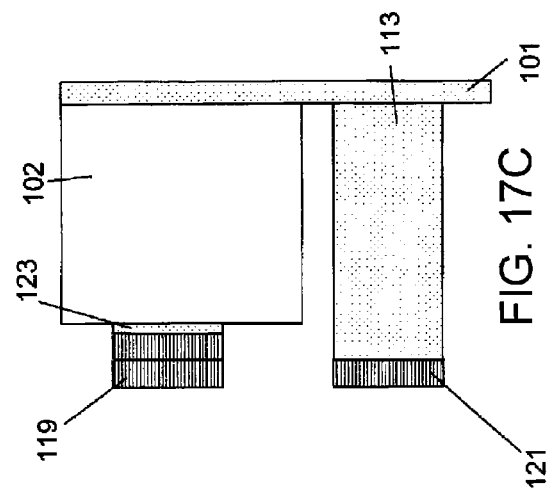
FIG. 17C
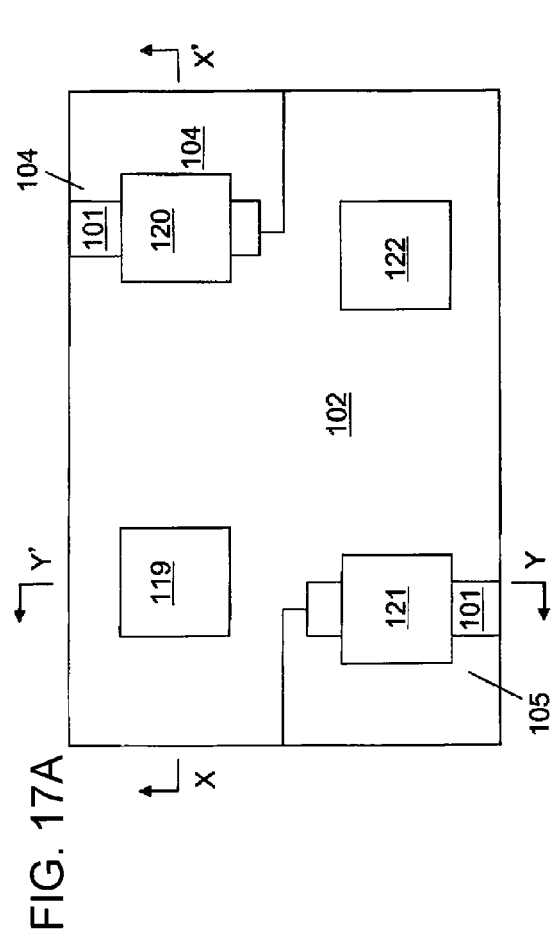
FIG. 17A
FIG. 17B
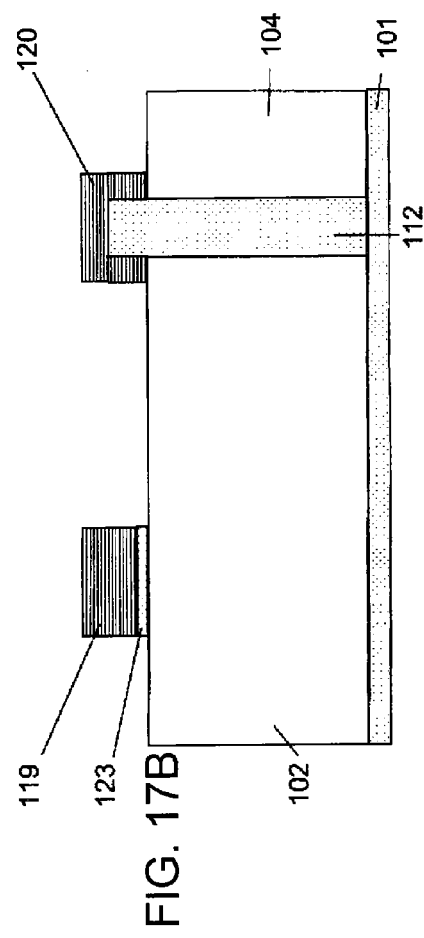

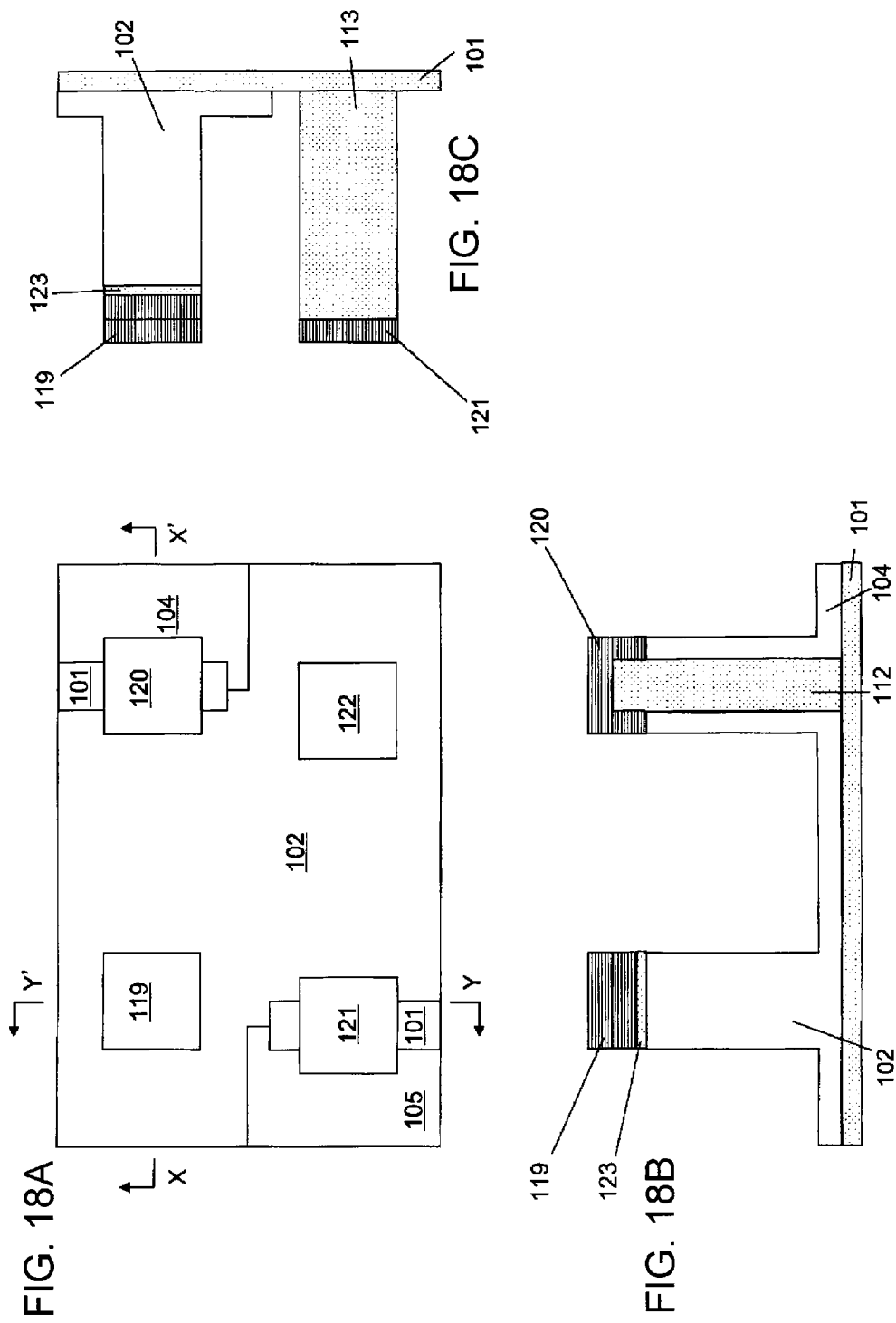

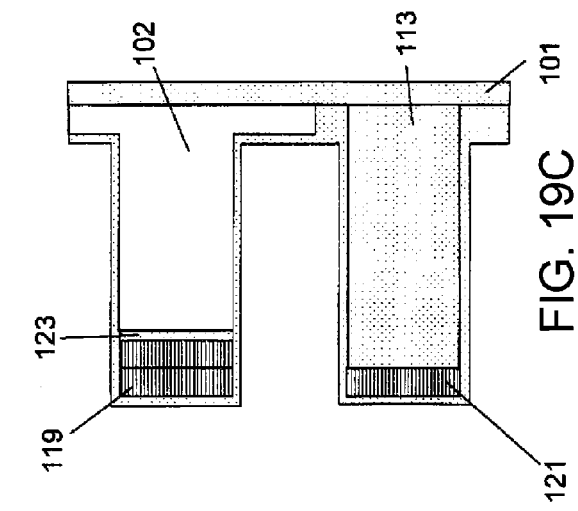
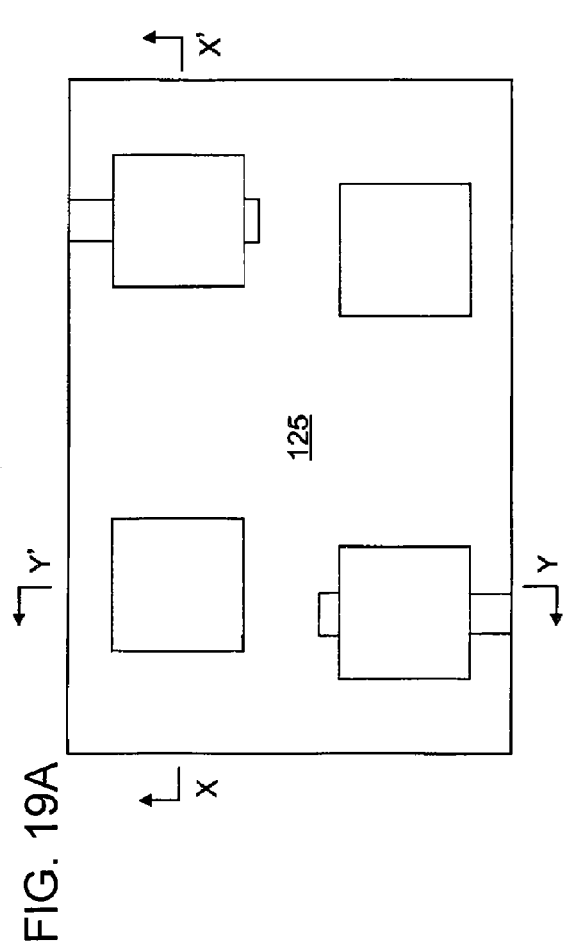
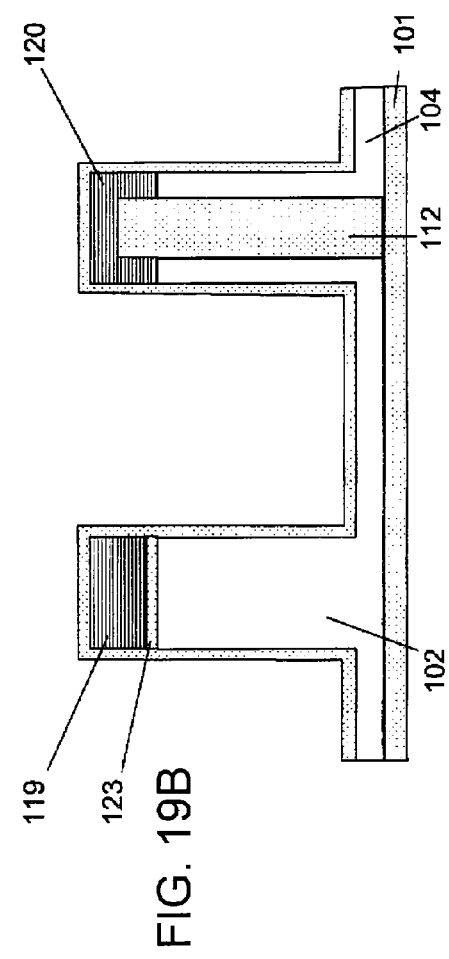
FIG. 19A
FIG. 19B
FIG. 19C

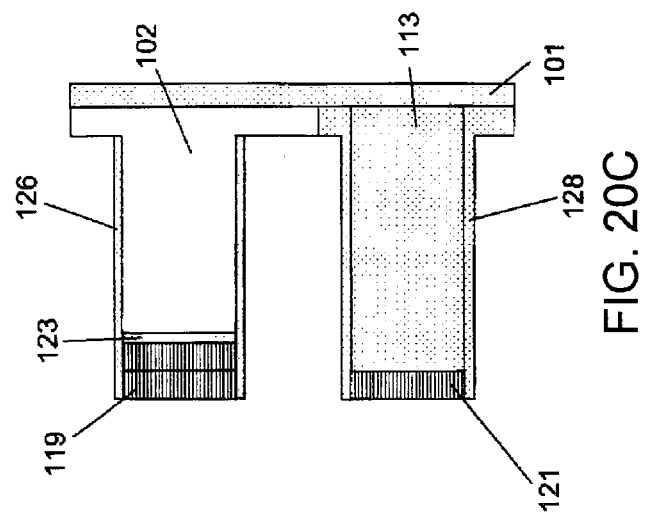
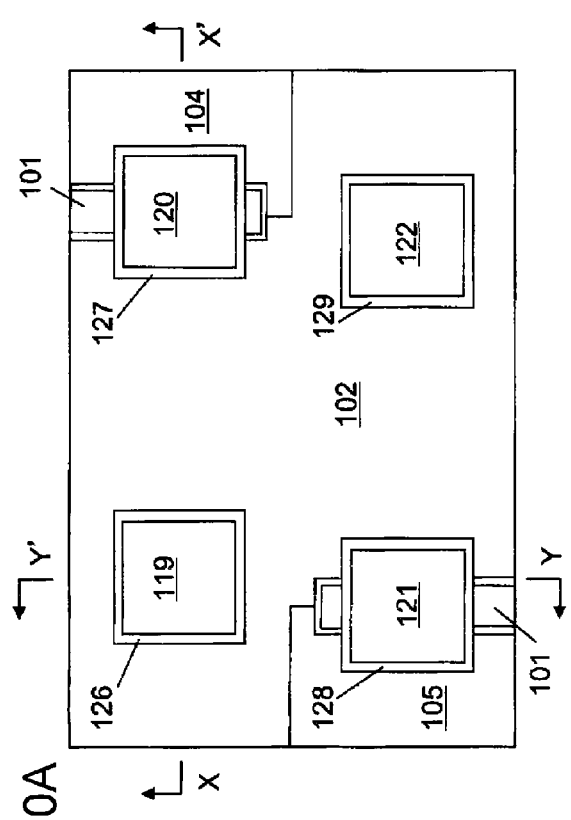
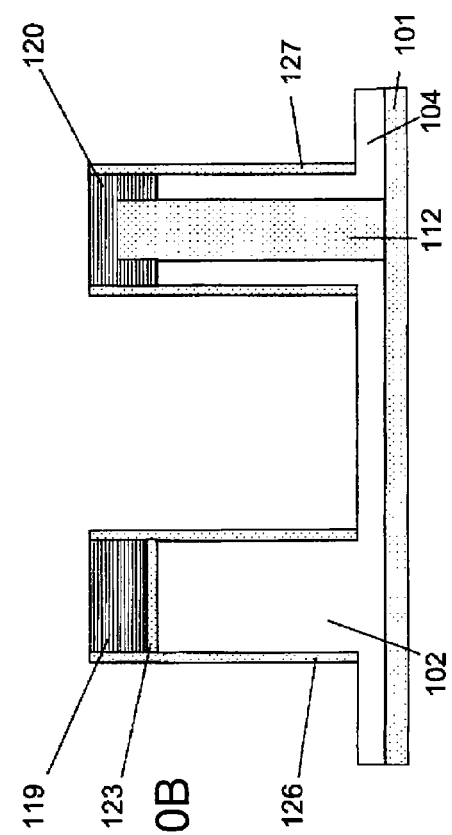
FIG. 20A
FIG. 20B
FIG. 20C

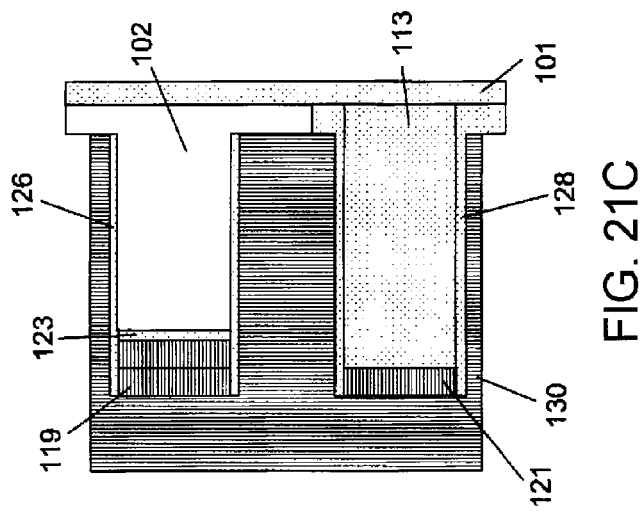
FIG. 21C
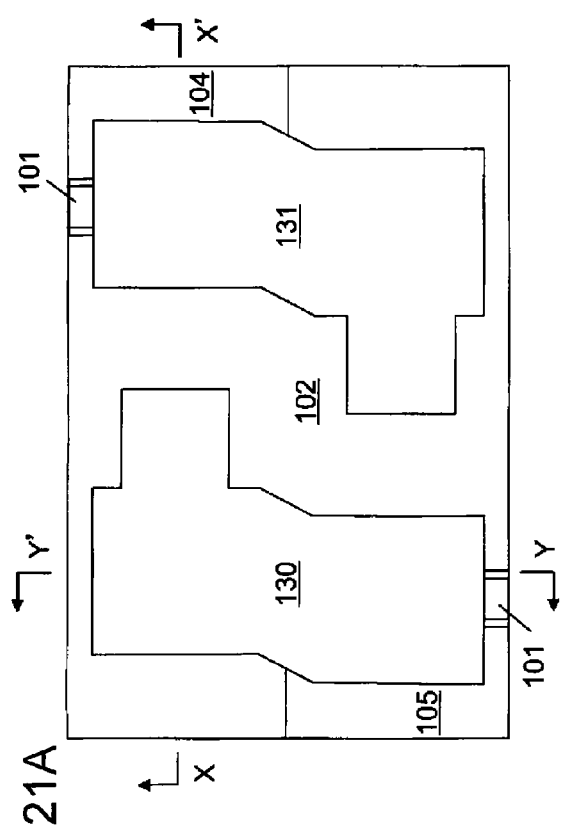
FIG. 21A
FIG. 21B
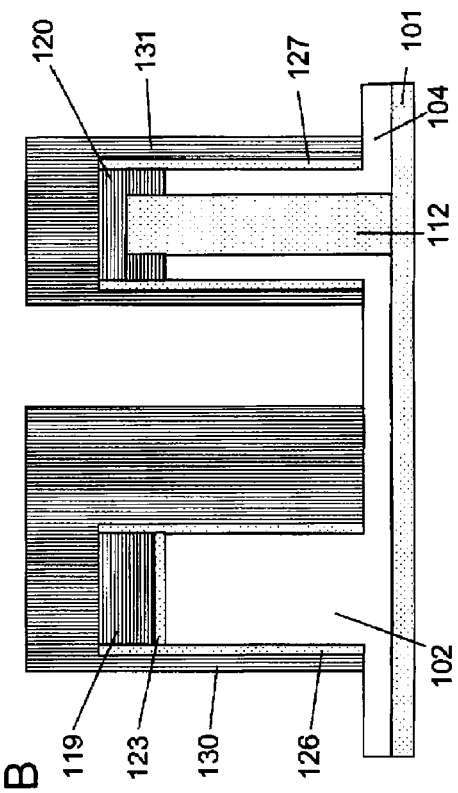

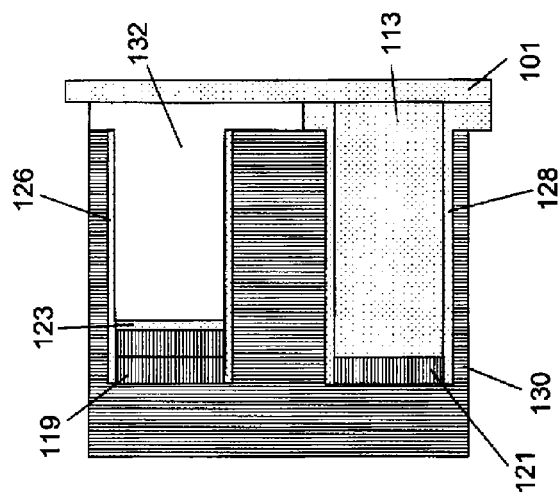
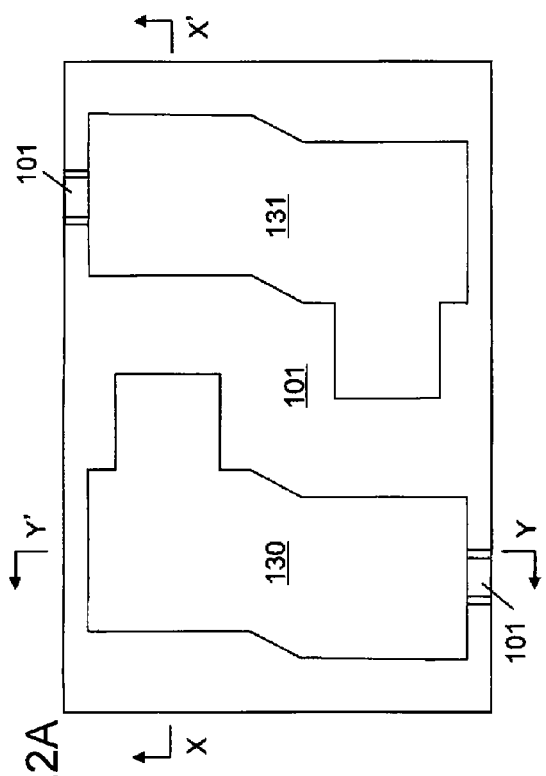
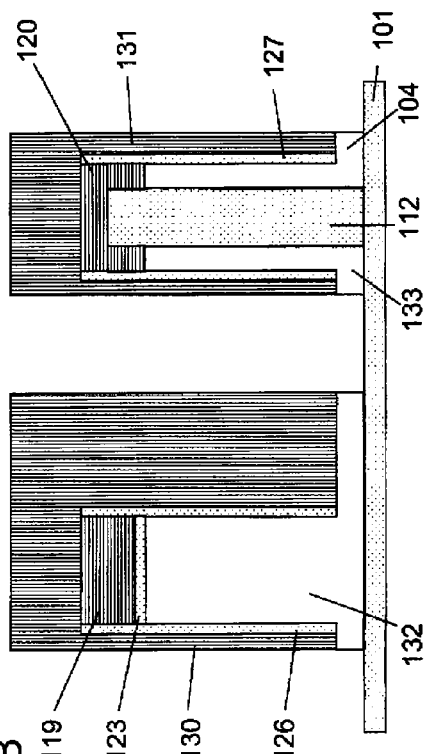
FIG. 22A
FIG. 22B
FIG. 22C

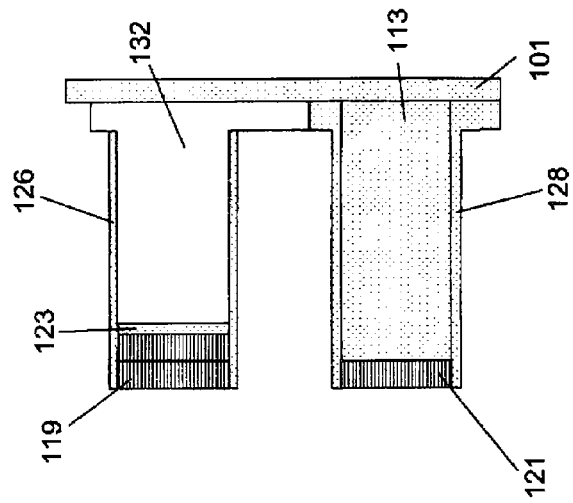
FIG. 23C
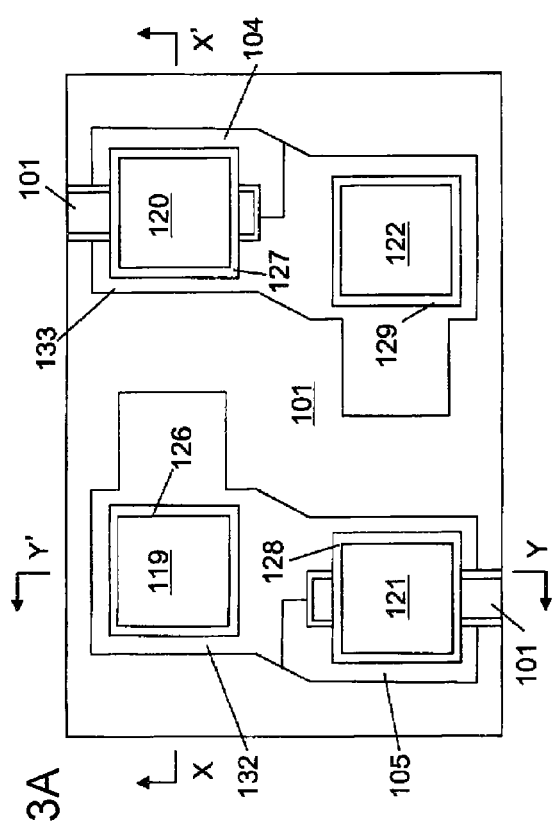
FIG. 23A
FIG. 23B

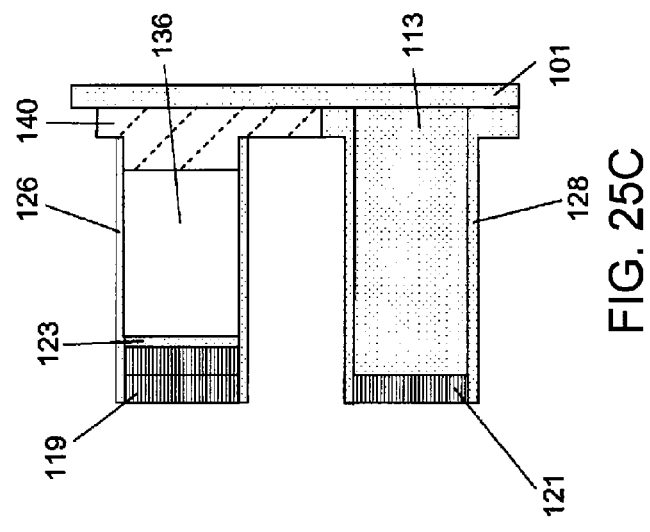
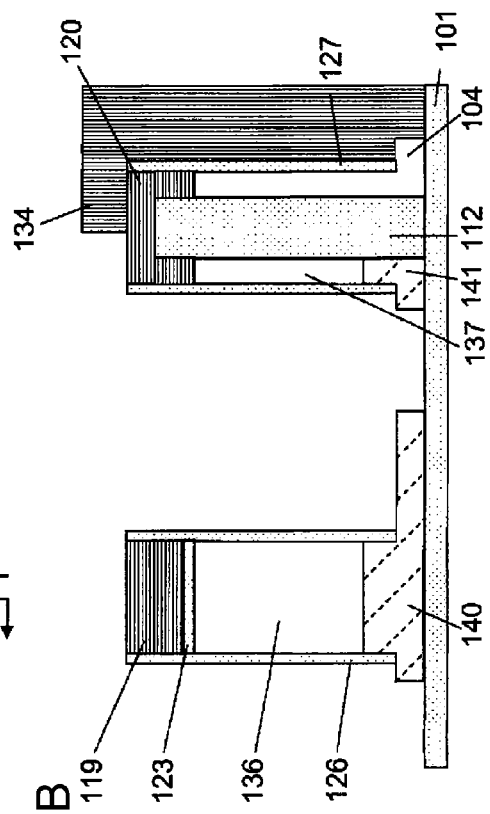
FIG. 25A
FIG. 25B
FIG. 25C

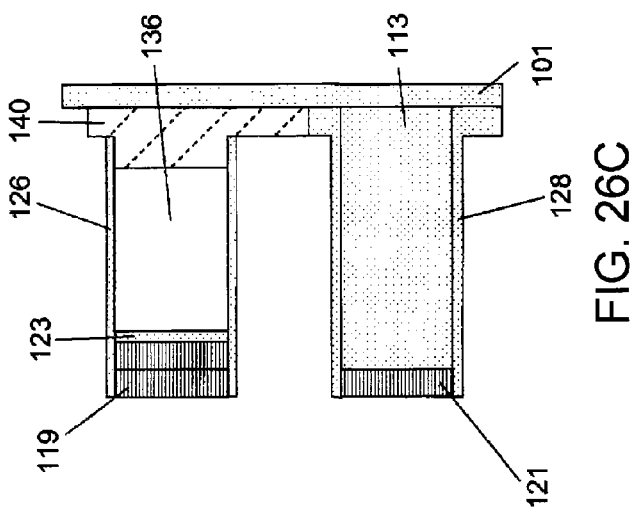
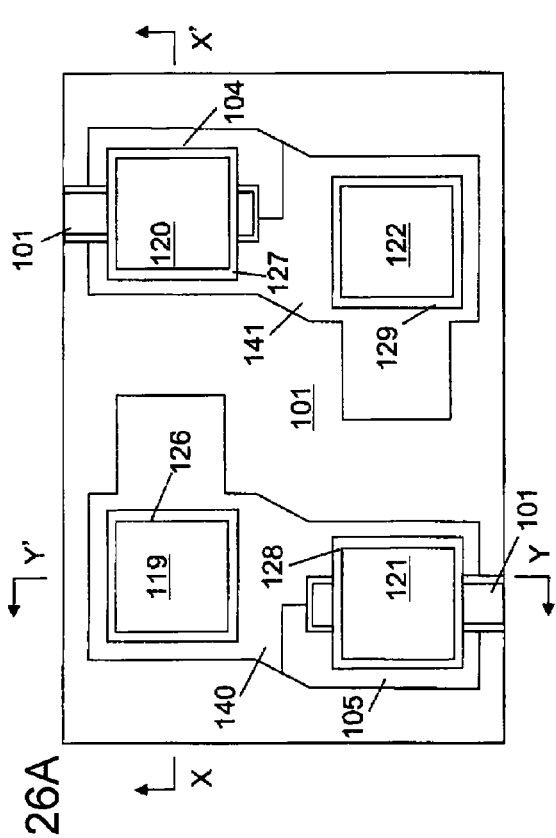
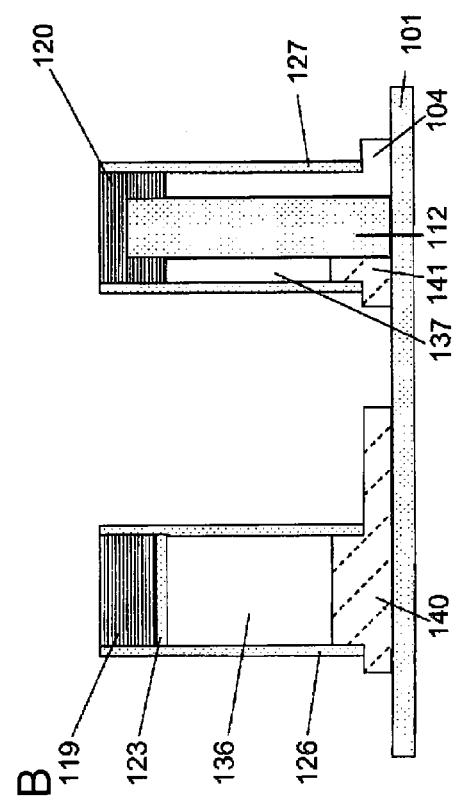
FIG. 26A
FIG. 26B
FIG. 26C

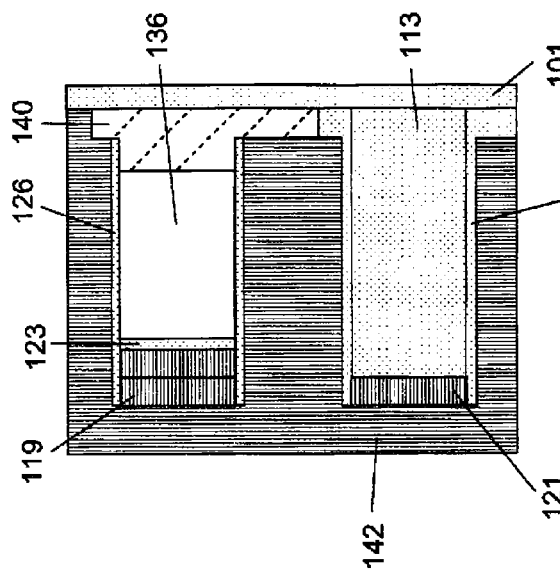
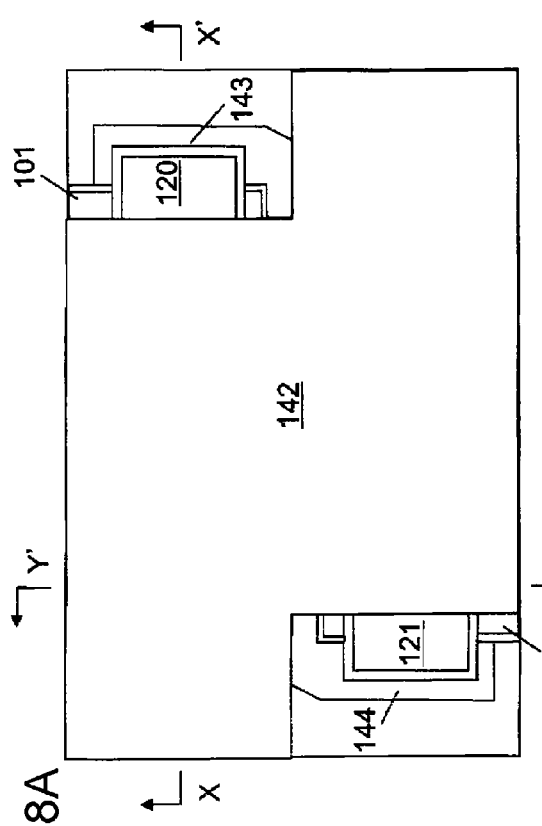
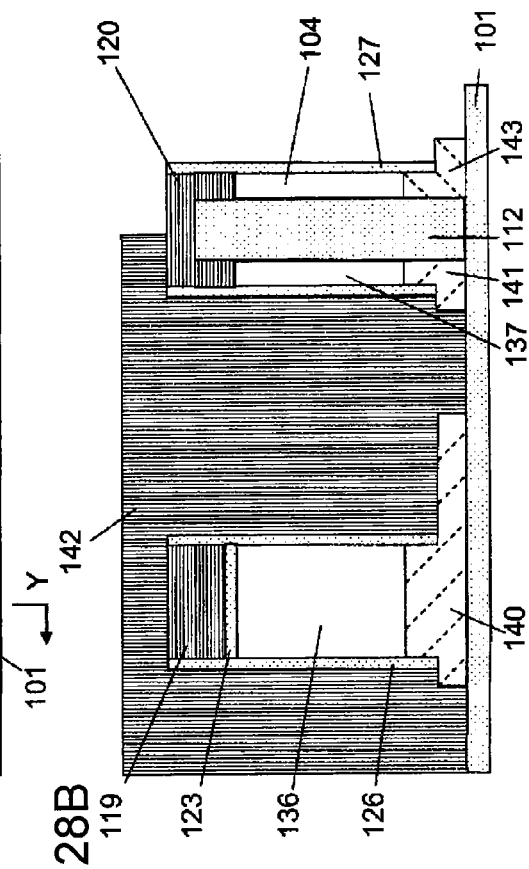
FIG. 28A
FIG. 28B
FIG. 28C

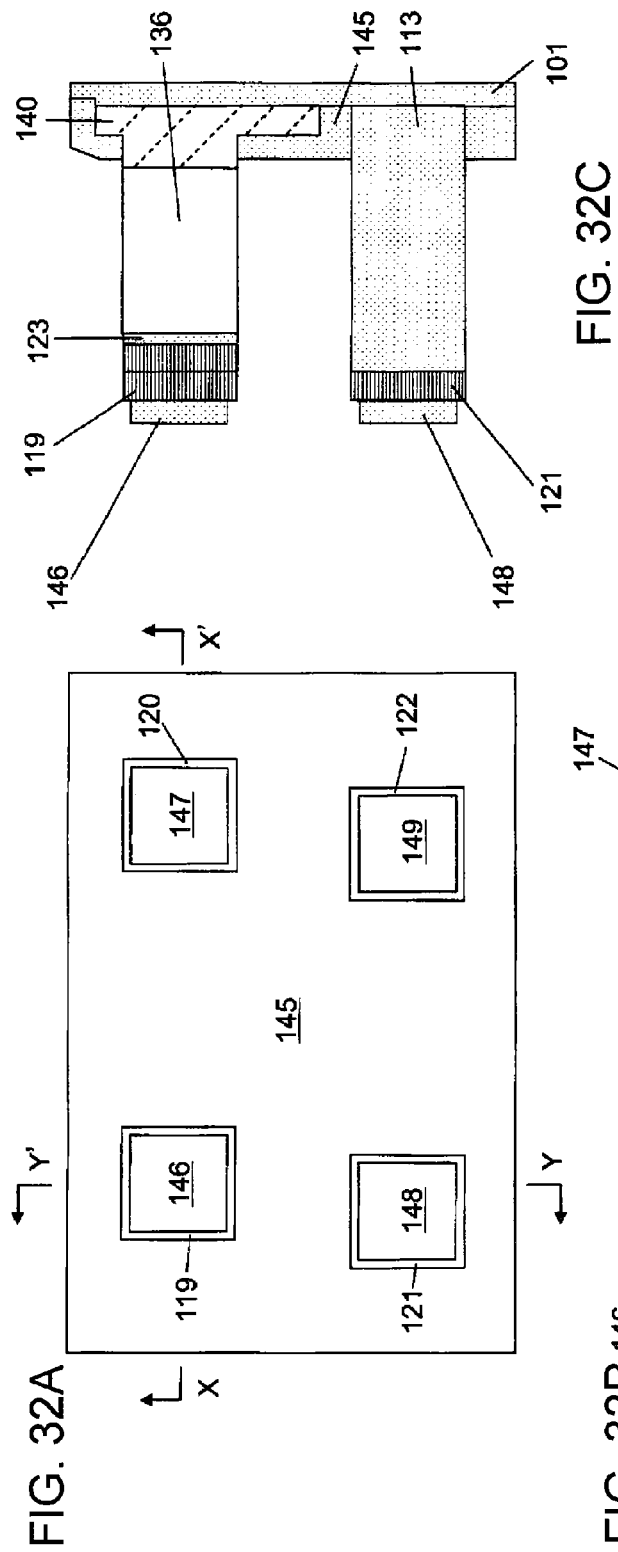

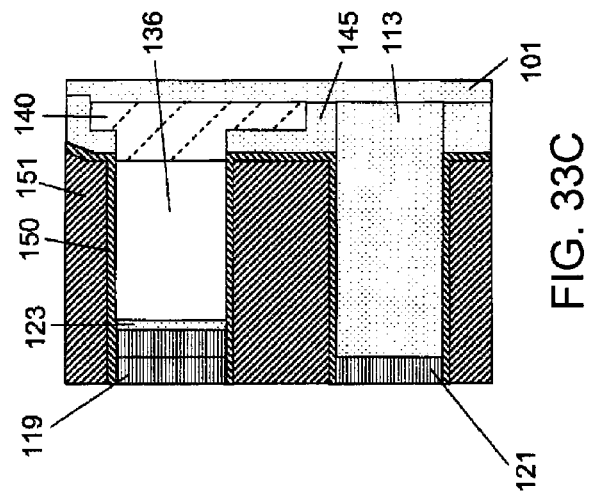
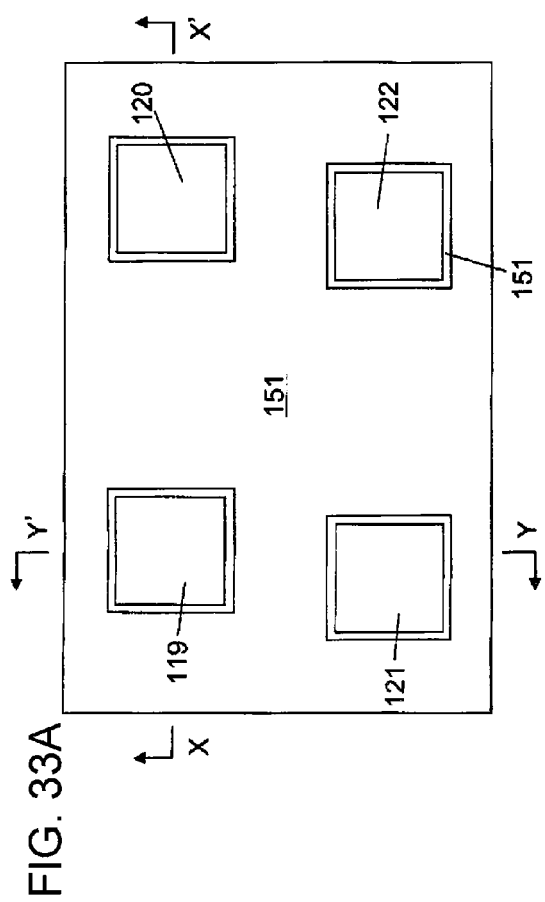
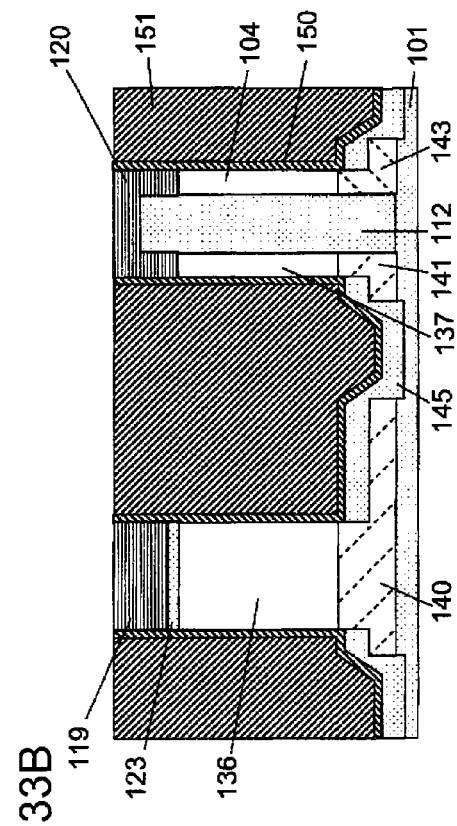

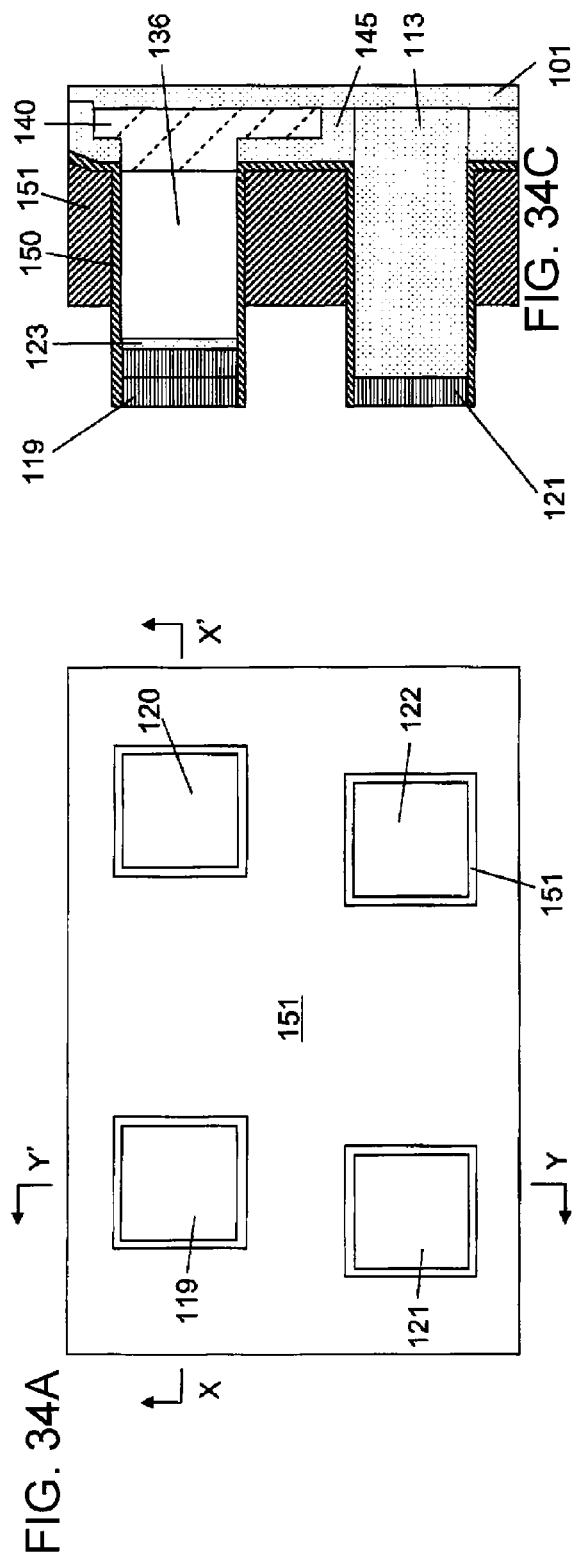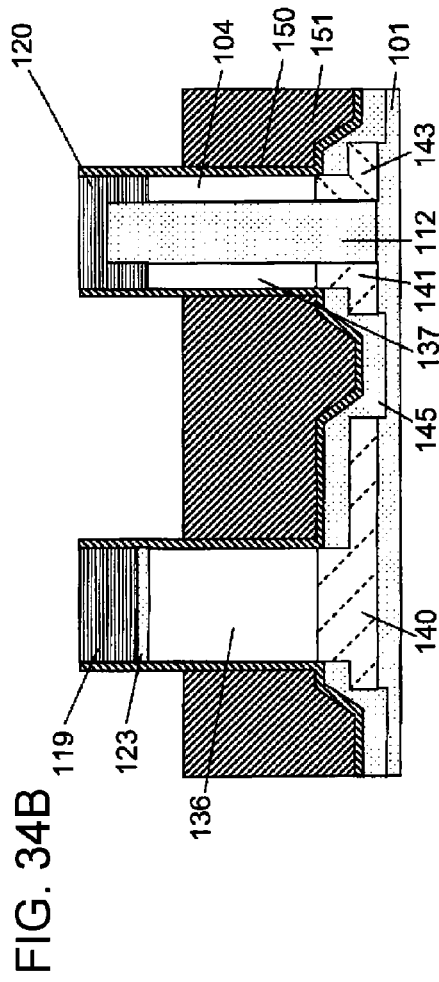

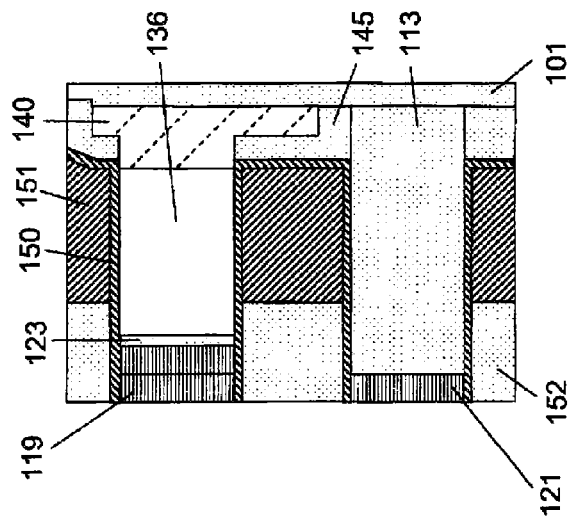
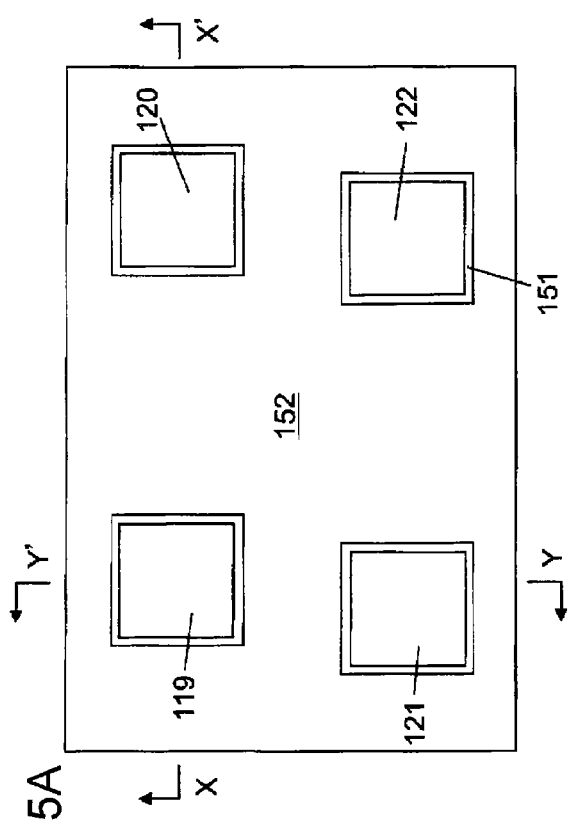
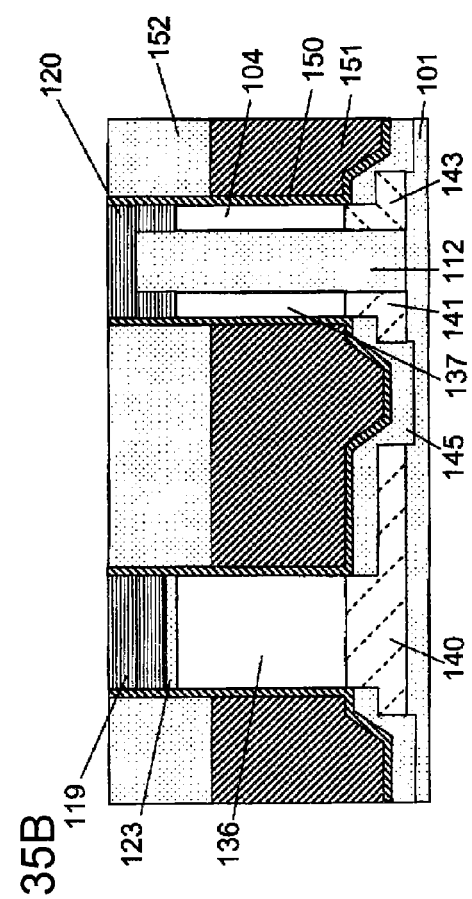
FIG. 35A
FIG. 35B
FIG. 35C

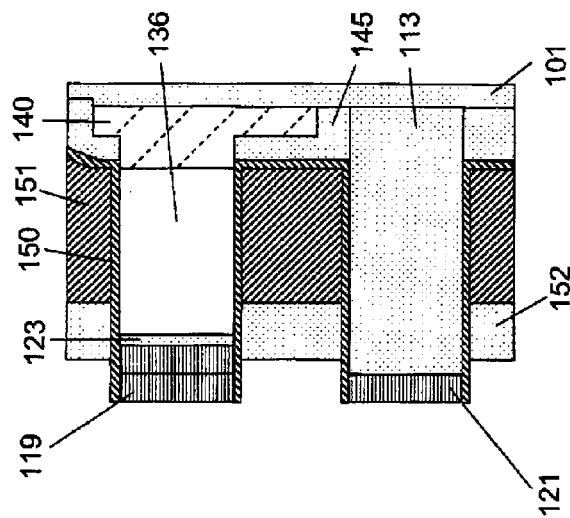
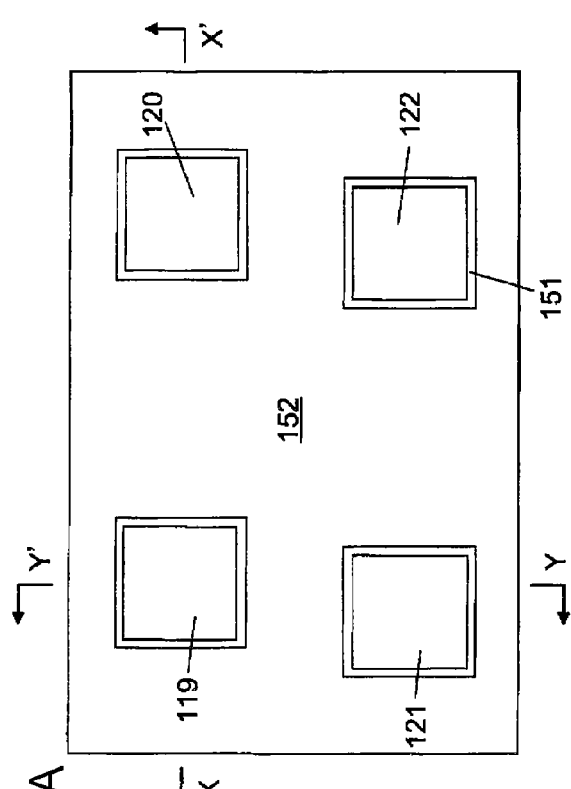
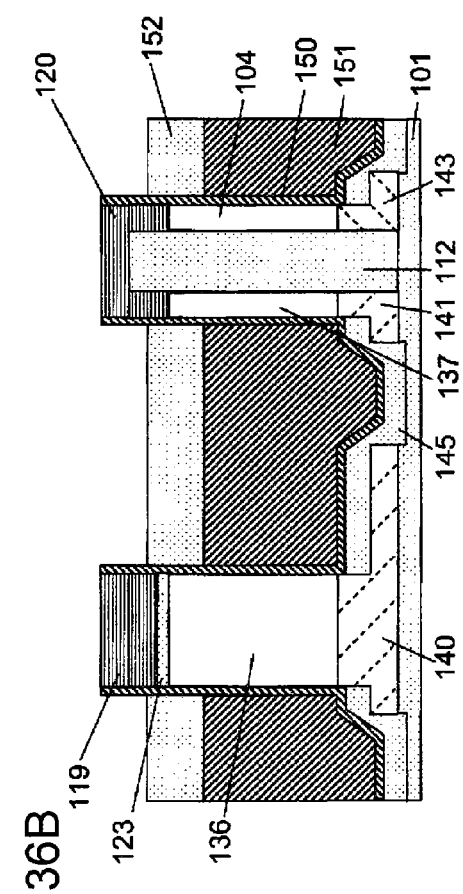
FIG. 36A
FIG. 36B
FIG. 36C

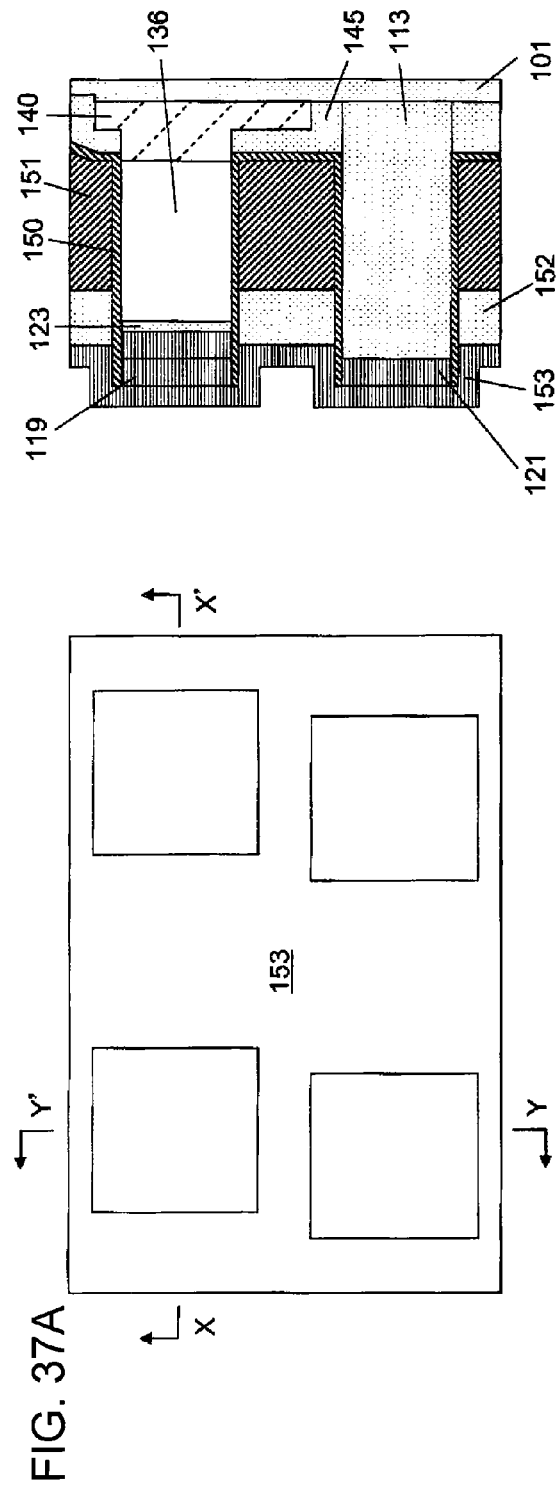
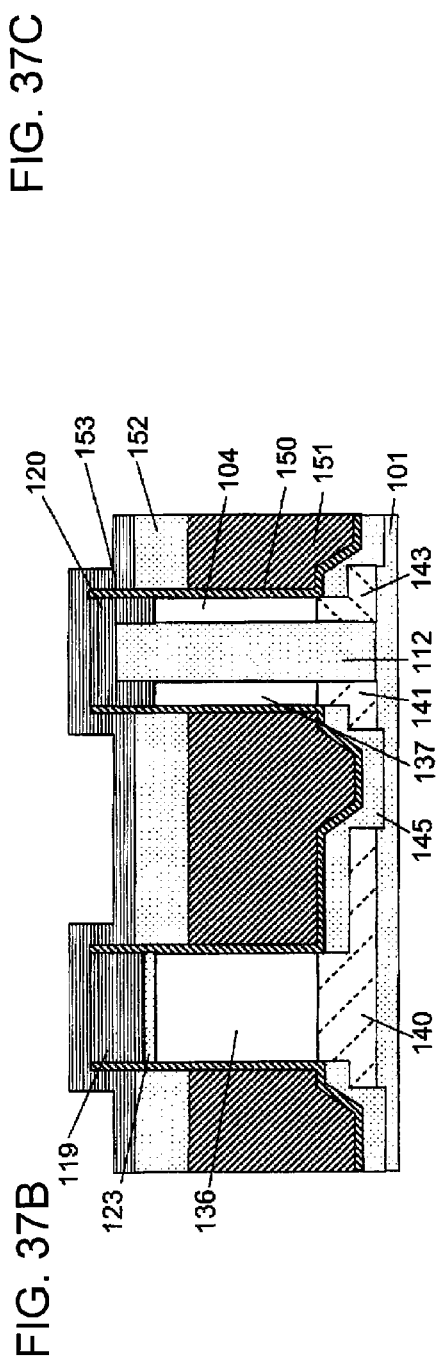
FIG. 37A
FIG. 37B
FIG. 37C

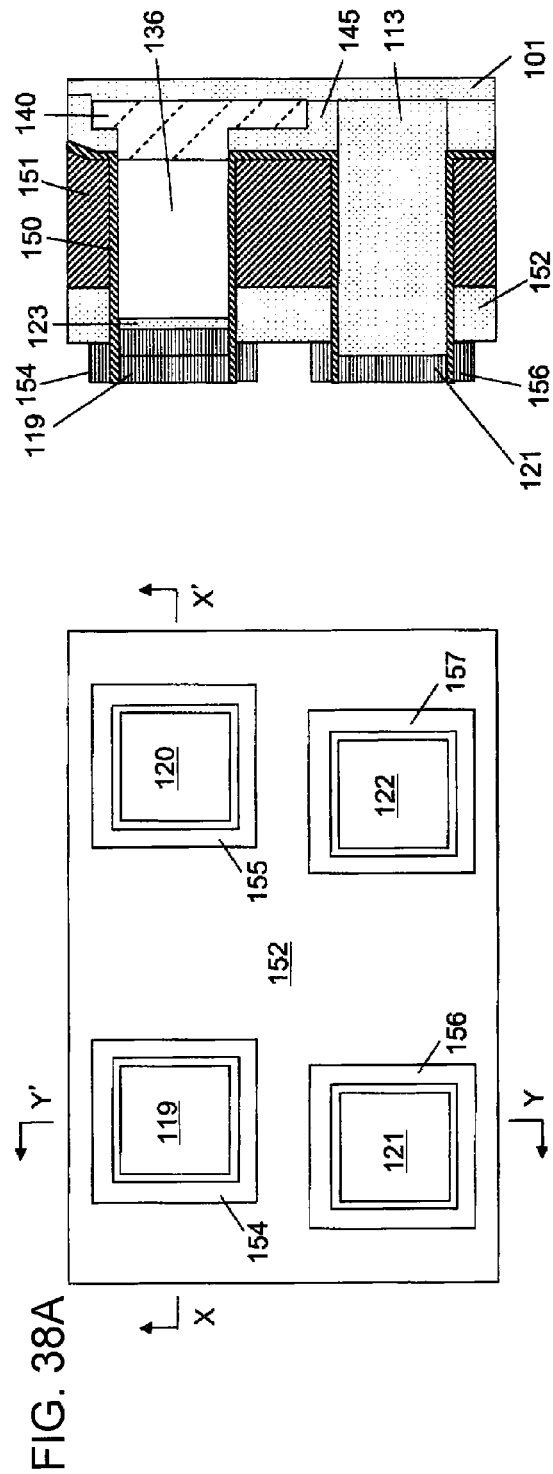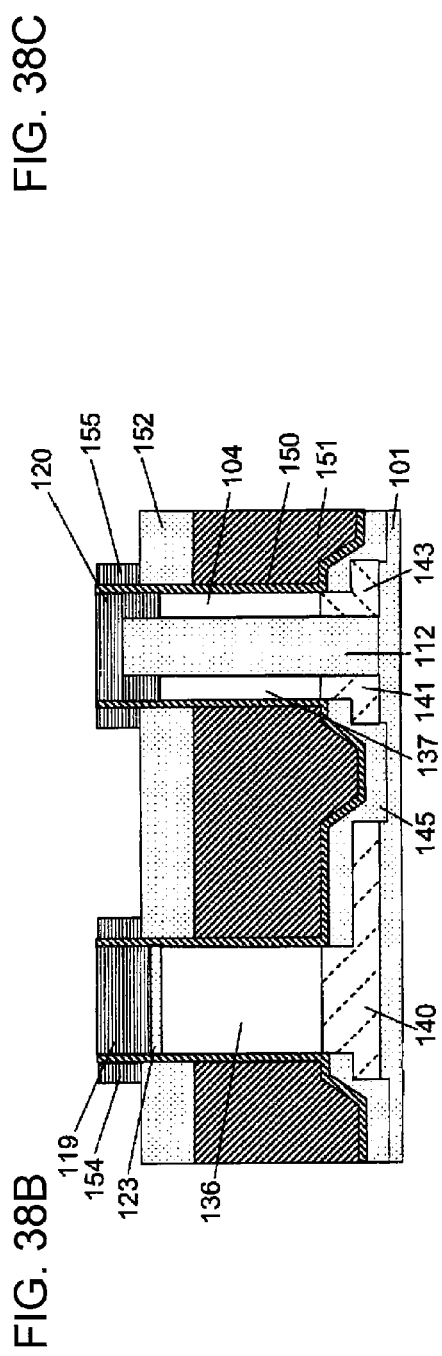
FIG. 38A
FIG. 38B
FIG. 38C

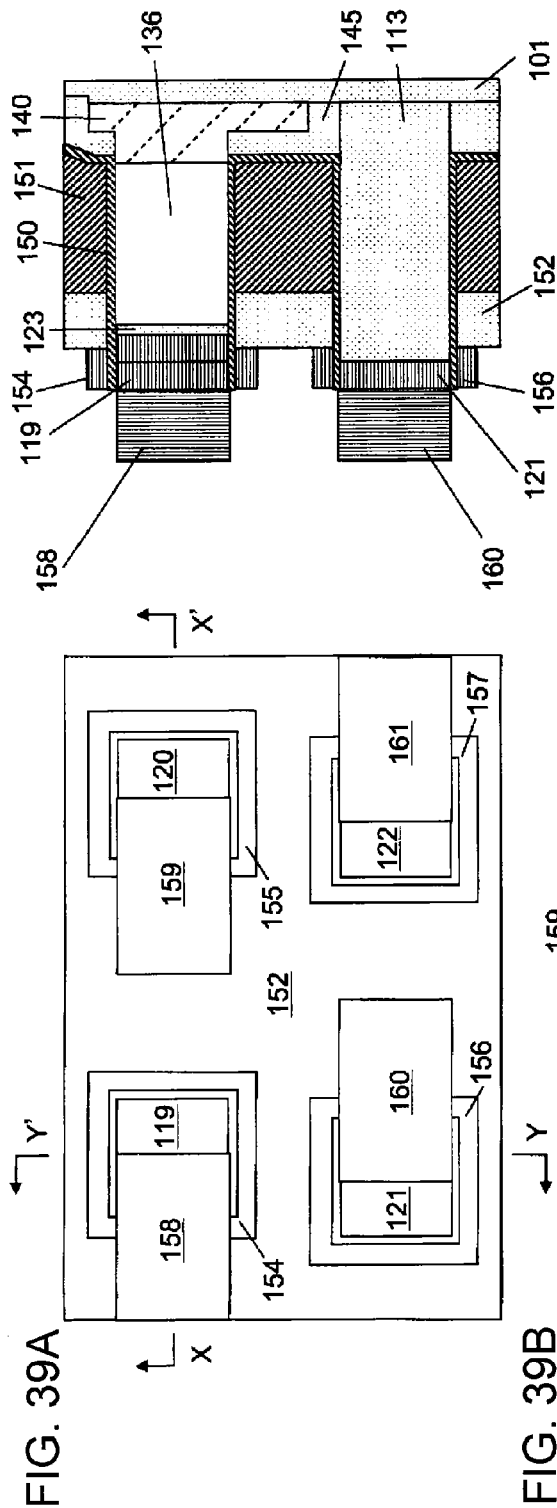
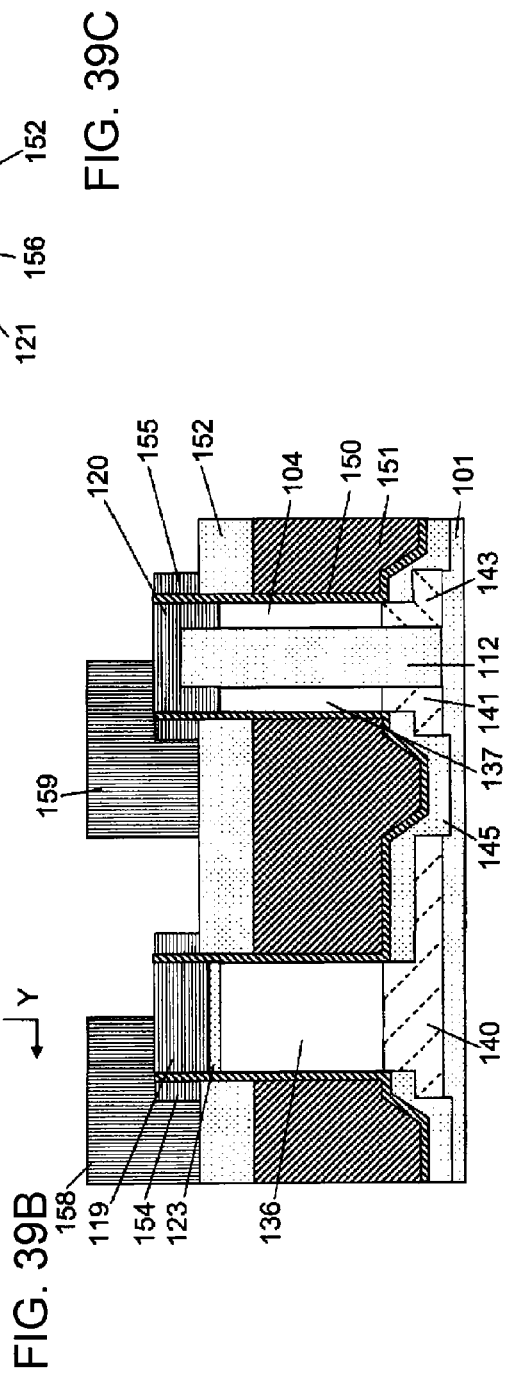
FIG. 39A
FIG. 39B
FIG. 39C

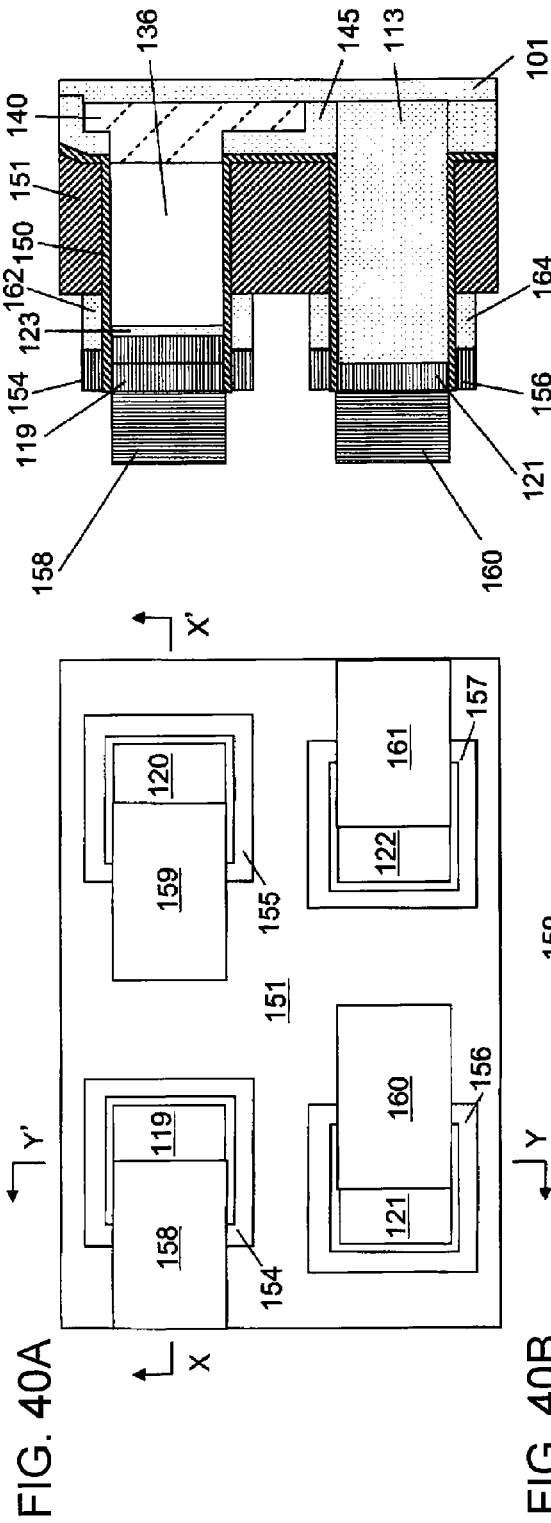
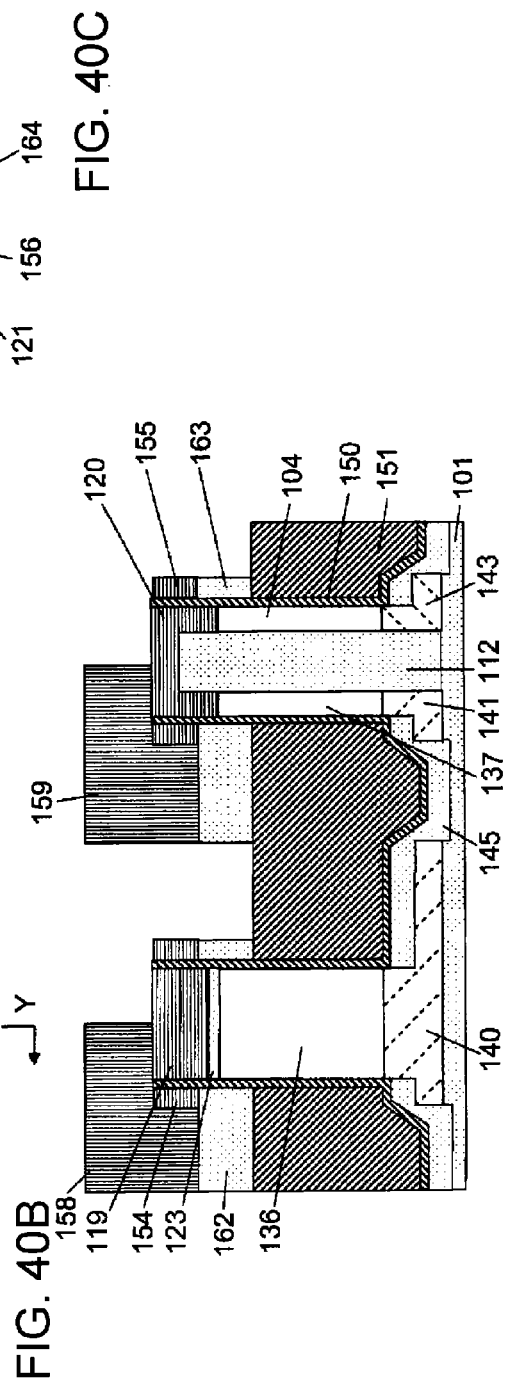
FIG. 40A
FIG. 40B
FIG. 40C

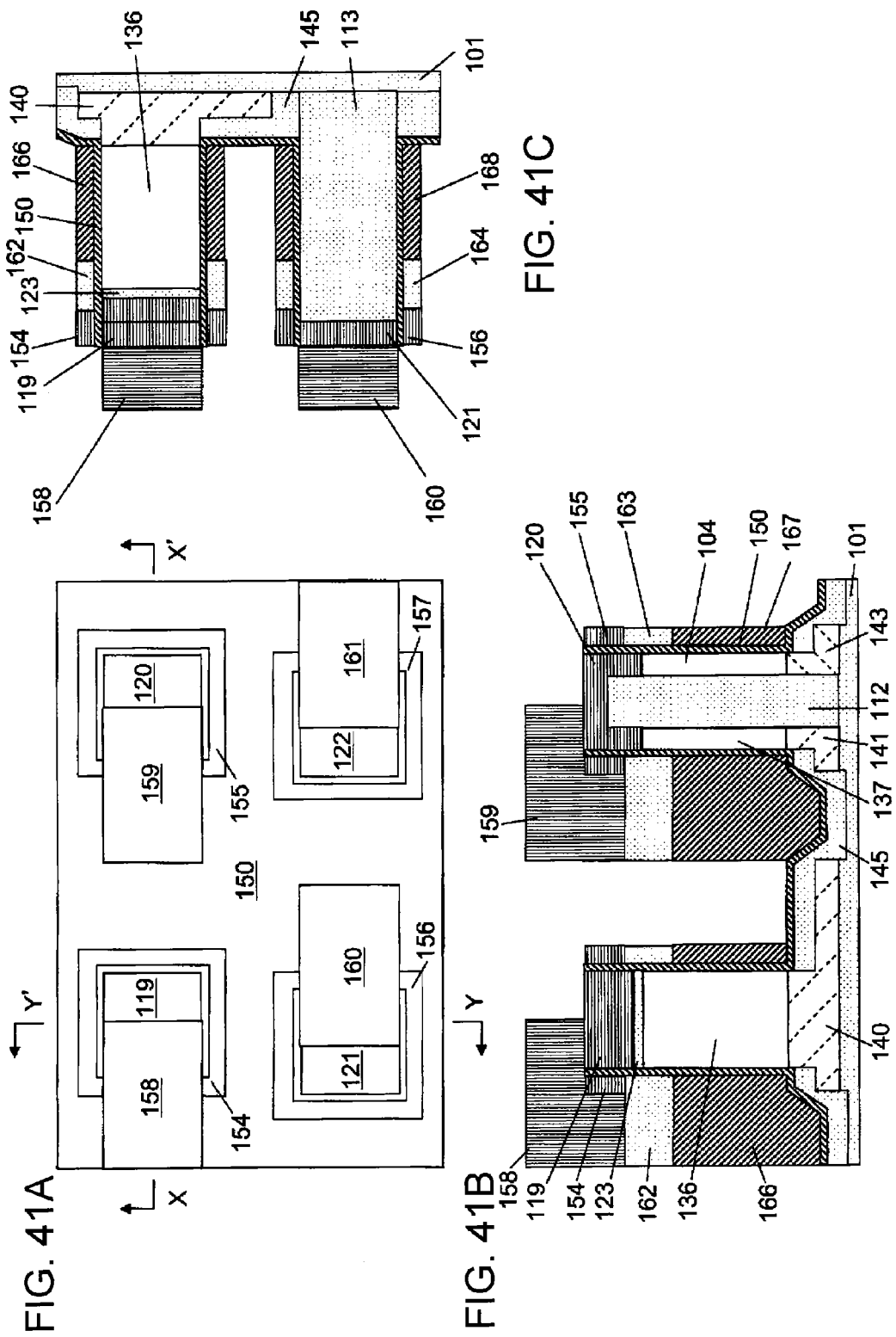

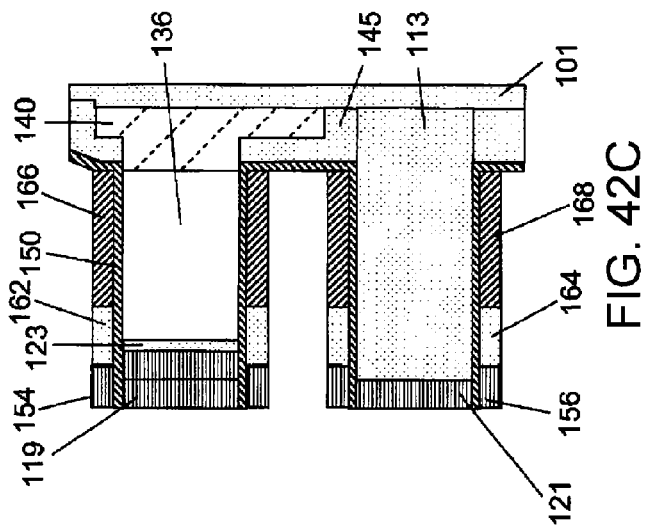
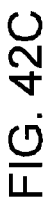
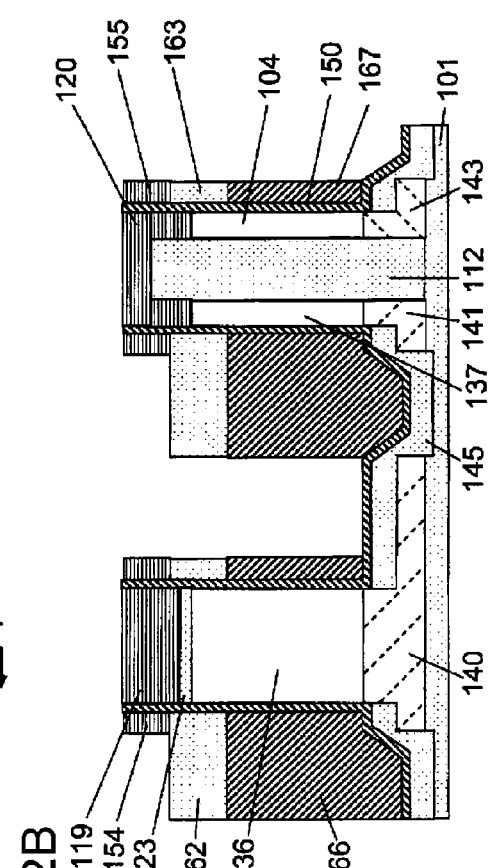
FIG. 42A
FIG. 42B
FIG. 42C

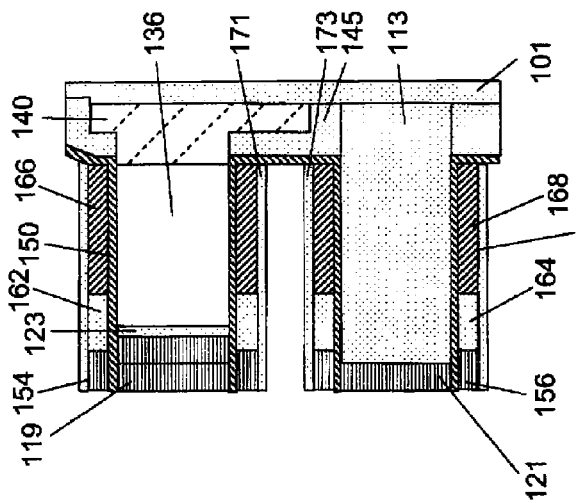
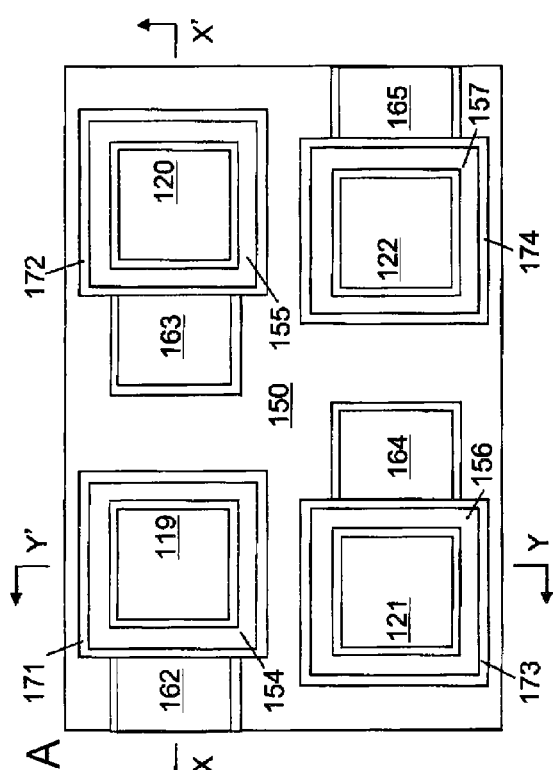
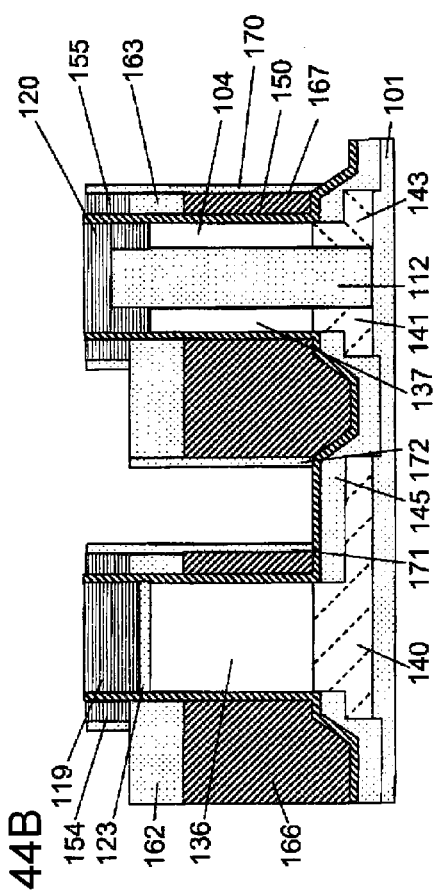
FIG. 44A
FIG. 44B
FIG. 44C

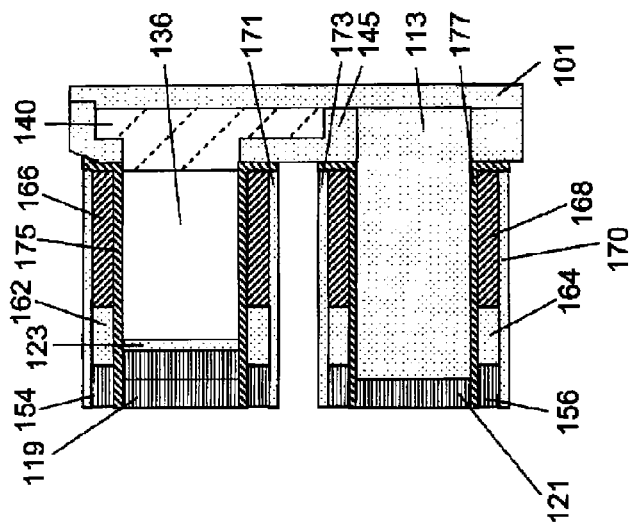
FIG. 45C
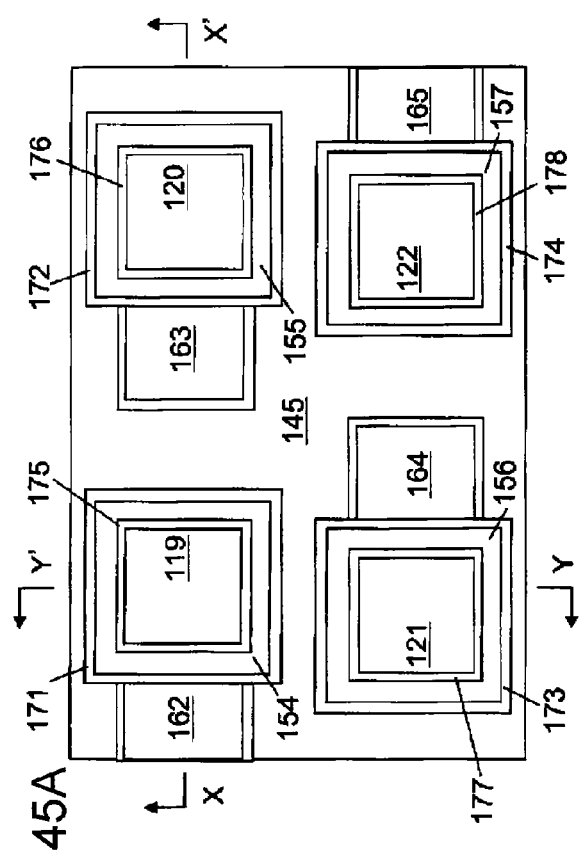
FIG. 45A
FIG. 45B
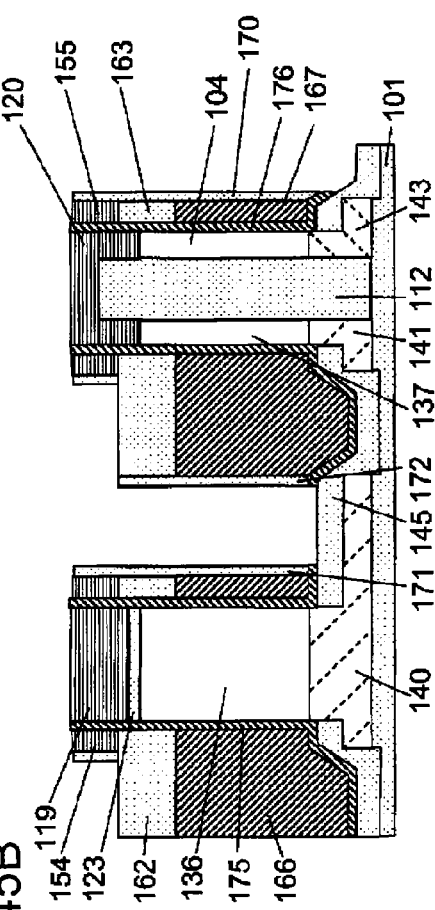

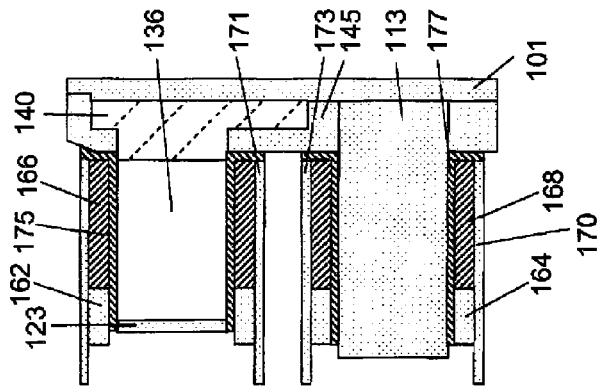
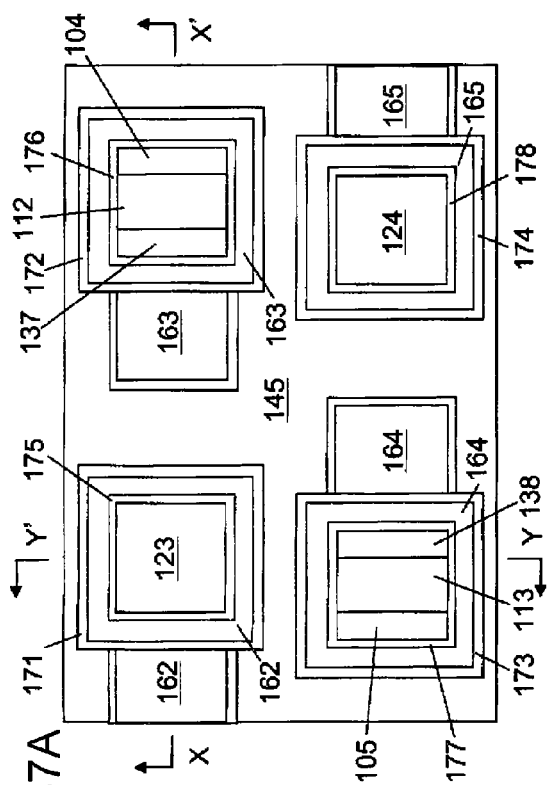
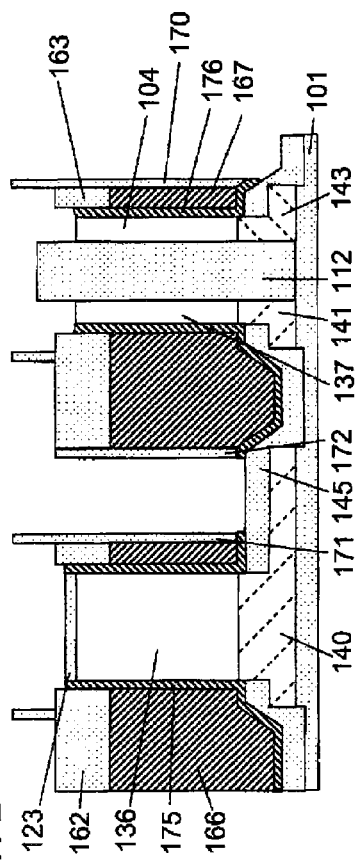

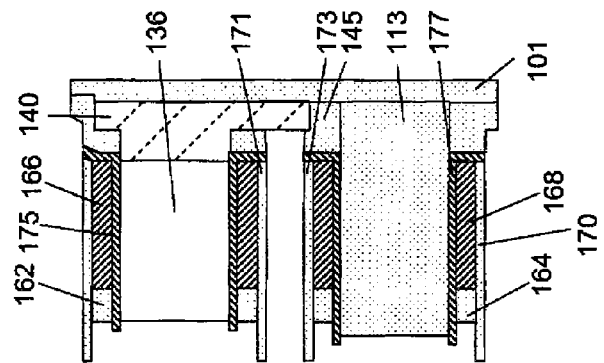
FIG. 48C
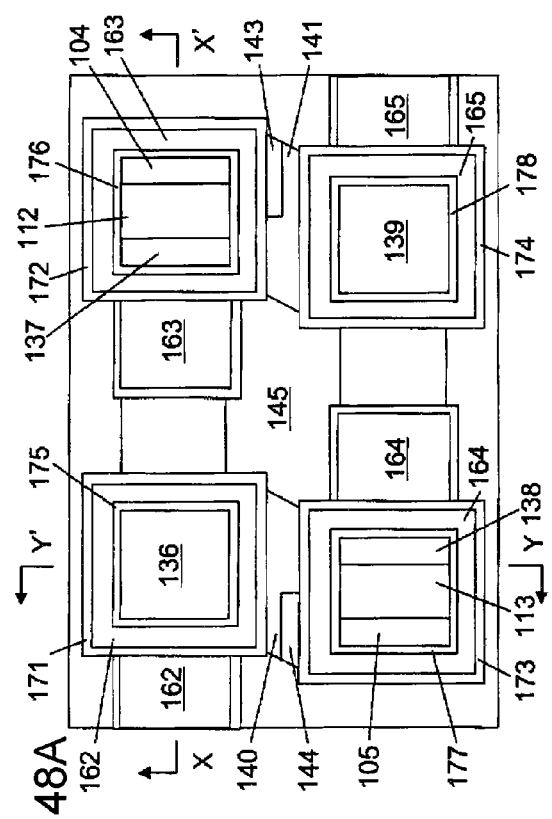
FIG. 48A
FIG. 48B
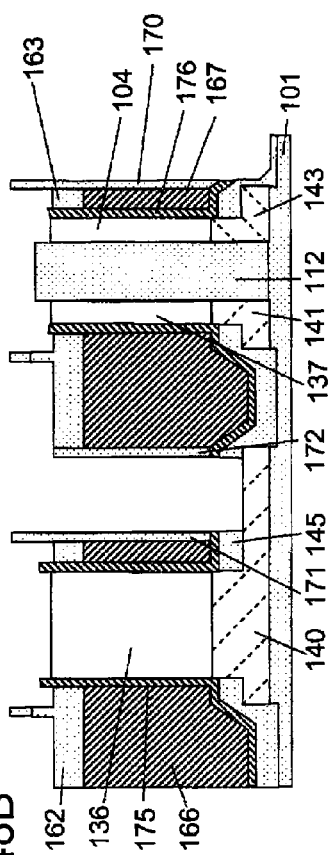

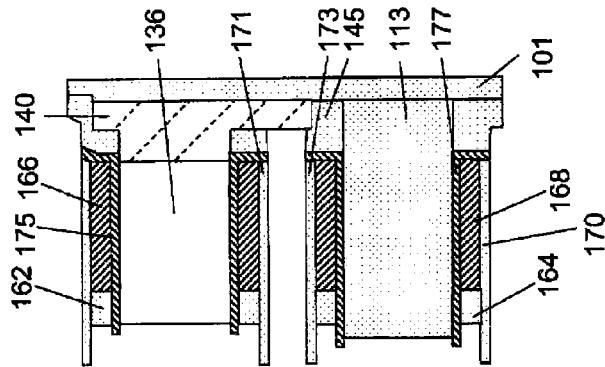
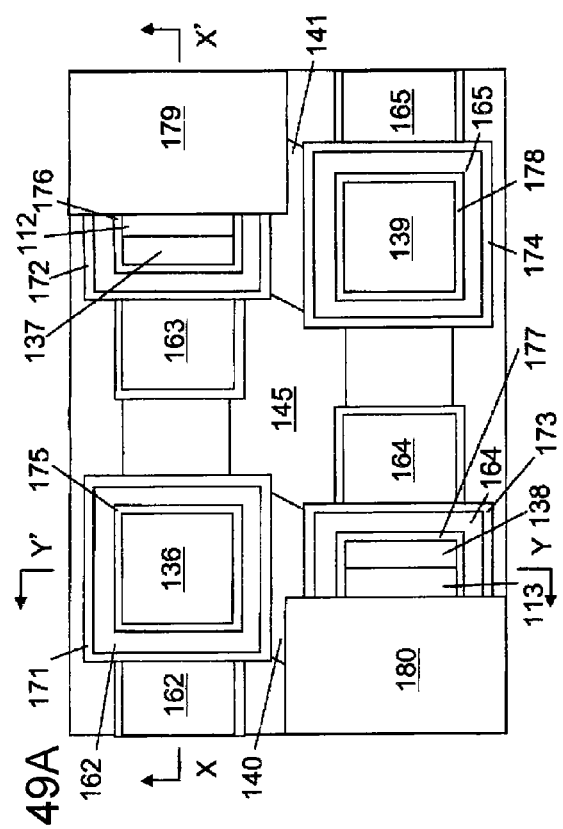
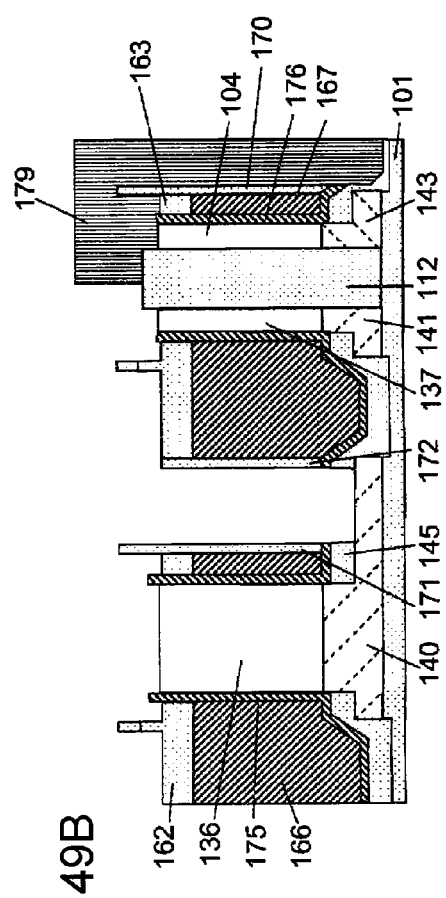
FIG. 49A
FIG. 49B
FIG. 49C

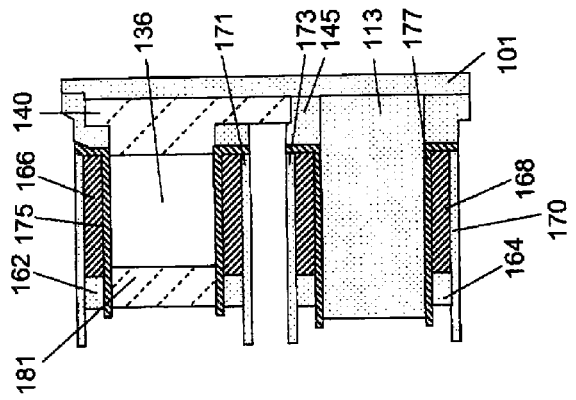
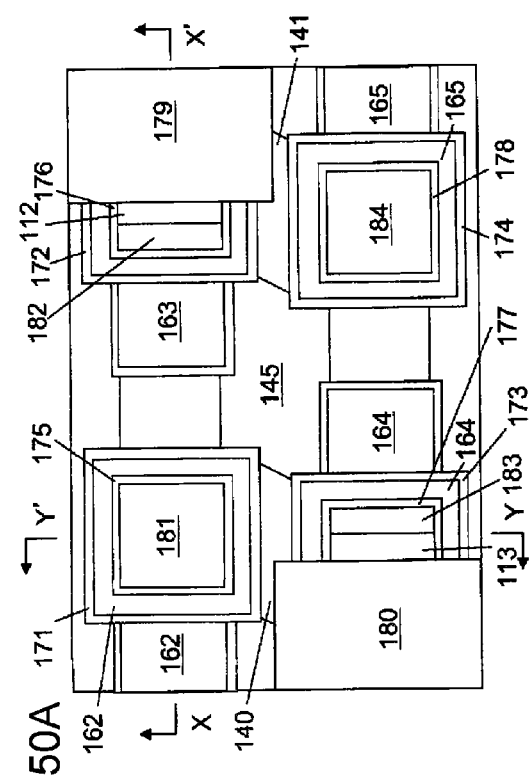
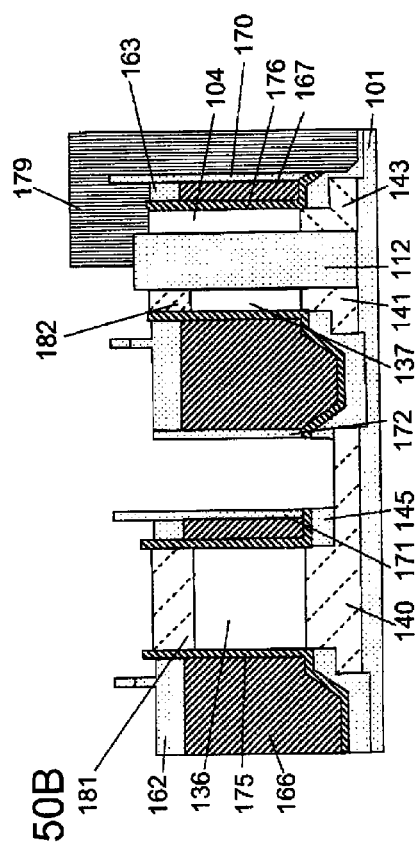

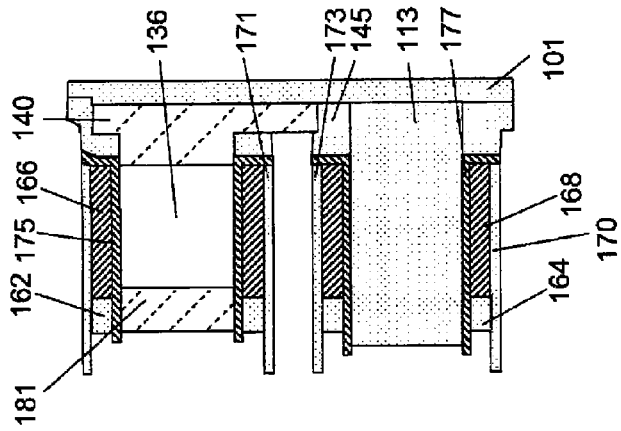
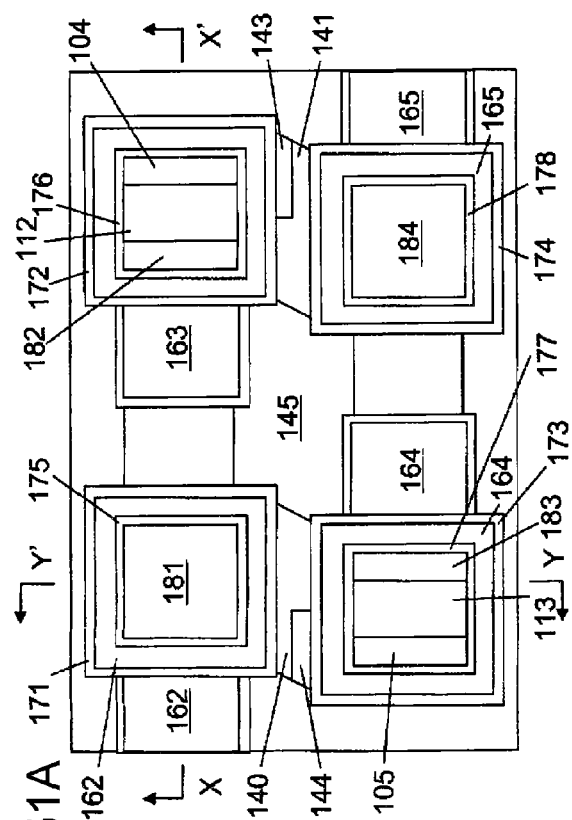
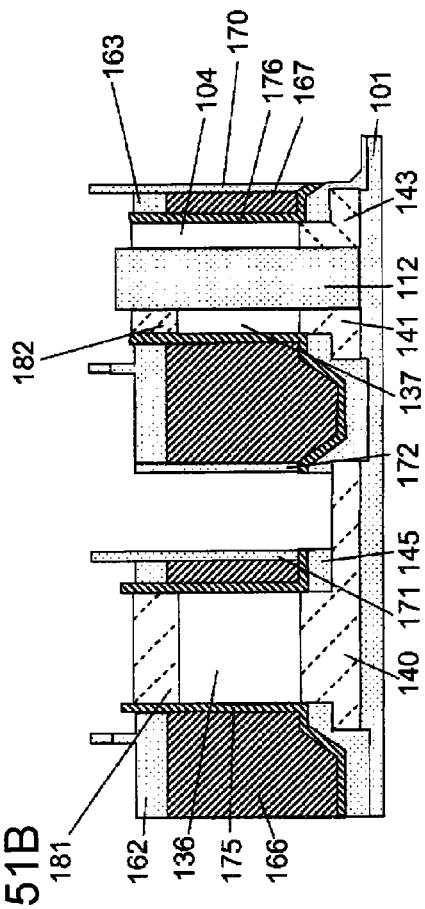
FIG. 51A
FIG. 51B
FIG. 51C

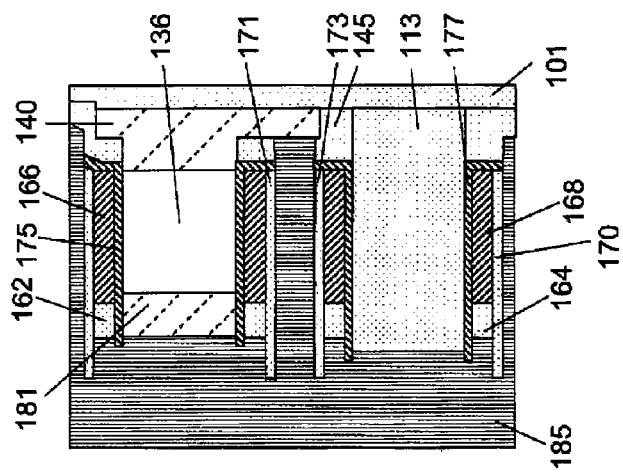
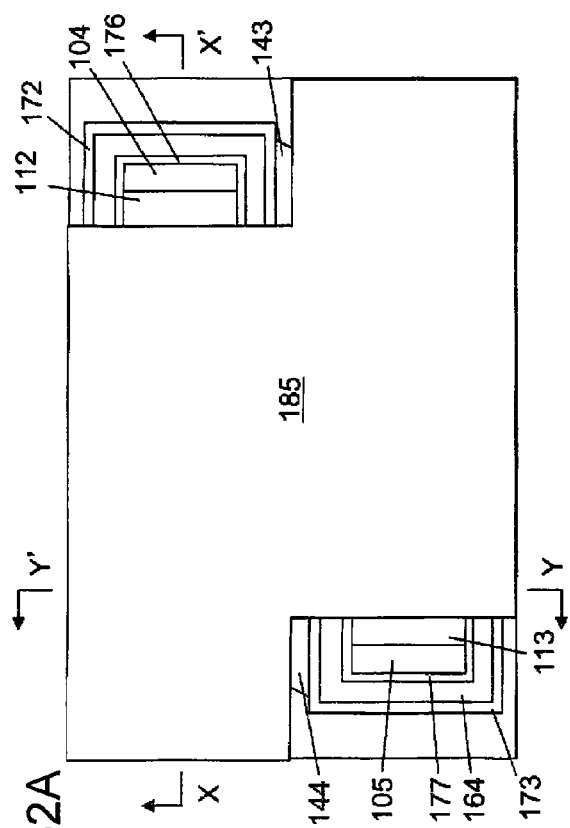
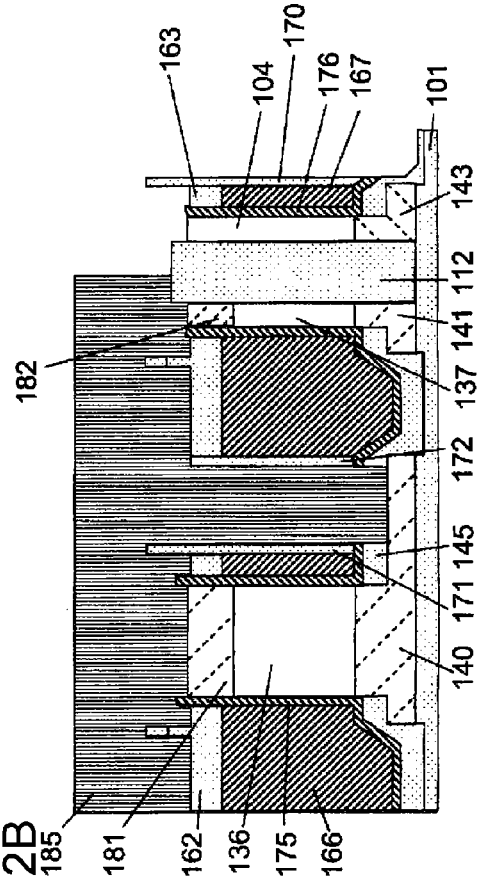
FIG. 52A
FIG. 52B
FIG. 52C

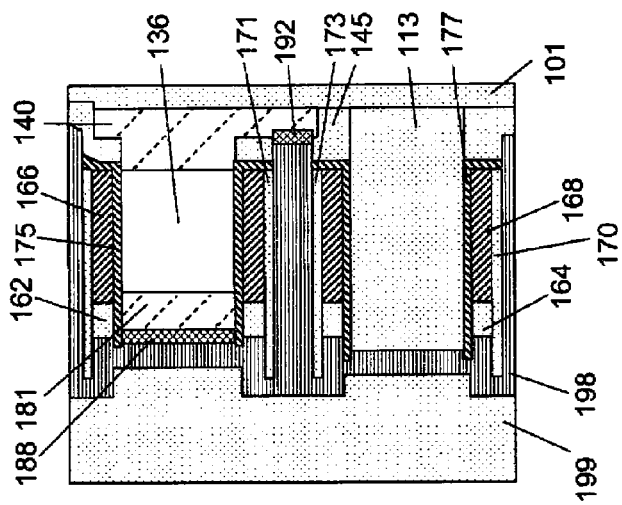
FIG. 57C
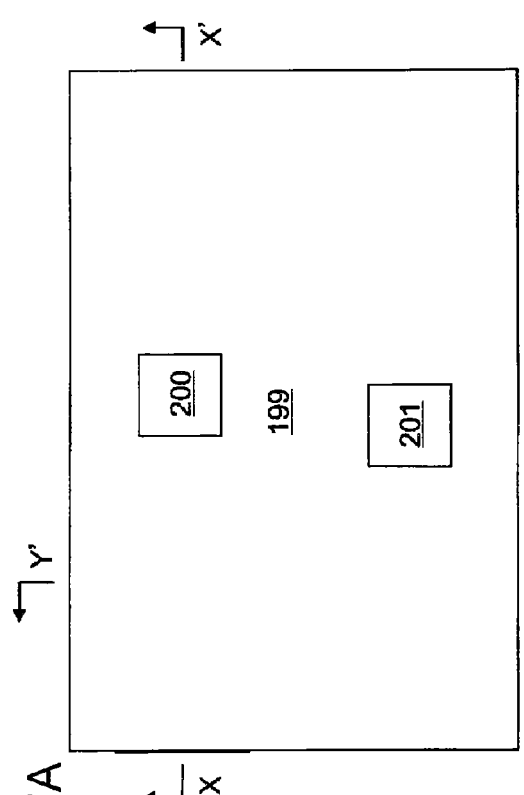
FIG. 57A
FIG. 57B

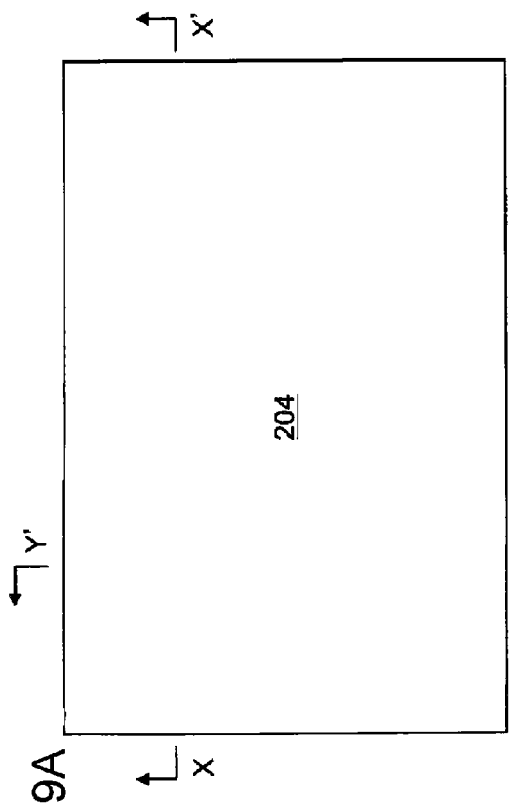
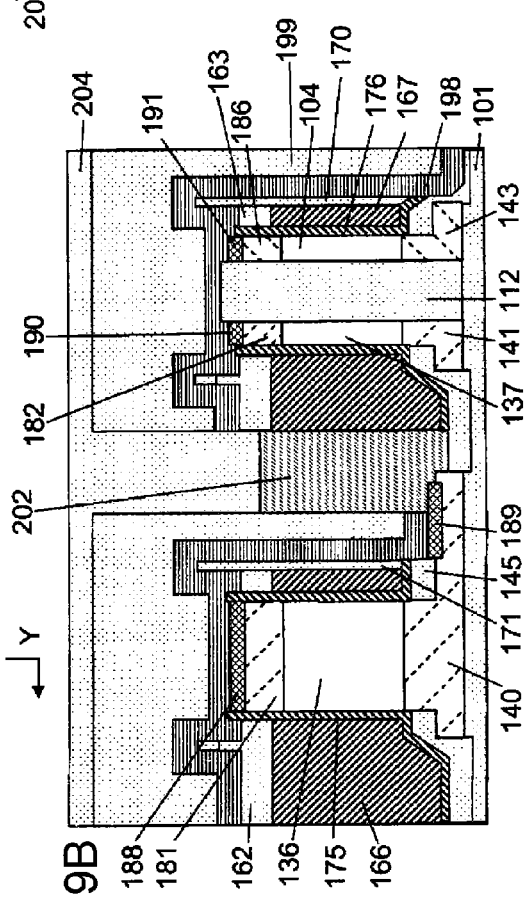
FIG. 59A
FIG. 59B
FIG. 59C

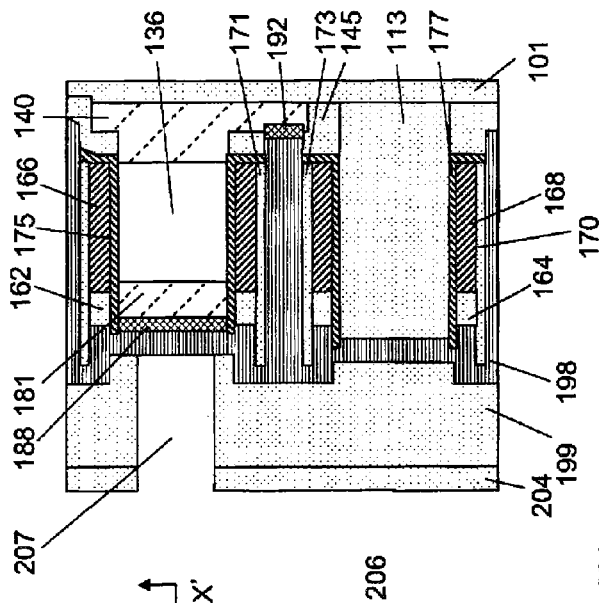
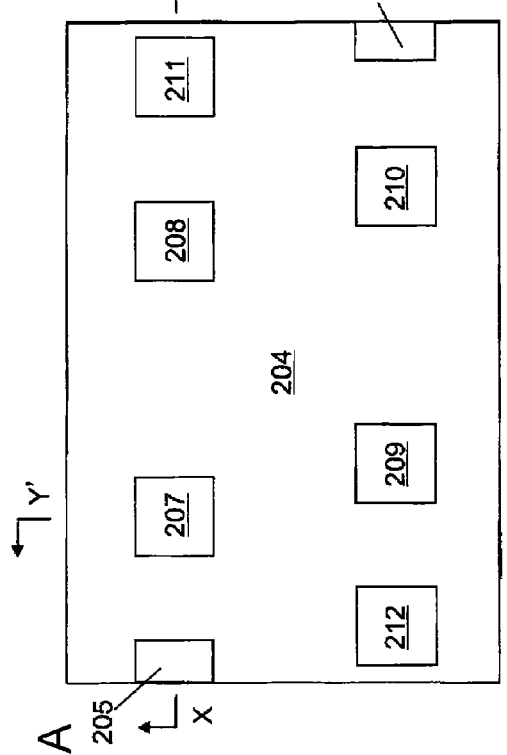
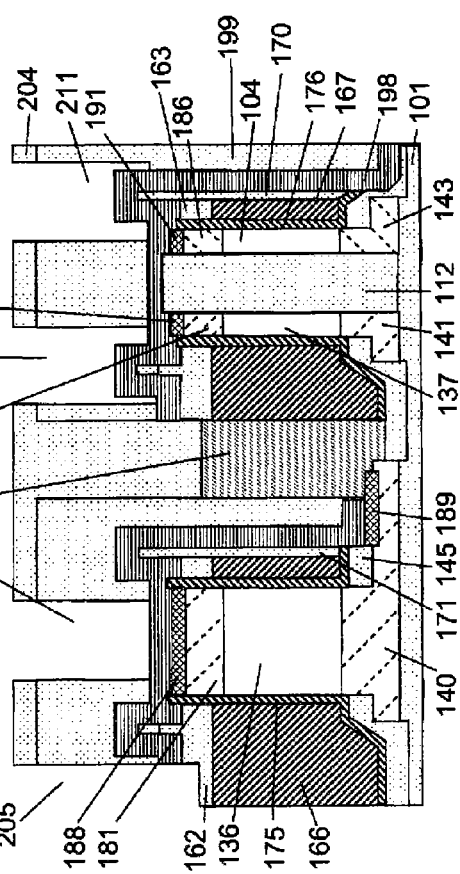
FIG. 62A
FIG. 62B
FIG. 62C

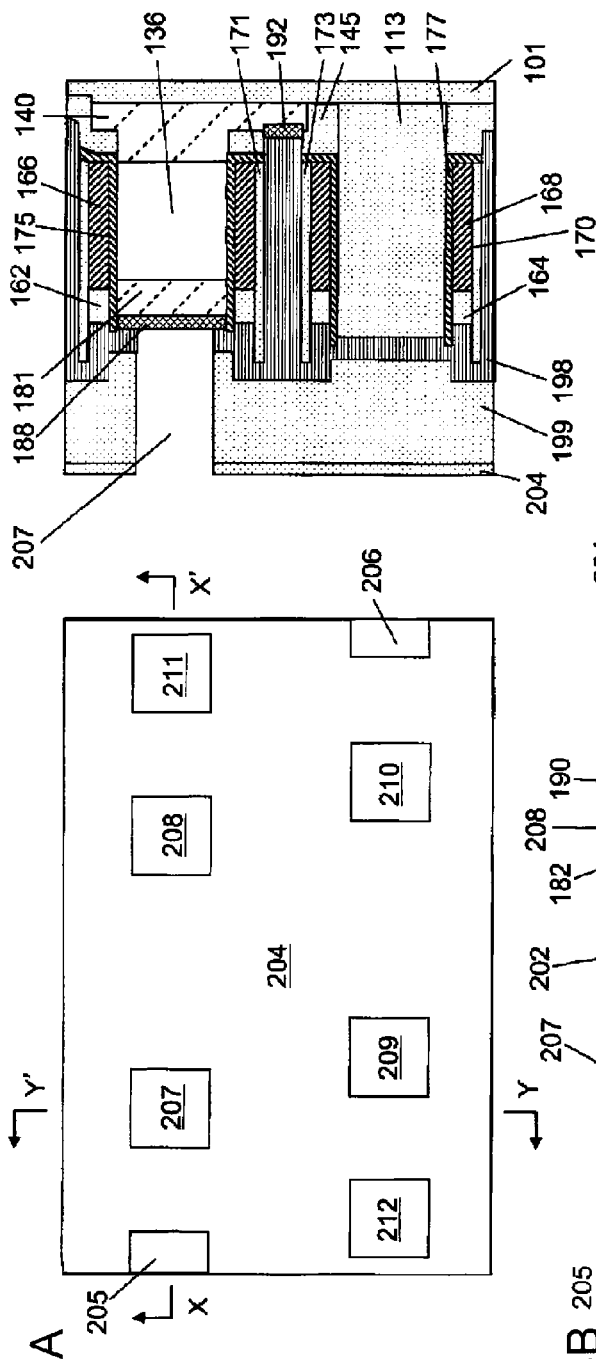

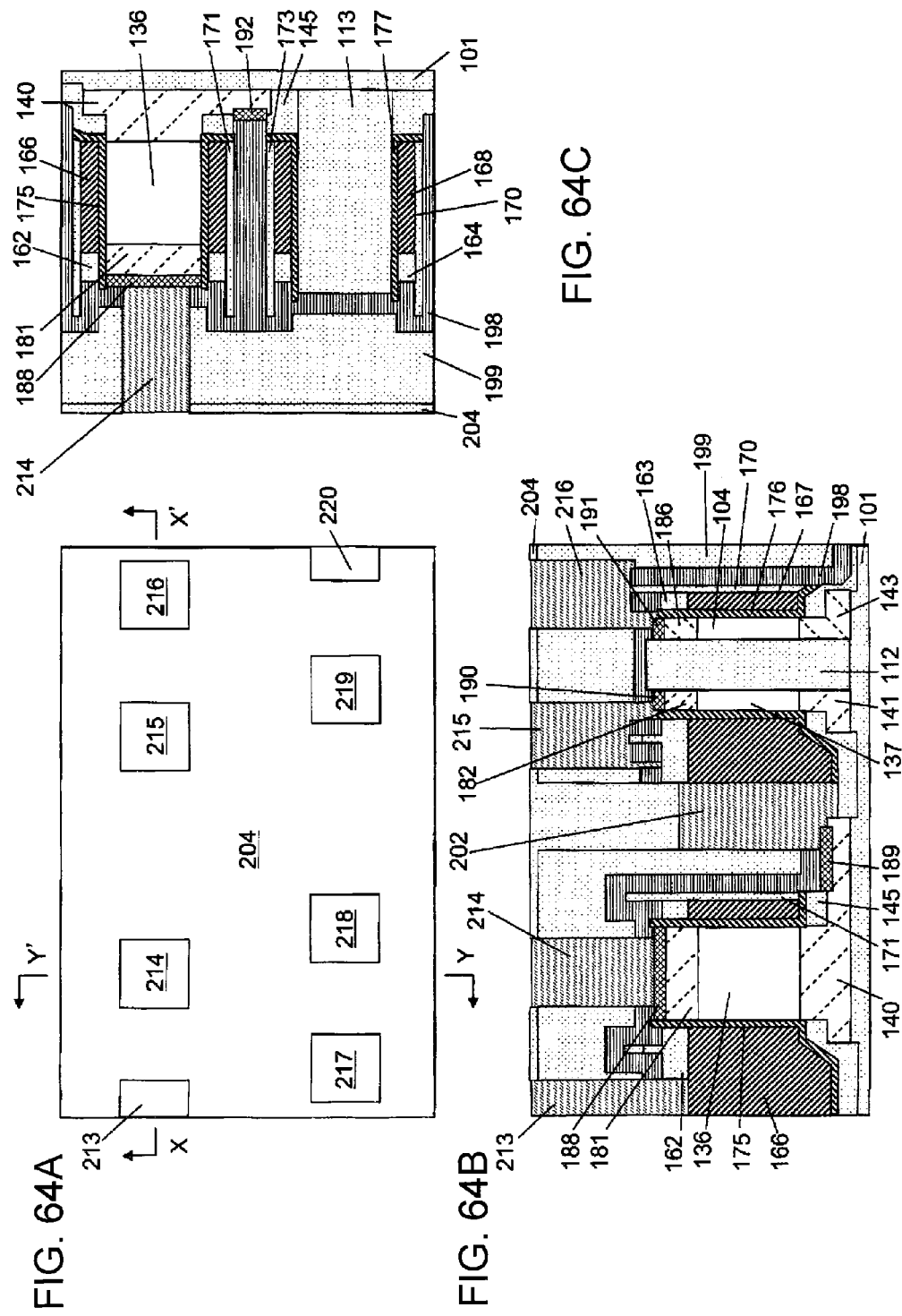

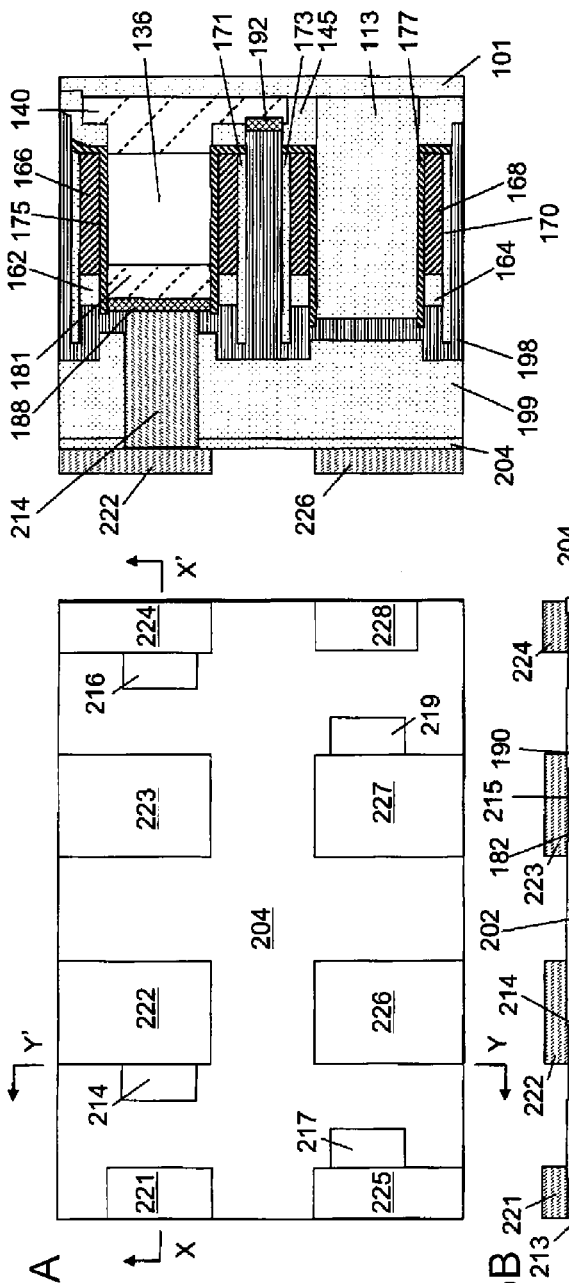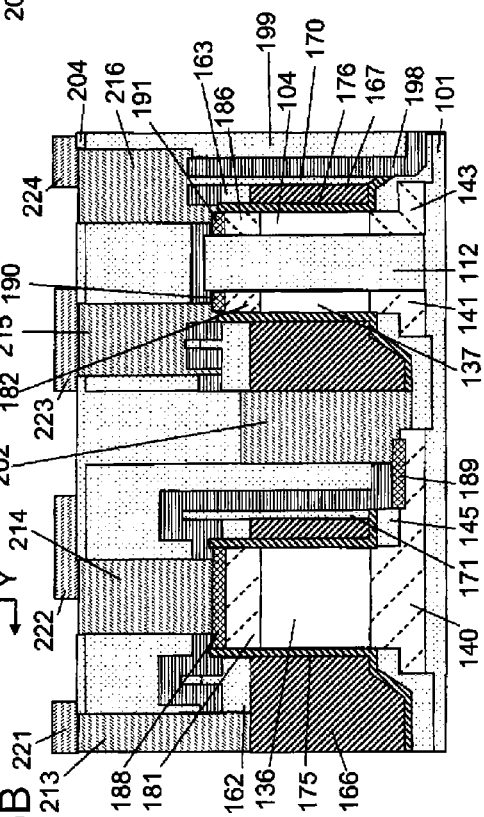
FIG. 65A
FIG. 65B
FIG. 65C

SEMICONDUCTOR DEVICE

RELATED APPLICATIONS

Pursuant to 35 U.S.C. §119(e), this application claims the benefit of the filing date of Provisional U.S. Patent Application Ser. No. 61/341,659 filed on Apr. 2, 2010. This application also claims priority under 35 U.S.C. §119(a) to JP2010-083104 filed on Mar. 31, 2010. The entire contents of these applications are hereby incorporated by reference.

BACKGROUND OF THE INVENTION

1. Field of the Invention

The present invention relates to semiconductor devices.

2. Description of the Related Art

Semiconductor devices, more particularly, integrated circuits using metal oxide semiconductor (MOS) transistors are increasingly being highly integrated. In association with the increase in the degree of integration, miniaturization of the MOS transistors used in the integrated circuits has progressed to a region of nanometers. With the improved miniaturization of MOS transistors constituting inverter circuits as a basic circuitry for digital circuits, the following problems have arisen: difficulty in reducing leak currents; occurrence of reduction in reliability because of a hot carrier effect; and difficulty in reducing an area occupied by circuits due to a need to ensure a necessary amount of current. In order to solve such problems, surrounding gate transistors (SGTs) having a structure in which a source, a gate, and a drain are arranged in the vertical direction with respect to a substrate and in which the gate is formed around a silicon pillar have been proposed. Complementary MOS (CMOS) inverter circuits using a pMOS SGT and an nMOS SGT have been proposed (for example, "A Novel Circuit Technology with Surrounding Gate Transistors (SGT's) for Ultra High Density DRAM's", S. Watanabe, K. Tsuchida, D. Takashima, Y. Oowaki, A. Nitayama, K. Hieda, H. Takato, K. Sunouchi, F. Horiguchi, K. Ohuchi, F. Masuoka, H. Hara, IEEE JSSC, Vol. 30, No. 9, 1995).

A static random access memory (SRAM) is constituted by two inverters and two selection transistors. When an SRAM is formed using a conventional SGT-based CMOS inverter circuits, the SRAM is constituted by two pMOS SGTs and four nMOS SGTs. In other words, the SRAM formed using the conventional SGT-based CMOS inverter circuits is constituted by a total of six pillars.

SUMMARY OF THE INVENTION

Accordingly, it is an object of the present invention to provide a high-integration CMOS SRAM using a configuration in which an SRAM is constituted by a total of four pillars. In the SRAM, with a configuration in which an inverter is constituted by one pillar, two inverters are constituted by two pillars, and two selection transistors are constituted by two pillars.

According to an aspect of the present invention, there is provided a semiconductor device including two inverters and two selection transistors that are arranged in a matrix form on a substrate. One of the two inverters is a first inverter arranged in a first row and a second column. The first inverter includes the following: a first pillar that is formed by integrating, into one piece, a first first-conductivity-type semiconductor, a first second-conductivity-type semiconductor whose polarity is different from a polarity of the first first-conductivity-type semiconductor, and a first insulating material which is disposed between the first first-conductivity-type semiconductor and the first second-conductivity-type semiconductor, and that vertically extends with respect to the substrate; a first second-conductivity-type high-concentration semiconductor which is disposed on the first first-conductivity-type semiconductor and whose polarity is different from the polarity of the first first-conductivity-type semiconductor; a second second-conductivity-type high-concentration semiconductor which is disposed under the first first-conductivity-type semiconductor and whose polarity is different from the polarity of the first first-conductivity-type semiconductor; a first first-conductivity-type high-concentration semiconductor which is disposed on the first second-conductivity-type semiconductor and whose polarity is different from the polarity of the first second-conductivity-type semiconductor; a second first-conductivity-type high-concentration semiconductor which is disposed under the first second-conductivity-type semiconductor and whose polarity is different from the polarity of the first second-conductivity-type semiconductor; a first gate insulating material formed around the first pillar; and a first gate conductive material formed around the first gate insulating material. The other inverter is a second inverter arranged in a second row and a first column. The second inverter includes the following: a second pillar that is formed by integrating, into one piece, a second first-conductivity-type semiconductor, a second second-conductivity-type semiconductor whose polarity is different from a polarity of the second first-conductivity-type semiconductor, and a second insulating material which is disposed between the second first-conductivity-type semiconductor and the second second-conductivity-type semiconductor, and that vertically extends with respect to the substrate; a third second-conductivity-type high-concentration semiconductor which is disposed on the second first-conductivity-type semiconductor and whose polarity is different from the polarity of the second first-conductivity-type semiconductor; a fourth second-conductivity-type high-concentration semiconductor which is disposed under the second first-conductivity-type semiconductor and whose polarity is different from the polarity of the second first-conductivity-type semiconductor; a third first-conductivity-type high-concentration semiconductor which is disposed on the second second-conductivity-type semiconductor and whose polarity is different from the polarity of the second second-conductivity-type semiconductor; a fourth first-conductivity-type high-concentration semiconductor which is disposed under the second second-conductivity-type semiconductor and whose polarity is different from the polarity of the second second-conductivity-type semiconductor; a second gate insulating material formed around the second pillar; and a second gate conductive material formed around the second gate insulating material. One of the two selection transistors is a selection transistor arranged in the first row and the first column. The selection transistor arranged in the first row and the first column includes the following: a third pillar that includes a third first-conductivity-type semiconductor; a fifth second-conductivity-type high-concentration semiconductor which is disposed on the third first-conductivity-type semiconductor and whose polarity is different from a polarity of the third first-conductivity-type semiconductor; a sixth second-conductivity-type high-concentration semiconductor which is disposed under the third first-conductivity-type semiconductor and whose polarity is different from the polarity of the third first-conductivity-type semiconductor; a third gate insulating material formed around the third pillar; and a third gate conductive material formed around the third gate insulating material. The other selection transistor is a selection transistor arranged in the second row and the second column. The selection transistor arranged in the second row and the second column includes the following: a fourth pillar that includes a fourth first-conductivity-type semiconductor; a seventh second-conductivity-type high-concentration semiconductor which is disposed on the fourth first-conductivity-type semiconductor and whose polarity is different from a polarity of the fourth first-conductivity-type semiconductor; an eighth second-conductivity-type high-concentration semiconductor which is disposed under the fourth first-conductivity-type semiconductor and whose polarity is different from the polarity of the fourth first-conductivity-type semiconductor; a fourth gate insulating material formed around the fourth pillar; and a fourth gate conductive material formed around the fourth gate insulating material.

Furthermore, according a preferred aspect of the present invention, in the above-described semiconductor device, the second first-conductivity-type high-concentration semiconductor, the second second-conductivity-type high-concentration semiconductor, and the eighth second-conductivity-type high-concentration semiconductor are connected to one another. The eighth second-conductivity-type high-concentration semiconductor and the second gate conductive material are connected to each other. The fourth first-conductivity-type high-concentration semiconductor, the fourth second-conductivity-type high-concentration semiconductor, and the sixth second-conductivity-type high-concentration semiconductor are connected to one another. The sixth second-conductivity-type high-concentration semiconductor and the first gate conductive material are connected to each other.

Moreover, according a preferred aspect of the present invention, in the above-described semiconductor device, the first to fourth first-conductivity-type semiconductors, the first and second second-conductivity-type semiconductors, the first to fourth first-conductivity-type high-concentration semiconductors, and the first to eighth second-conductivity-type high-concentration semiconductors are formed of silicon.

Additionally, according a preferred aspect of the present invention, in the above-described semiconductor device, the first conductivity type is p type and the second conductivity type is n type.

In the present invention, according to the aspect of the present invention, there is provided a semiconductor device including two inverters and two selection transistors that are arranged in a matrix form on a substrate. One of the two inverters is a first inverter arranged in a first row and a second column. The first inverter includes the following: a first pillar that is formed by integrating, into one piece, a first first-conductivity-type semiconductor, a first second-conductivity-type semiconductor whose polarity is different from a polarity of the first first-conductivity-type semiconductor, and a first insulating material which is disposed between the first first-conductivity-type semiconductor and the first second-conductivity-type semiconductor, and that vertically extends with respect to the substrate; a first second-conductivity-type high-concentration semiconductor which is disposed on the first first-conductivity-type semiconductor and whose polarity is different from the polarity of the first first-conductivity-type semiconductor; a second second-conductivity-type high-concentration semiconductor which is disposed under the first first-conductivity-type semiconductor and whose polarity is different from the polarity of the first first-conductivity-type semiconductor; a first first-conductivity-type high-concentration semiconductor which is disposed on the first second-conductivity-type semiconductor and whose polarity is different from the polarity of the first second-conductivity-type semiconductor; a second first-conductivity-type high-concentration semiconductor which is disposed under the first second-conductivity-type semiconductor and whose polarity is different from the polarity of the first second-conductivity-type semiconductor; a first gate insulating material formed around the first pillar; and a first gate conductive material formed around the first gate insulating material. The other inverter is a second inverter arranged in a second row and a first column. The second inverter includes the following: a second pillar that is formed by integrating, into one piece, a second first-conductivity-type semiconductor, a second second-conductivity-type semiconductor whose polarity is different from a polarity of the second first-conductivity-type semiconductor, and a second insulating material which is disposed between the second first-conductivity-type semiconductor and the second second-conductivity-type semiconductor, and that vertically extends with respect to the substrate; a third second-conductivity-type high-concentration semiconductor which is disposed on the second first-conductivity-type semiconductor and whose polarity is different from the polarity of the second first-conductivity-type semiconductor; a fourth second-conductivity-type high-concentration semiconductor which is disposed under the second first-conductivity-type semiconductor and whose polarity is different from the polarity of the second first-conductivity-type semiconductor; a third first-conductivity-type high-concentration semiconductor which is disposed on the second second-conductivity-type semiconductor and whose polarity is different from the polarity of the second second-conductivity-type semiconductor; a fourth first-conductivity-type high-concentration semiconductor which is disposed under the second second-conductivity-type semiconductor and whose polarity is different from the polarity of the second second-conductivity-type semiconductor; a second gate insulating material formed around the second pillar; and a second gate conductive material formed around the second gate insulating material. One of the two selection transistors is a selection transistor arranged in the first row and the first column. The selection transistor arranged in the first row and the first column includes the following: a third pillar that includes a third first-conductivity-type semiconductor; a fifth second-conductivity-type high-concentration semiconductor which is disposed on the third first-conductivity-type semiconductor and whose polarity is different from a polarity of the third first-conductivity-type semiconductor; a sixth second-conductivity-type high-concentration semiconductor which is disposed under the third first-conductivity-type semiconductor and whose polarity is different from the polarity of the third first-conductivity-type semiconductor; a third gate insulating material formed around the third pillar; and a third gate conductive material formed around the third gate insulating material. The other selection transistor is a selection transistor arranged in the second row and the second column. The selection transistor arranged in the second row and the second column includes the following: a fourth pillar that includes a fourth first-conductivity-type semiconductor; a seventh second-conductivity-type high-concentration semiconductor which is disposed on the fourth first-conductivity-type semiconductor and whose polarity is different from a polarity of the fourth first-conductivity-type semiconductor; an eighth second-conductivity-type high-concentration semiconductor which is disposed under the fourth first-conductivity-type semiconductor and whose polarity is different from the polarity of the fourth first-conductivity-type semiconductor; a fourth gate insulating material formed around the fourth pillar; and a fourth gate conductive material formed around the fourth gate insulating material. With a configuration in which an inverter is constituted by one pillar, two inverters are constituted by two pillars, and two selection transistors are constituted by two pillars, whereby an SRAM is constituted by a total of four pillars. Accordingly, with the configuration, a high-integration CMOS SRAM can be provided.

Furthermore, in the present invention, in the above-described semiconductor device, the second first-conductivity-type high-concentration semiconductor, the second second-conductivity-type high-concentration semiconductor, and the eighth second-conductivity-type high-concentration semiconductor are connected to one another. The eighth second-conductivity-type high-concentration semiconductor and the second gate conductive material are connected to each other. The fourth first-conductivity-type high-concentration semiconductor, the fourth second-conductivity-type high-concentration semiconductor, and the sixth second-conductivity-type high-concentration semiconductor are connected to one another. The sixth second-conductivity-type high-concentration semiconductor and the first gate conductive material are connected to each other. Accordingly, an SRAM can be constituted by the above-described semiconductor device. With the configuration, a high-integration CMOS SRAM can be provided.

Furthermore, in the present invention, in the above-described semiconductor device, the first to fourth first-conductivity-type semiconductors, the first and second second-conductivity-type semiconductors, the first to fourth first-conductivity-type high-concentration semiconductors, and the first to eighth second-conductivity-type high-concentration semiconductors are formed of silicon. Accordingly, a high-integration CMOS SRAM using silicon can be provided using the above-described semiconductor device.

Moreover, in the present invention, in the above-described semiconductor device, the first conductivity type is p type and the second conductivity type is n type. Accordingly, the selection transistors can be n-type transistors.

BRIEF DESCRIPTION OF THE DRAWINGS

FIG. 1A is a plan view of a semiconductor device according to the present invention;

FIG. 1B is a cross-sectional view of the semiconductor device according to the present invention, which is taken along the line X-X';

FIG. 1C is a cross-sectional view of the semiconductor device according to the present invention, which is taken along the line Y-Y';

FIG. 2A is a plan view illustrating a method for producing the semiconductor device according to the present invention;

FIG. 2B is a cross-sectional view illustrating the method for producing the semiconductor device according to the present invention, which is taken along the line X-X';

FIG. 2C is a cross-sectional view illustrating the method for producing the semiconductor device according to the present invention, which is taken along the line Y-Y';

FIG. 3A is a plan view illustrating the method for producing the semiconductor device according to the present invention;

FIG. 3B is a cross-sectional view illustrating the method for producing the semiconductor device according to the present invention, which is taken along the line X-X';

FIG. 3C is a cross-sectional view illustrating the method for producing the semiconductor device according to the present invention, which is taken along the line Y-Y';

FIG. 4A is a plan view illustrating the method for producing the semiconductor device according to the present invention;

FIG. 4B is a cross-sectional view illustrating the method for producing the semiconductor device according to the present invention, which is taken along the line X-X';

FIG. 4C is a cross-sectional view illustrating the method for producing the semiconductor device according to the present invention, which is taken along the line Y-Y';

FIG. 5A is a plan view illustrating the method for producing the semiconductor device according to the present invention;

FIG. 5B is a cross-sectional view illustrating the method for producing the semiconductor device according to the present invention, which is taken along the line X-X';

FIG. 5C is a cross-sectional view illustrating the method for producing the semiconductor device according to the present invention, which is taken along the line Y-Y';

FIG. 7A is a plan view illustrating the method for producing the semiconductor device according to the present invention;

FIG. 7B is a cross-sectional view illustrating the method for producing the semiconductor device according to the present invention, which is taken along the line X-X';

FIG. 7C is a cross-sectional view illustrating the method for producing the semiconductor device according to the present invention, which is taken along the line Y-Y';

FIG. 9A is a plan view illustrating the method for producing the semiconductor device according to the present invention;

FIG. 9B is a cross-sectional view illustrating the method for producing the semiconductor device according to the present invention, which is taken along the line X-X';

FIG. 9C is a cross-sectional view illustrating the method for producing the semiconductor device according to the present invention, which is taken along the line Y-Y';

FIG. 10A is a plan view illustrating the method for producing the semiconductor device according to the present invention;

FIG. 10B is a cross-sectional view illustrating the method for producing the semiconductor device according to the present invention, which is taken along the line X-X';

FIG. 10C is a cross-sectional view illustrating the method for producing the semiconductor device according to the present invention, which is taken along the line Y-Y';

FIG. 13A is a plan view illustrating the method for producing the semiconductor device according to the present invention;

FIG. 13B is a cross-sectional view illustrating the method for producing the semiconductor device according to the present invention, which is taken along the line X-X';

FIG. 13C is a cross-sectional view illustrating the method for producing the semiconductor device according to the present invention, which is taken along the line Y-Y';

FIG. 14A is a plan view illustrating the method for producing the semiconductor device according to the present invention;

FIG. 14B is a cross-sectional view illustrating the method for producing the semiconductor device according to the present invention, which is taken along the line X-X';

FIG. 14C is a cross-sectional view illustrating the method for producing the semiconductor device according to the present invention, which is taken along the line Y-Y';

FIG. 15A is a plan view illustrating the method for producing the semiconductor device according to the present invention;

FIG. 15B is a cross-sectional view illustrating the method for producing the semiconductor device according to the present invention, which is taken along the line X-X';

FIG. 15C is a cross-sectional view illustrating the method for producing the semiconductor device according to the present invention, which is taken along the line Y-Y';

FIG. 16A is a plan view illustrating the method for producing the semiconductor device according to the present invention;

FIG. 16B is a cross-sectional view illustrating the method for producing the semiconductor device according to the present invention, which is taken along the line X-X';

FIG. 16C is a cross-sectional view illustrating the method for producing the semiconductor device according to the present invention, which is taken along the line Y-Y';

FIG. 17A is a plan view illustrating the method for producing the semiconductor device according to the present invention;

FIG. 17B is a cross-sectional view illustrating the method for producing the semiconductor device according to the present invention, which is taken along the line X-X';

FIG. 17C is a cross-sectional view illustrating the method for producing the semiconductor device according to the present invention, which is taken along the line Y-Y';

FIG. 18A is a plan view illustrating the method for producing the semiconductor device according to the present invention;

FIG. 18B is a cross-sectional view illustrating the method for producing the semiconductor device according to the present invention, which is taken along the line X-X';

FIG. 18C is a cross-sectional view illustrating the method for producing the semiconductor device according to the present invention, which is taken along the line Y-Y';

FIG. 19A is a plan view illustrating the method for producing the semiconductor device according to the present invention;

FIG. 19B is a cross-sectional view illustrating the method for producing the semiconductor device according to the present invention, which is taken along the line X-X';

FIG. 19C is a cross-sectional view illustrating the method for producing the semiconductor device according to the present invention, which is taken along the line Y-Y';

FIG. 20A is a plan view illustrating the method for producing the semiconductor device according to the present invention;

FIG. 20B is a cross-sectional view illustrating the method for producing the semiconductor device according to the present invention, which is taken along the line X-X';

FIG. 20C is a cross-sectional view illustrating the method for producing the semiconductor device according to the present invention, which is taken along the line Y-Y';

FIG. 21A is a plan view illustrating the method for producing the semiconductor device according to the present invention;

FIG. 21B is a cross-sectional view illustrating the method for producing the semiconductor device according to the present invention, which is taken along the line X-X';

FIG. 21C is a cross-sectional view illustrating the method for producing the semiconductor device according to the present invention, which is taken along the line Y-Y';

FIG. 22A is a plan view illustrating the method for producing the semiconductor device according to the present invention;

FIG. 22B is a cross-sectional view illustrating the method for producing the semiconductor device according to the present invention, which is taken along the line X-X';

FIG. 22C is a cross-sectional view illustrating the method for producing the semiconductor device according to the present invention, which is taken along the line Y-Y';

FIG. 23A is a plan view illustrating the method for producing the semiconductor device according to the present invention;

FIG. 23B is a cross-sectional view illustrating the method for producing the semiconductor device according to the present invention, which is taken along the line X-X';

FIG. 23C is a cross-sectional view illustrating the method for producing the semiconductor device according to the present invention, which is taken along the line Y-Y';

FIG. 25A is a plan view illustrating the method for producing the semiconductor device according to the present invention;

FIG. 25B is a cross-sectional view illustrating the method for producing the semiconductor device according to the present invention, which is taken along the line X-X';

FIG. 25C is a cross-sectional view illustrating the method for producing the semiconductor device according to the present invention, which is taken along the line Y-Y';

FIG. 26A is a plan view illustrating the method for producing the semiconductor device according to the present invention;

FIG. 26B is a cross-sectional view illustrating the method for producing the semiconductor device according to the present invention, which is taken along the line X-X';

FIG. 26C is a cross-sectional view illustrating the method for producing the semiconductor device according to the present invention, which is taken along the line Y-Y';

FIG. 28A is a plan view illustrating the method for producing the semiconductor device according to the present invention;

FIG. 28B is a cross-sectional view illustrating the method for producing the semiconductor device according to the present invention, which is taken along the line X-X';

FIG. 28C is a cross-sectional view illustrating the method for producing the semiconductor device according to the present invention, which is taken along the line Y-Y';

FIG. 32A is a plan view illustrating the method for producing the semiconductor device according to the present invention;

FIG. 32B is a cross-sectional view illustrating the method for producing the semiconductor device according to the present invention, which is taken along the line X-X';

FIG. 32C is a cross-sectional view illustrating the method for producing the semiconductor device according to the present invention, which is taken along the line Y-Y';

FIG. 33A is a plan view illustrating the method for producing the semiconductor device according to the present invention;

FIG. 33B is a cross-sectional view illustrating the method for producing the semiconductor device according to the present invention, which is taken along the line X-X';

FIG. 33C is a cross-sectional view illustrating the method for producing the semiconductor device according to the present invention, which is taken along the line Y-Y';

FIG. 34A is a plan view illustrating the method for producing the semiconductor device according to the present invention;

FIG. 34B is a cross-sectional view illustrating the method for producing the semiconductor device according to the present invention, which is taken along the line X-X';

FIG. 34C is a cross-sectional view illustrating the method for producing the semiconductor device according to the present invention, which is taken along the line Y-Y';

FIG. 35A is a plan view illustrating the method for producing the semiconductor device according to the present invention;

FIG. 35B is a cross-sectional view illustrating the method for producing the semiconductor device according to the present invention, which is taken along the line X-X';

FIG. 35C is a cross-sectional view illustrating the method for producing the semiconductor device according to the present invention, which is taken along the line Y-Y';

FIG. 36A is a plan view illustrating the method for producing the semiconductor device according to the present invention;

FIG. 36B is a cross-sectional view illustrating the method for producing the semiconductor device according to the present invention, which is taken along the line X-X';

FIG. 36C is a cross-sectional view illustrating the method for producing the semiconductor device according to the present invention, which is taken along the line Y-Y';

FIG. 37A is a plan view illustrating the method for producing the semiconductor device according to the present invention;

FIG. 37B is a cross-sectional view illustrating the method for producing the semiconductor device according to the present invention, which is taken along the line X-X';

FIG. 37C is a cross-sectional view illustrating the method for producing the semiconductor device according to the present invention, which is taken along the line Y-Y';

FIG. 38A is a plan view illustrating the method for producing the semiconductor device according to the present invention;

FIG. 38B is a cross-sectional view illustrating the method for producing the semiconductor device according to the present invention, which is taken along the line X-X';

FIG. 38C is a cross-sectional view illustrating the method for producing the semiconductor device according to the present invention, which is taken along the line Y-Y';

FIG. 39A is a plan view illustrating the method for producing the semiconductor device according to the present invention;

FIG. 39B is a cross-sectional view illustrating the method for producing the semiconductor device according to the present invention, which is taken along the line X-X';

FIG. 39C is a cross-sectional view illustrating the method for producing the semiconductor device according to the present invention, which is taken along the line Y-Y';

FIG. 40A is a plan view illustrating the method for producing the semiconductor device according to the present invention;

FIG. 40B is a cross-sectional view illustrating the method for producing the semiconductor device according to the present invention, which is taken along the line X-X';

FIG. 40C is a cross-sectional view illustrating the method for producing the semiconductor device according to the present invention, which is taken along the line Y-Y';

FIG. 41A is a plan view illustrating the method for producing the semiconductor device according to the present invention;

FIG. 41B is a cross-sectional view illustrating the method for producing the semiconductor device according to the present invention, which is taken along the line X-X';

FIG. 41C is a cross-sectional view illustrating the method for producing the semiconductor device according to the present invention, which is taken along the line Y-Y';

FIG. 42A is a plan view illustrating the method for producing the semiconductor device according to the present invention;

FIG. 42B is a cross-sectional view illustrating the method for producing the semiconductor device according to the present invention, which is taken along the line X-X';

FIG. 42C is a cross-sectional view illustrating the method for producing the semiconductor device according to the present invention, which is taken along the line Y-Y';

FIG. 43A is a plan view illustrating the method for producing the semiconductor device according to the present invention;

FIG. 43B is a cross-sectional view illustrating the method for producing the semiconductor device according to the present invention, which is taken along the line X-X';

FIG. 43C is a cross-sectional view illustrating the method for producing the semiconductor device according to the present invention, which is taken along the line Y-Y';

FIG. 44A is a plan view illustrating the method for producing the semiconductor device according to the present invention;

FIG. 44B is a cross-sectional view illustrating the method for producing the semiconductor device according to the present invention, which is taken along the line X-X';

Figure 46C:
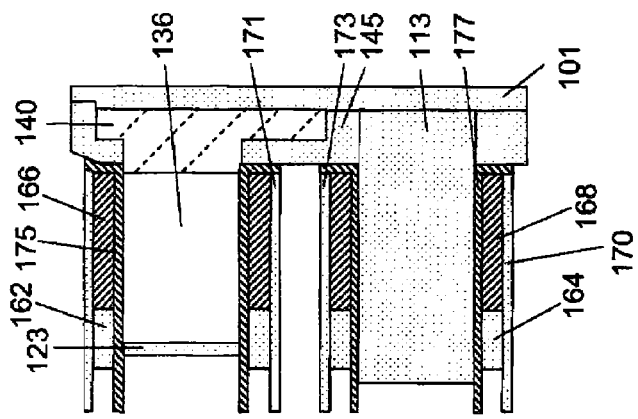
Figure 46A:
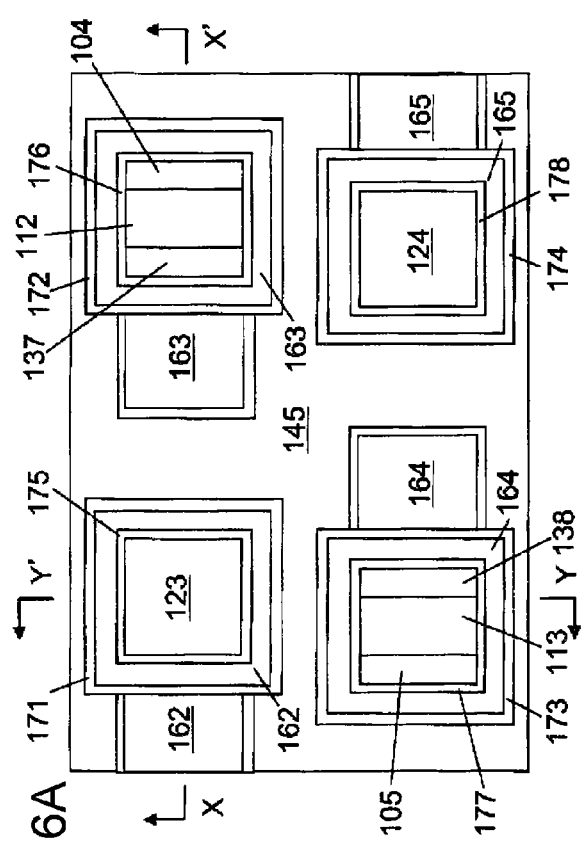
Figure 46B:
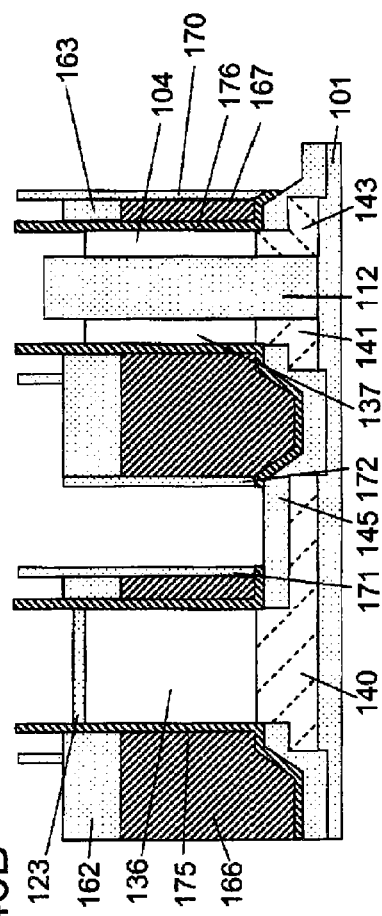
Figure 53C:
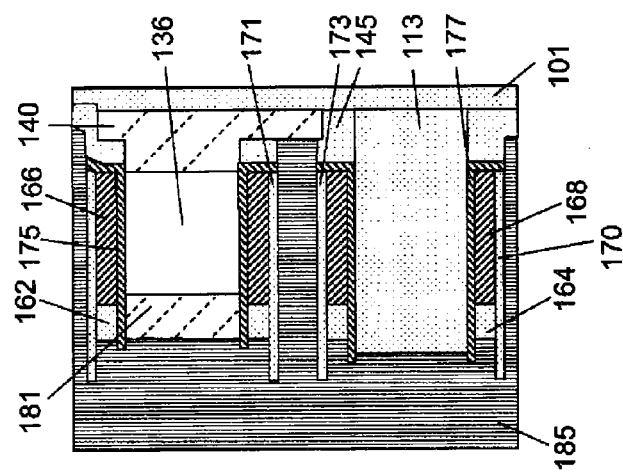
Figure 53A:
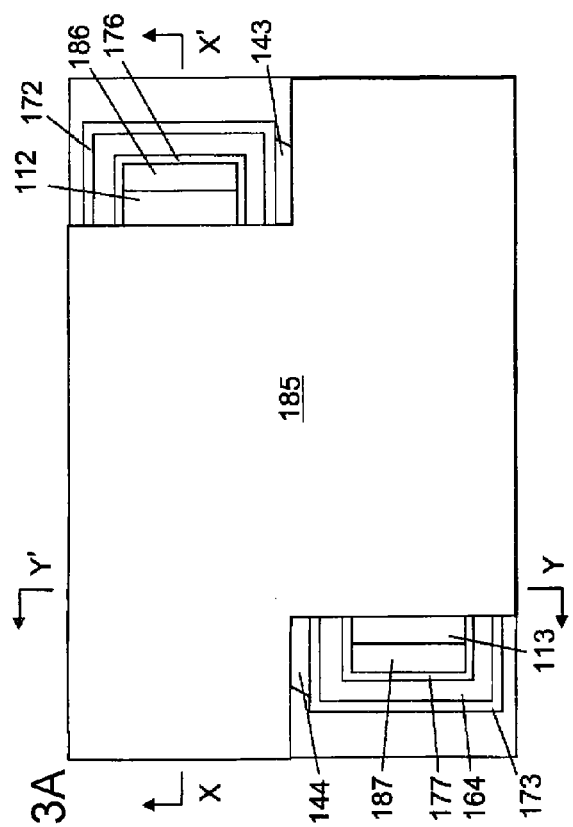
Figure 53B:
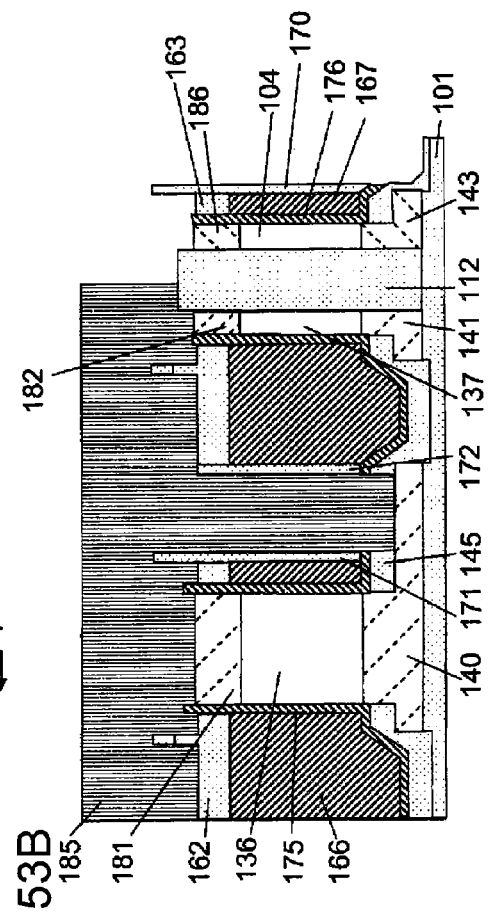
Figure 54C:
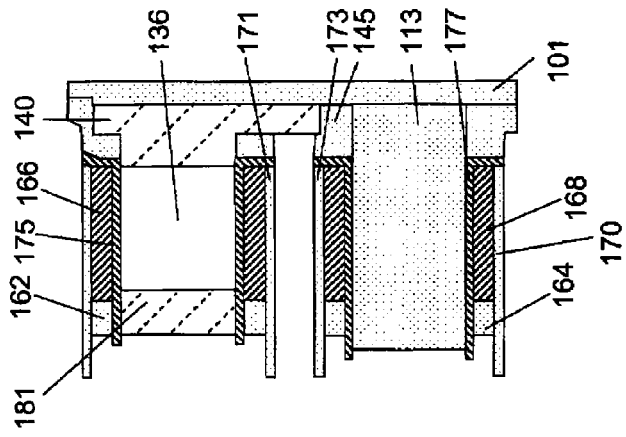
Figure 54A:
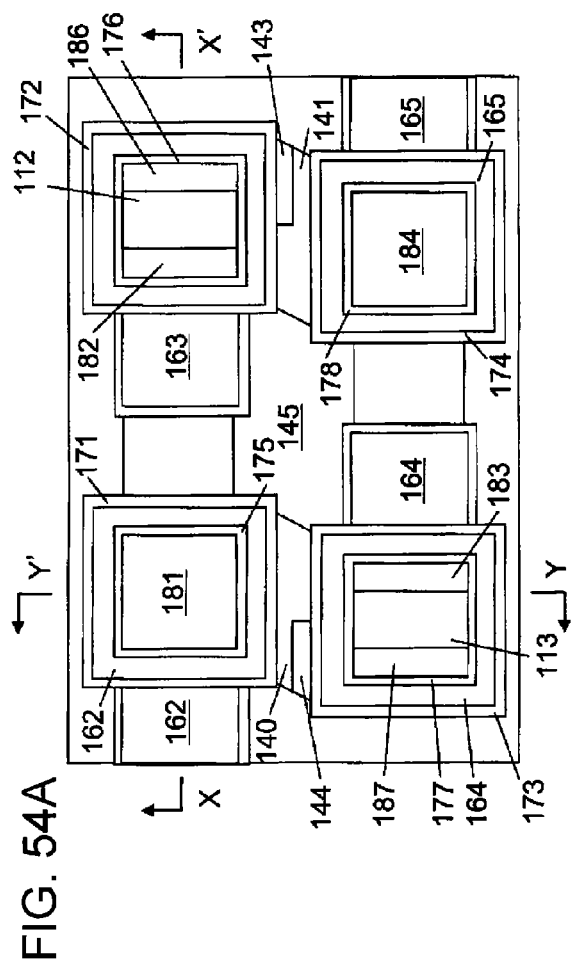
Figure 54B:
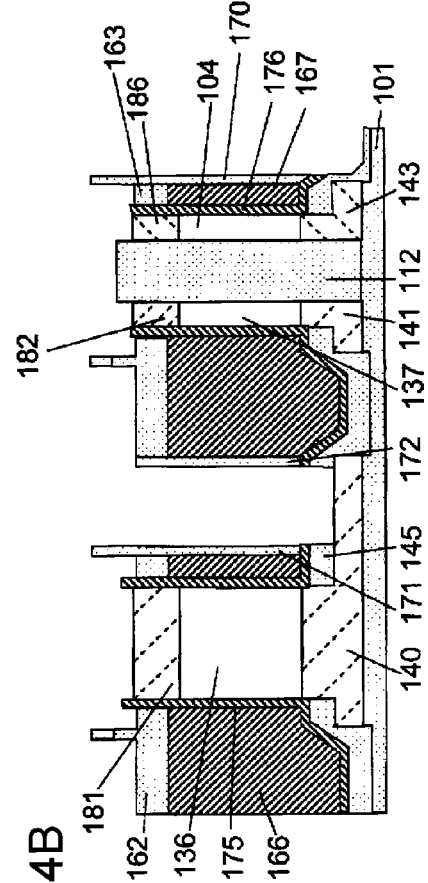
Figure 55C:
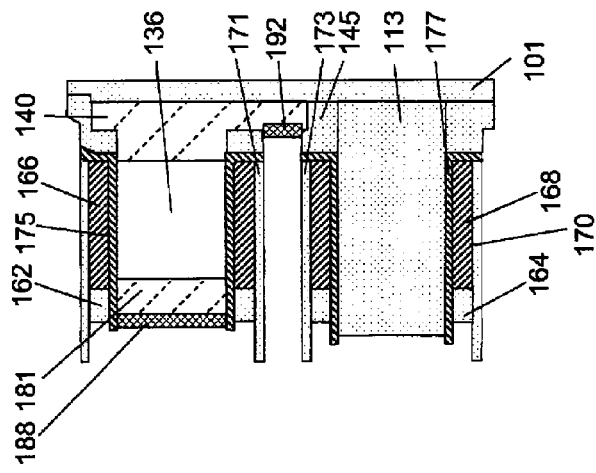
Figure 55A:
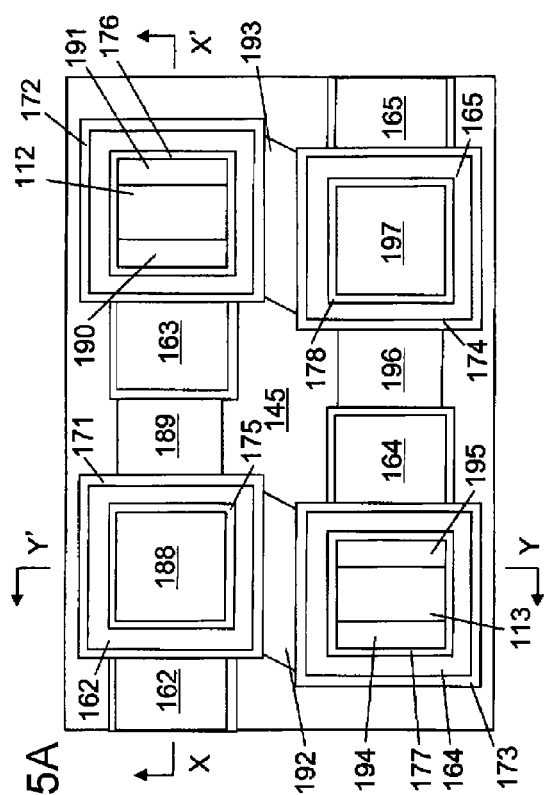
Figure 55B:
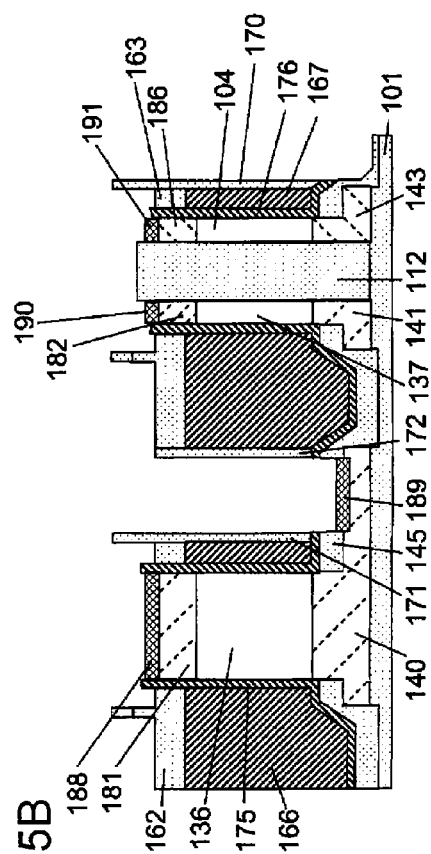
Figure 56A:
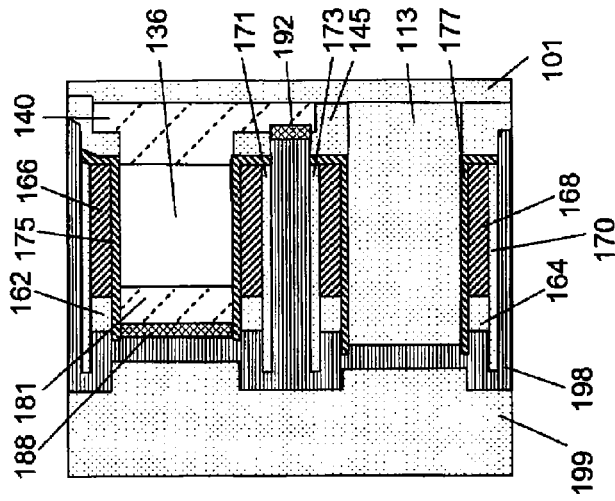
Figure 56B:
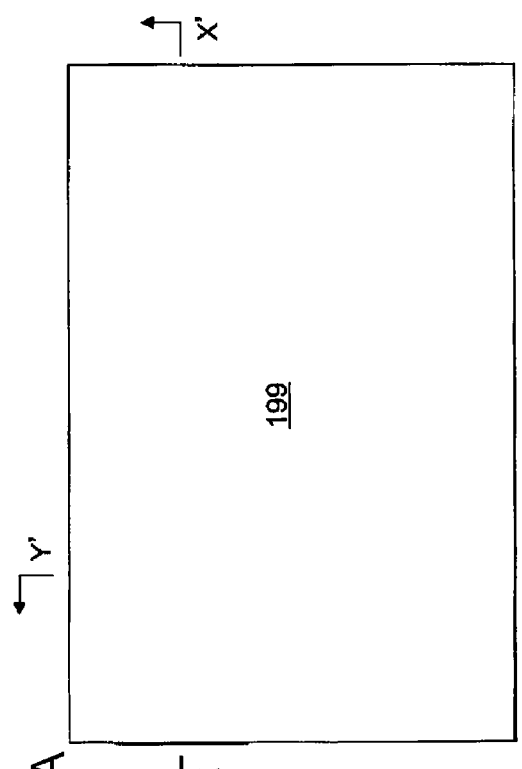
Figure 56C:
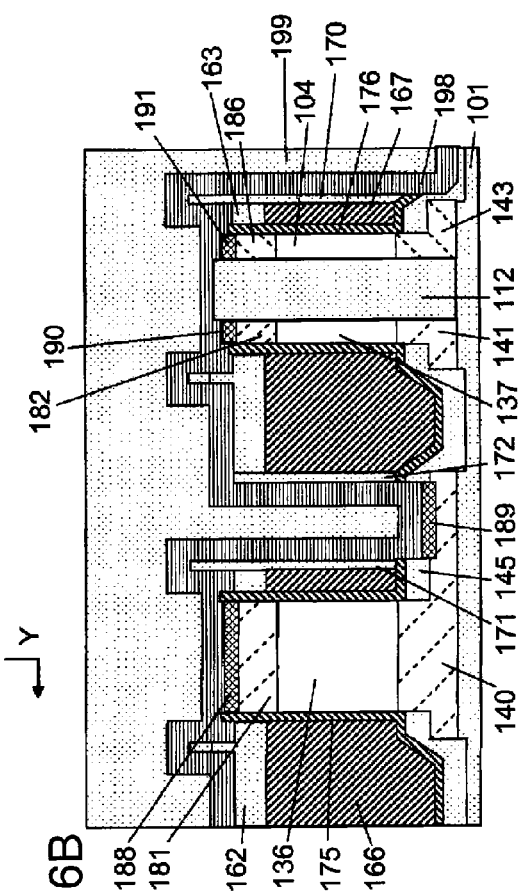
Figure 58C:
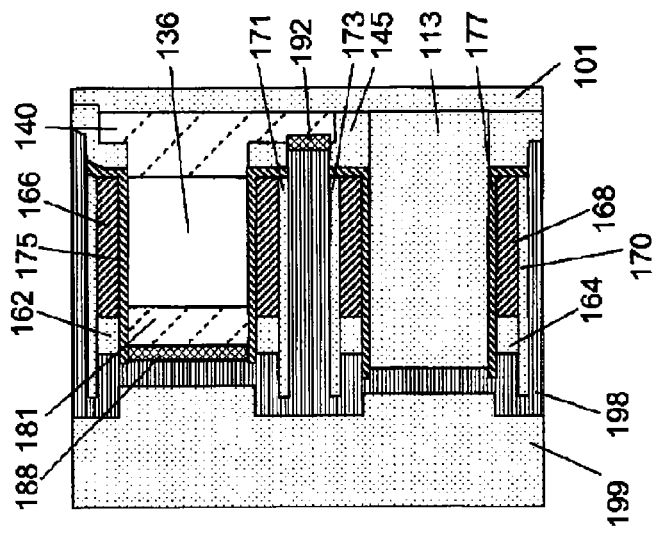
Figure 58A:
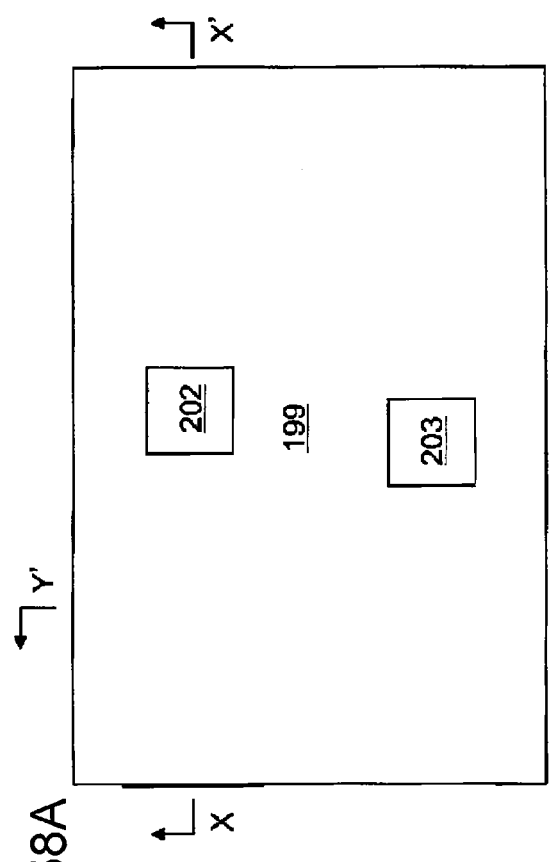
Figure 58B:
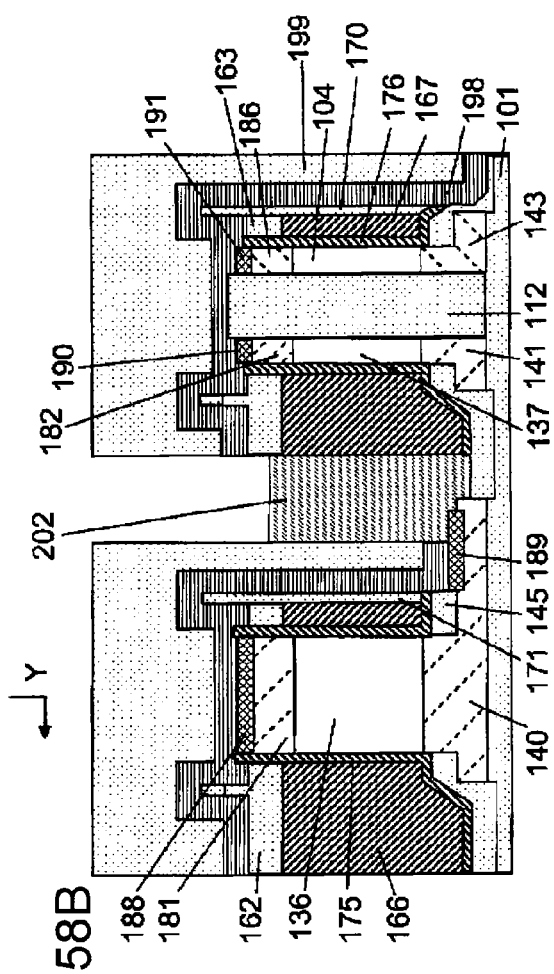
Figure 60C:
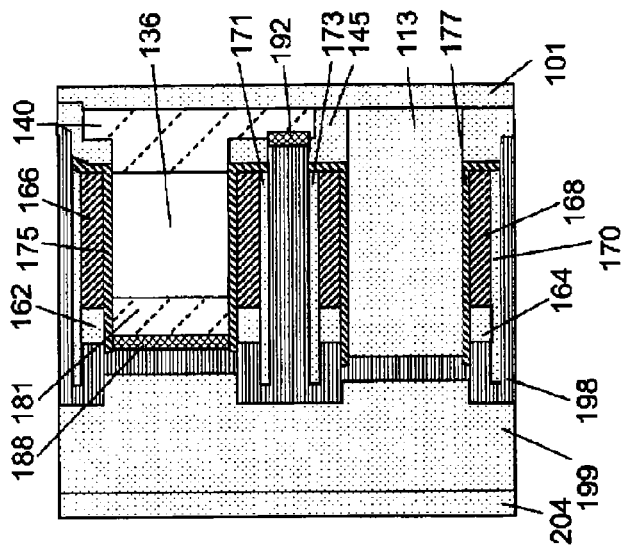
Figure 60A:
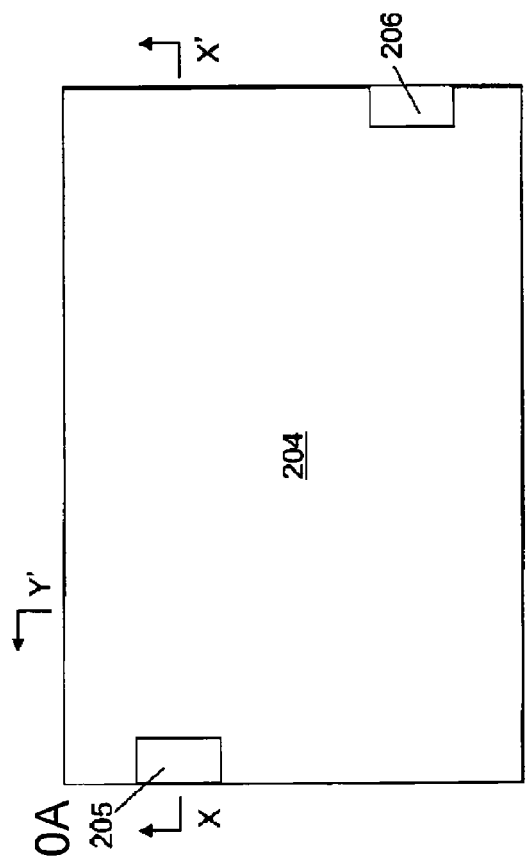
Figure 60B:
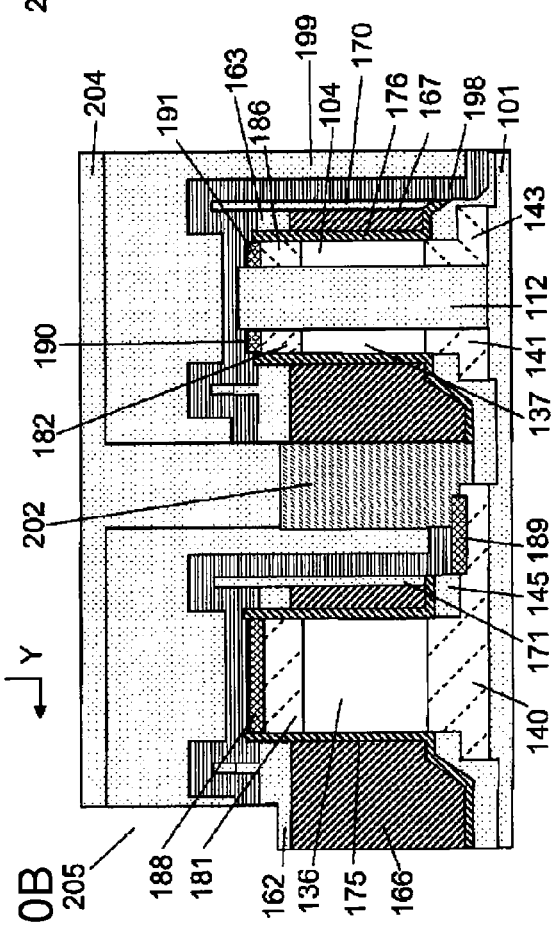
Figure 61C:
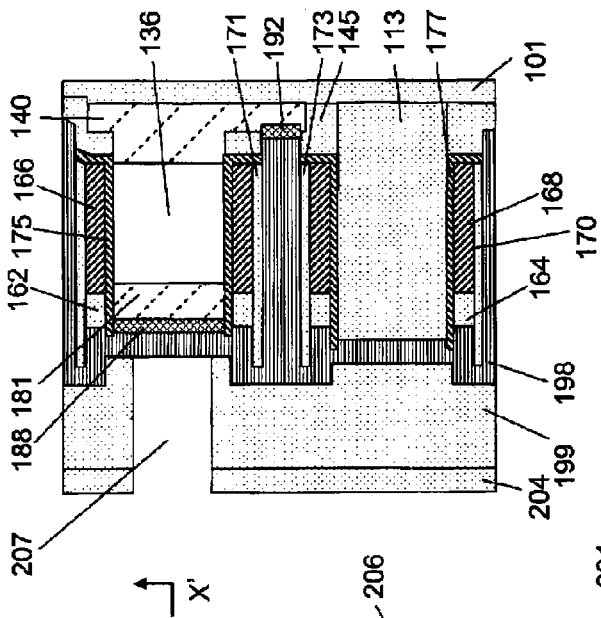
Figure 61A:
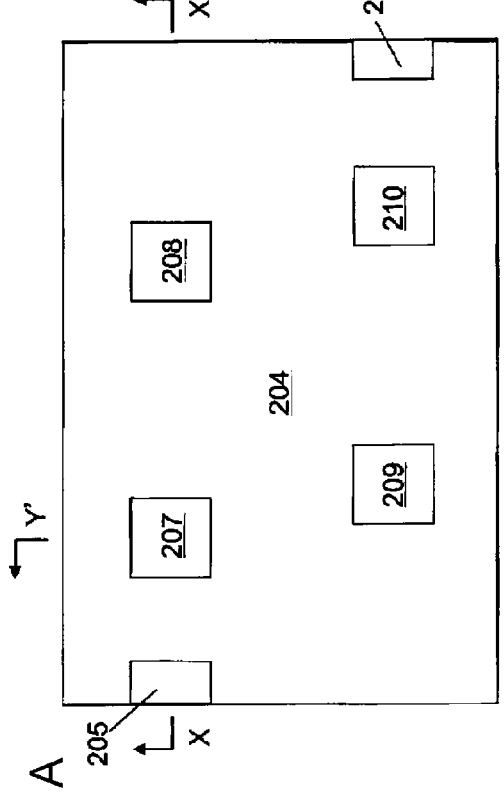
Figure 61B:
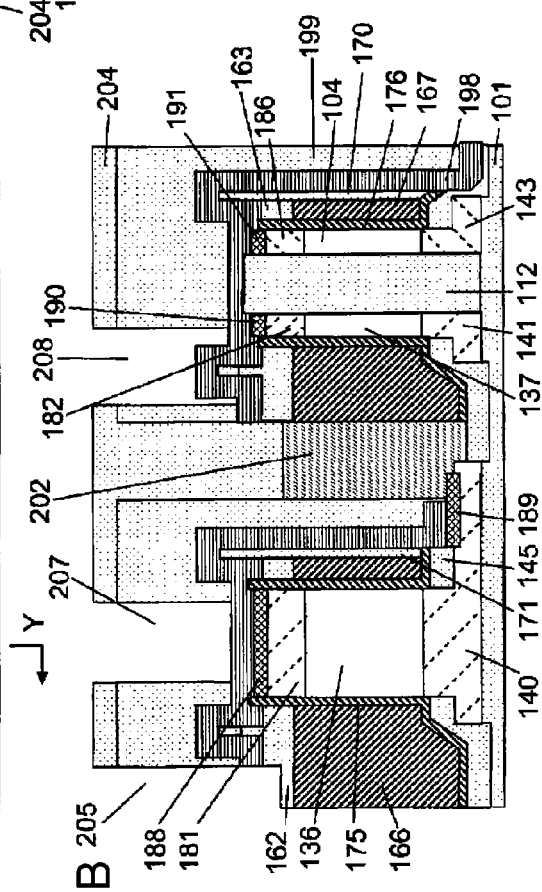
Figure 66:
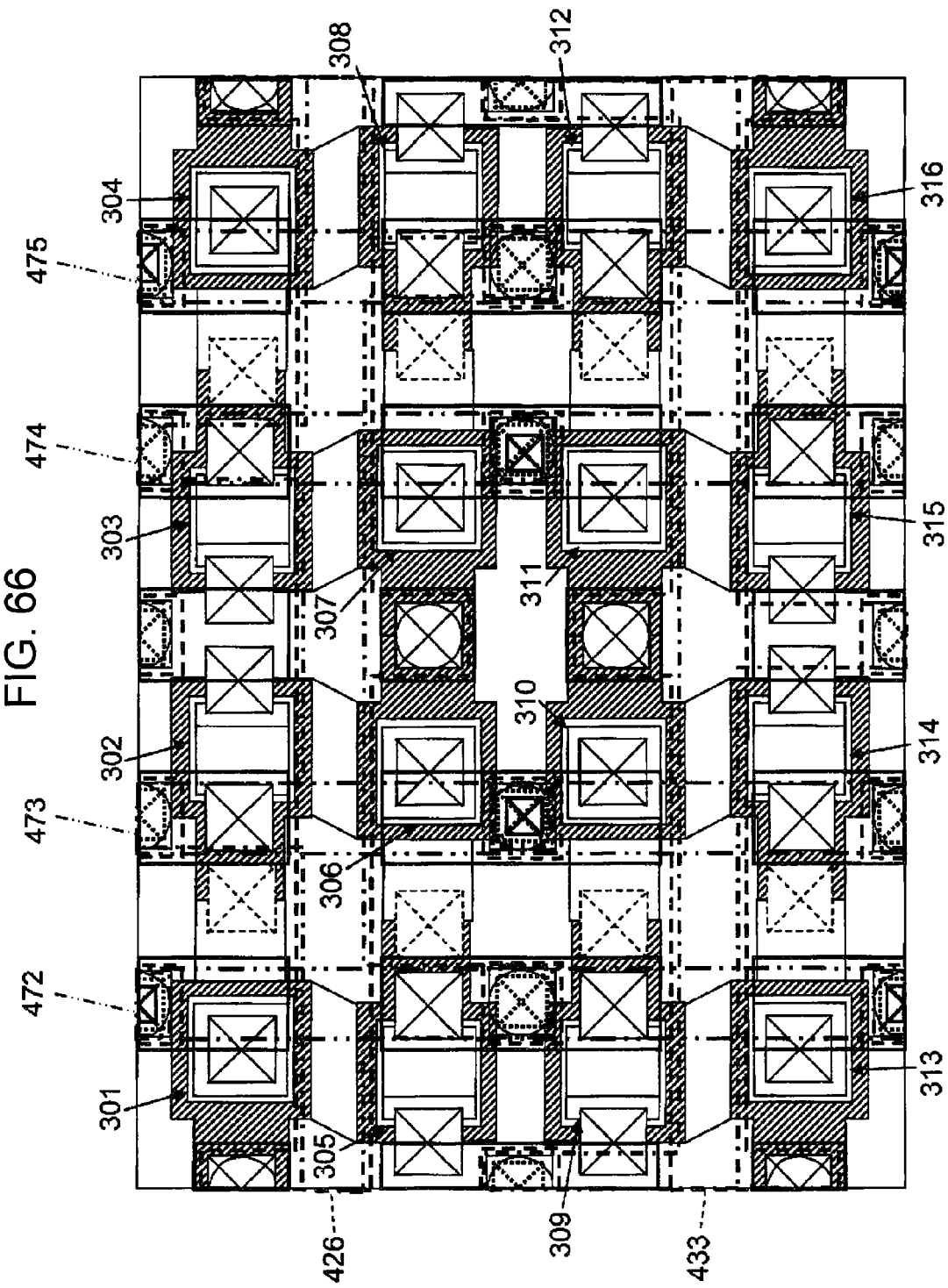
Figure 67:
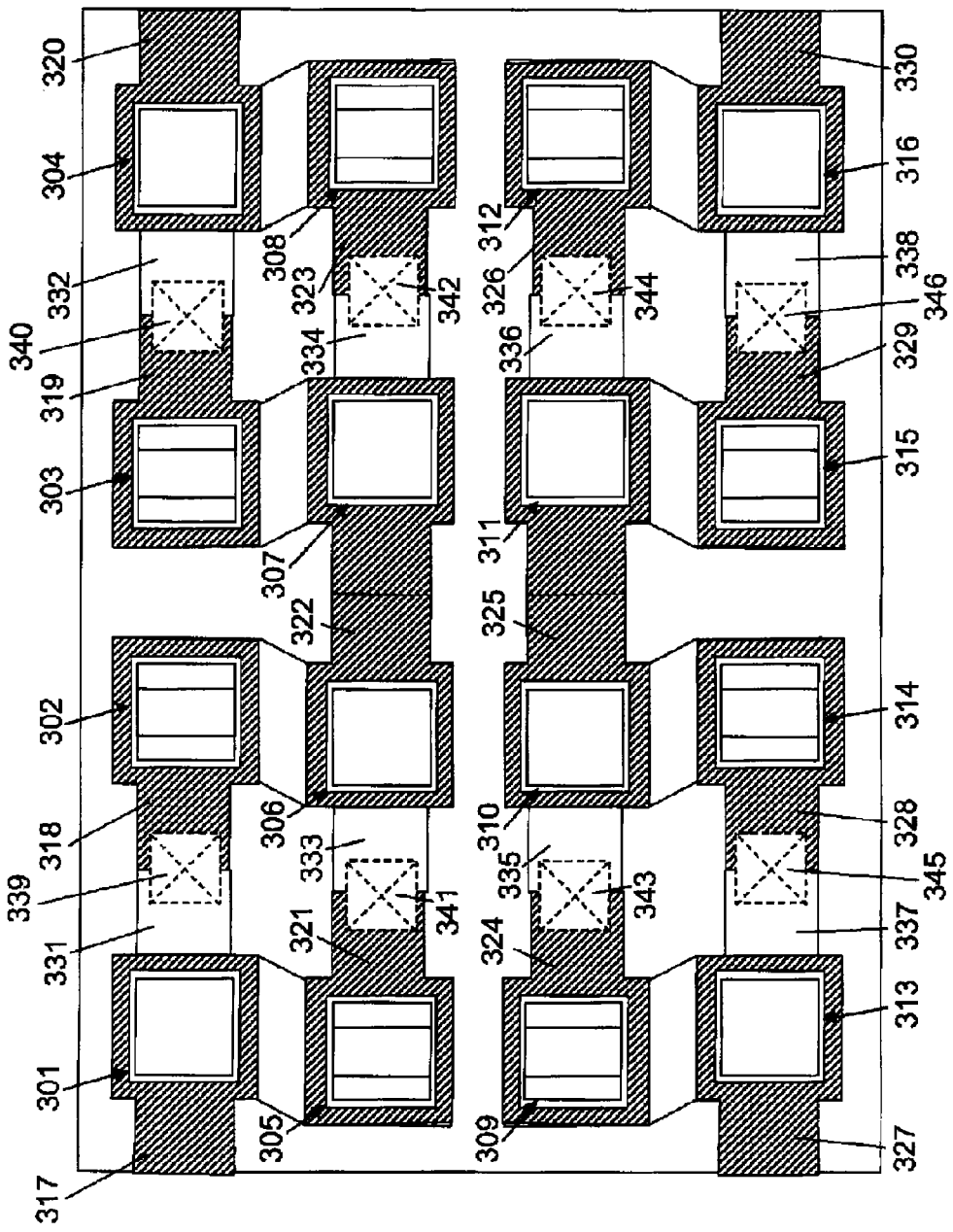
Figure 68:
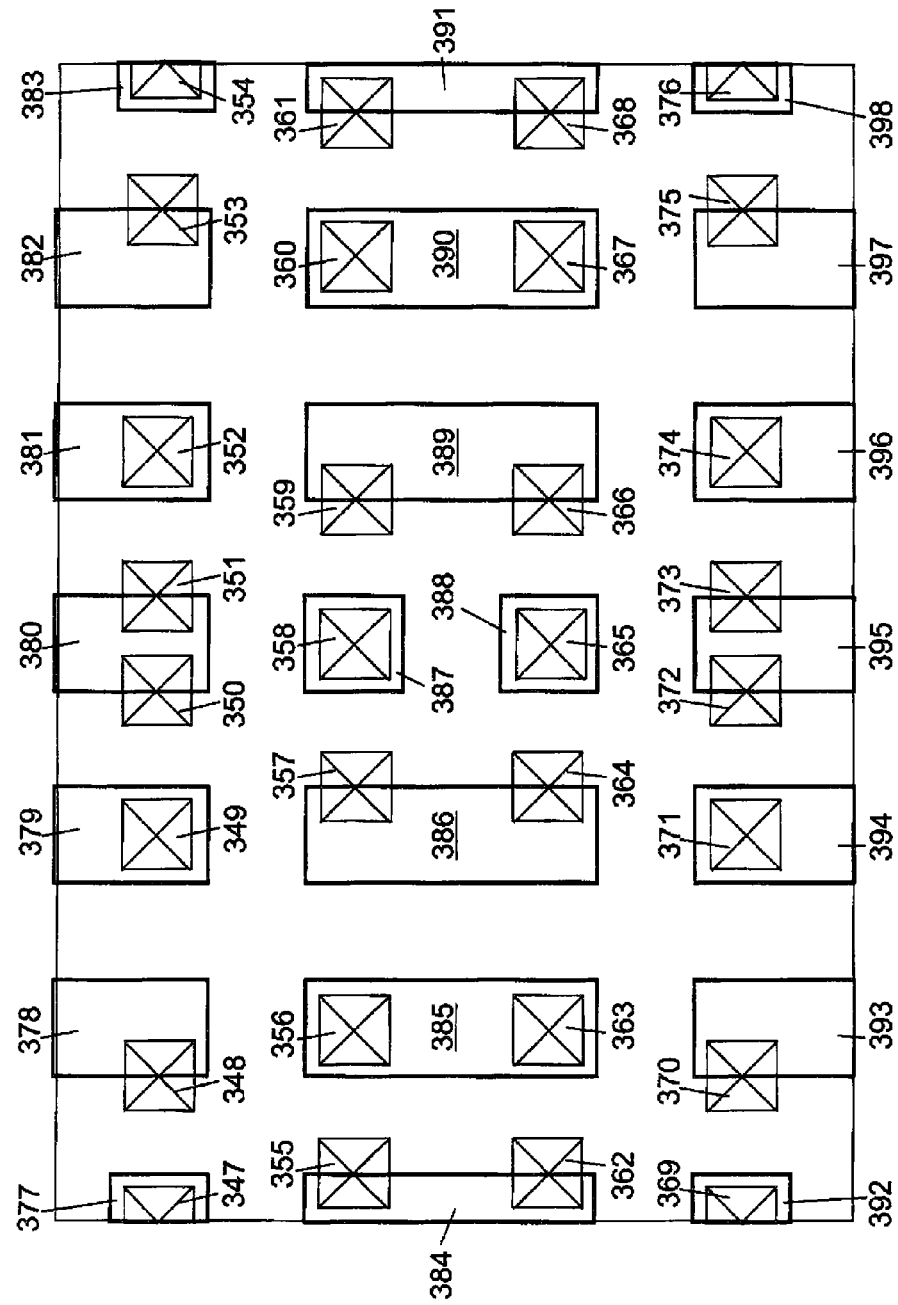
Figure 69:
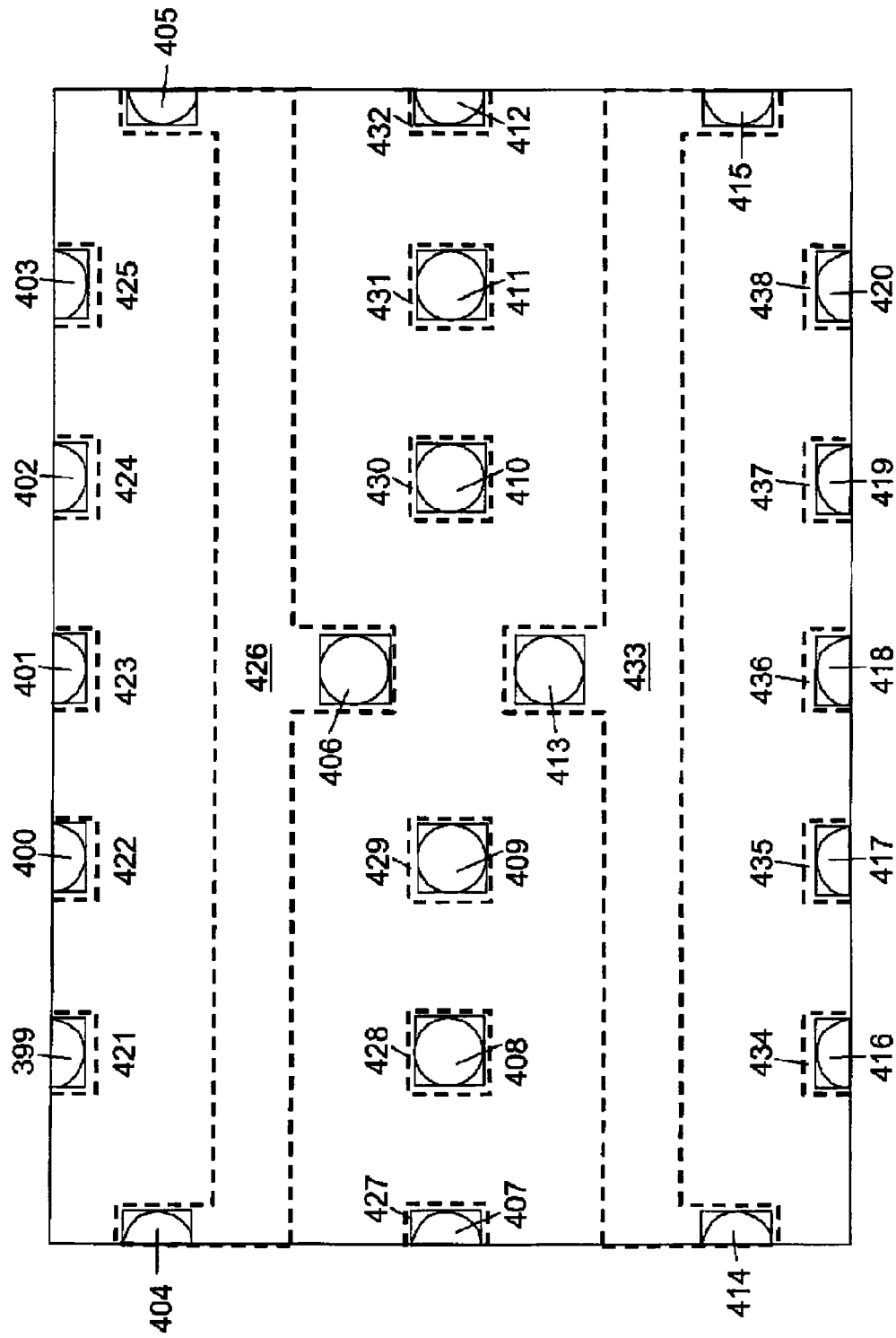
Figure 70:
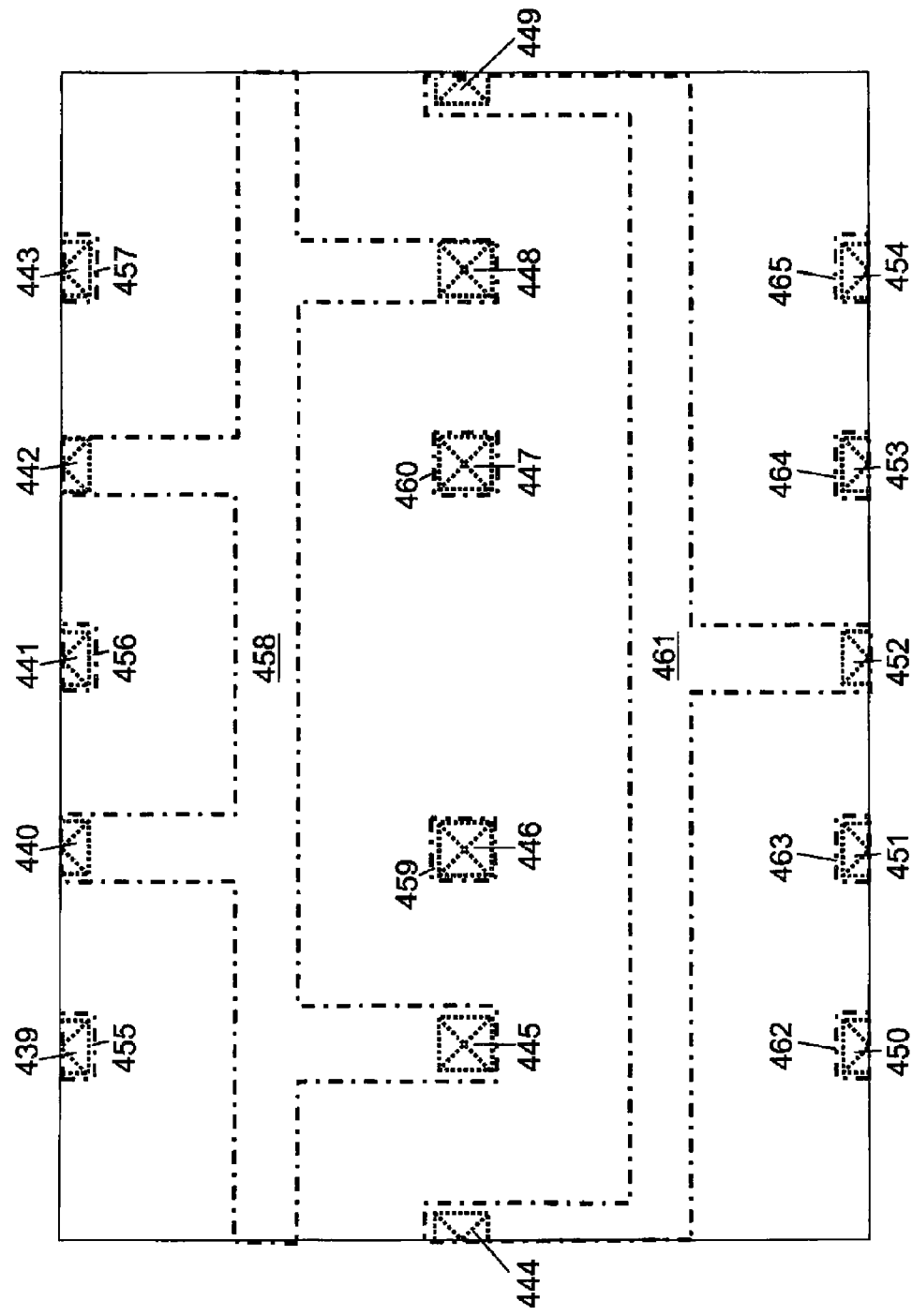
Figure 71:
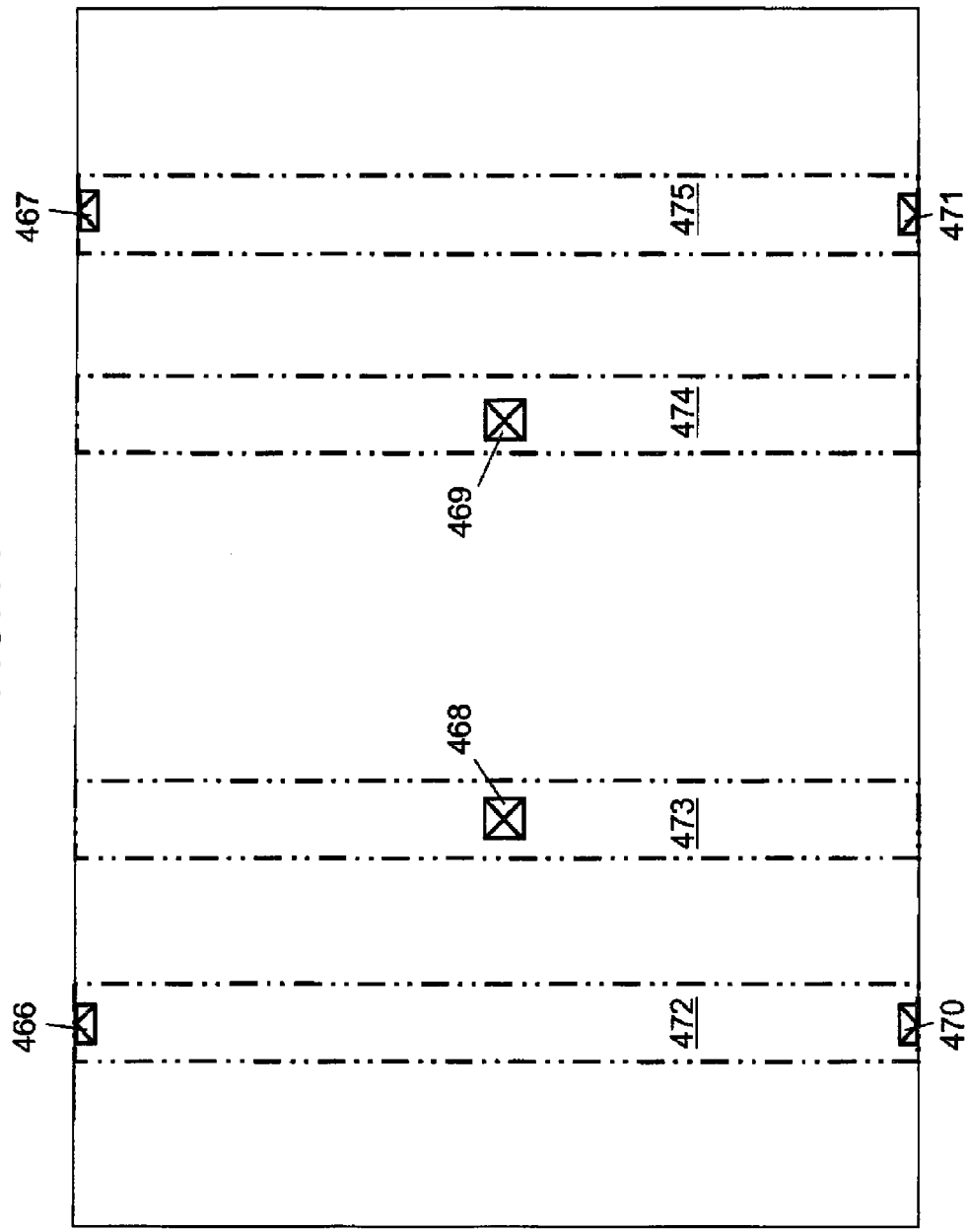
Figure 72:
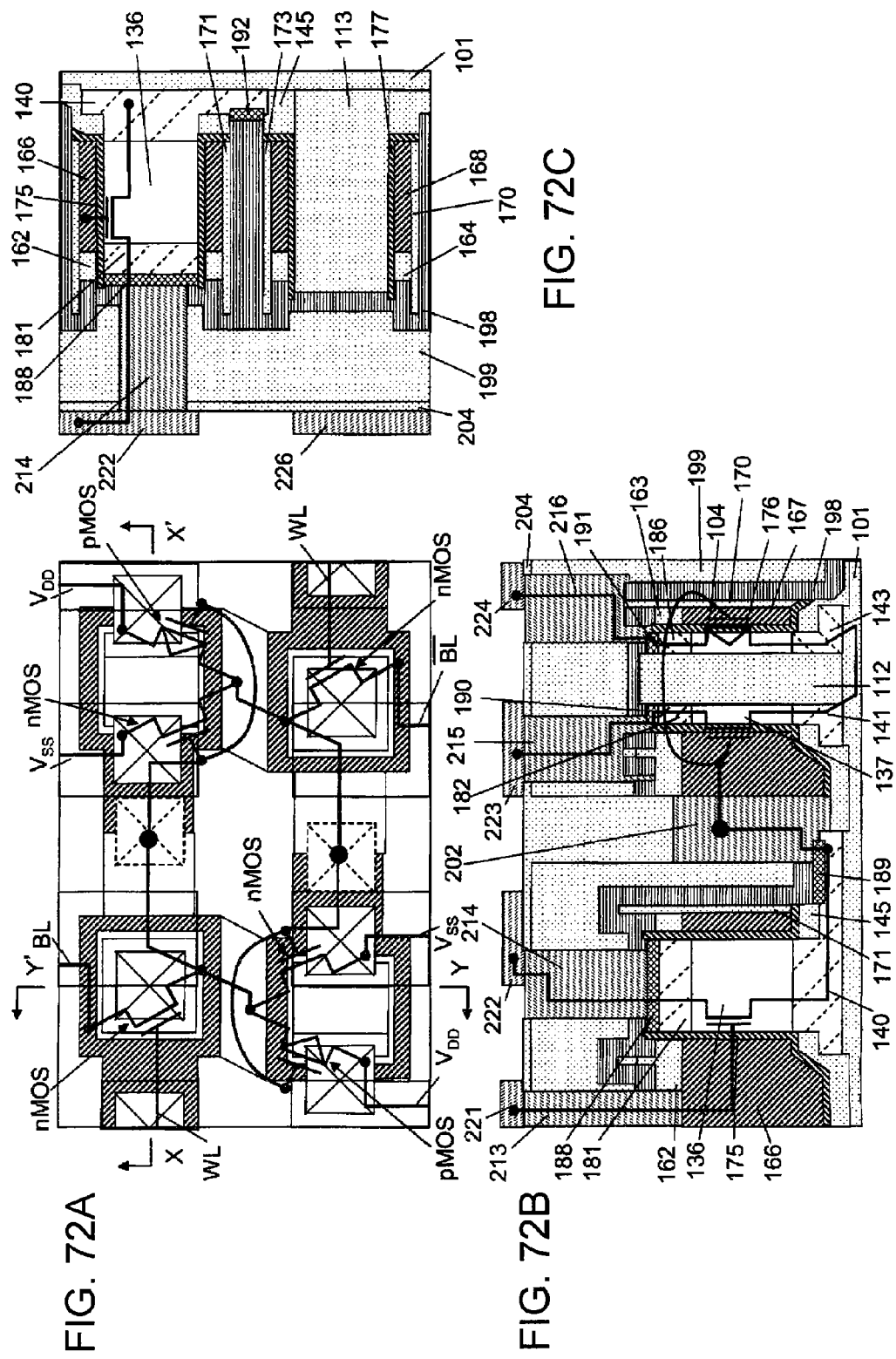
Figure 73:
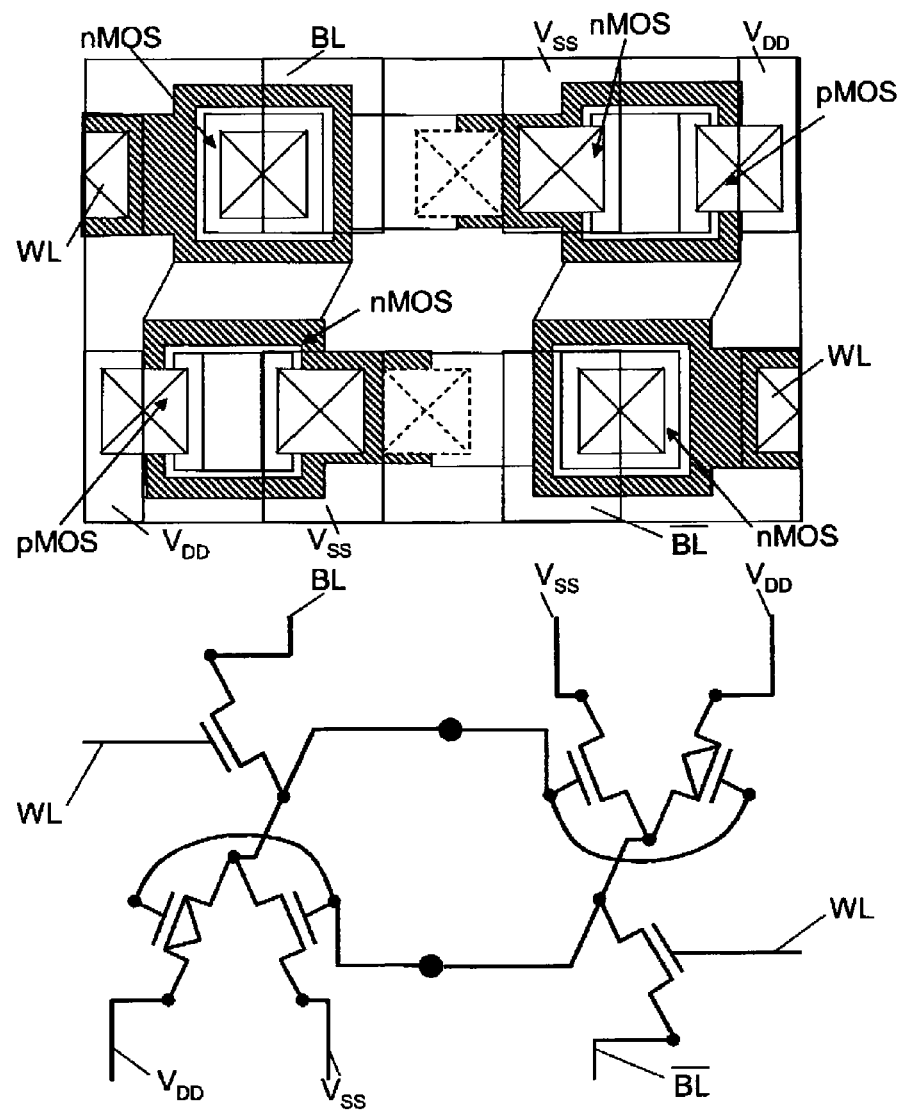

FIG. 44C is a cross-sectional view illustrating the method for producing the semiconductor device according to the present invention, which is taken along the line Y-Y';

FIG. 45A is a plan view illustrating the method for producing the semiconductor device according to the present invention;

FIG. 45B is a cross-sectional view illustrating the method for producing the semiconductor device according to the present invention, which is taken along the line X-X';

FIG. 45C is a cross-sectional view illustrating the method for producing the semiconductor device according to the present invention, which is taken along the line Y-Y';

FIG. 46A is a plan view illustrating the method for producing the semiconductor device according to the present invention;

FIG. 46B is a cross-sectional view illustrating the method for producing the semiconductor device according to the present invention, which is taken along the line X-X';

FIG. 46C is a cross-sectional view illustrating the method for producing the semiconductor device according to the present invention, which is taken along the line Y-Y';

FIG. 47A is a plan view illustrating the method for producing the semiconductor device according to the present invention;

FIG. 47B is a cross-sectional view illustrating the method for producing the semiconductor device according to the present invention, which is taken along the line X-X';

FIG. 47C is a cross-sectional view illustrating the method for producing the semiconductor device according to the present invention, which is taken along the line Y-Y';

FIG. 48A is a plan view illustrating the method for producing the semiconductor device according to the present invention;

FIG. 48B is a cross-sectional view illustrating the method for producing the semiconductor device according to the present invention, which is taken along the line X-X';

FIG. 48C is a cross-sectional view illustrating the method for producing the semiconductor device according to the present invention, which is taken along the line Y-Y';

FIG. 49A is a plan view illustrating the method for producing the semiconductor device according to the present invention;

FIG. 49B is a cross-sectional view illustrating the method for producing the semiconductor device according to the present invention, which is taken along the line X-X';

FIG. 49C is a cross-sectional view illustrating the method for producing the semiconductor device according to the present invention, which is taken along the line Y-Y';

FIG. 50A is a plan view illustrating the method for producing the semiconductor device according to the present invention;

FIG. 50B is a cross-sectional view illustrating the method for producing the semiconductor device according to the present invention, which is taken along the line X-X';

FIG. 50C is a cross-sectional view illustrating the method for producing the semiconductor device according to the present invention, which is taken along the line Y-Y';

FIG. 51A is a plan view illustrating the method for producing the semiconductor device according to the present invention;

FIG. 51B is a cross-sectional view illustrating the method for producing the semiconductor device according to the present invention, which is taken along the line X-X';

FIG. 51C is a cross-sectional view illustrating the method for producing the semiconductor device according to the present invention, which is taken along the line Y-Y';

FIG. 52A is a plan view illustrating the method for producing the semiconductor device according to the present invention;

FIG. 52B is a cross-sectional view illustrating the method for producing the semiconductor device according to the present invention, which is taken along the line X-X';

FIG. 52C is a cross-sectional view illustrating the method for producing the semiconductor device according to the present invention, which is taken along the line Y-Y';

FIG. 53A is a plan view illustrating the method for producing the semiconductor device according to the present invention;

FIG. 53B is a cross-sectional view illustrating the method for producing the semiconductor device according to the present invention, which is taken along the line X-X';

FIG. 53C is a cross-sectional view illustrating the method for producing the semiconductor device according to the present invention, which is taken along the line Y-Y';

FIG. 54A is a plan view illustrating the method for producing the semiconductor device according to the present invention;

FIG. 54B is a cross-sectional view illustrating the method for producing the semiconductor device according to the present invention, which is taken along the line X-X';

FIG. 54C is a cross-sectional view illustrating the method for producing the semiconductor device according to the present invention, which is taken along the line Y-Y';

FIG. 55A is a plan view illustrating the method for producing the semiconductor device according to the present invention;

FIG. 55B is a cross-sectional view illustrating the method for producing the semiconductor device according to the present invention, which is taken along the line X-X';

FIG. 55C is a cross-sectional view illustrating the method for producing the semiconductor device according to the present invention, which is taken along the line Y-Y';

FIG. 56A is a plan view illustrating the method for producing the semiconductor device according to the present invention;

FIG. 56B is a cross-sectional view illustrating the method for producing the semiconductor device according to the present invention, which is taken along the line X-X';

FIG. 56C is a cross-sectional view illustrating the method for producing the semiconductor device according to the present invention, which is taken along the line Y-Y';

FIG. 57A is a plan view illustrating the method for producing the semiconductor device according to the present invention;

FIG. 57B is a cross-sectional view illustrating the method for producing the semiconductor device according to the present invention, which is taken along the line X-X';

FIG. 57C is a cross-sectional view illustrating the method for producing the semiconductor device according to the present invention, which is taken along the line Y-Y';

FIG. 58A is a plan view illustrating the method for producing the semiconductor device according to the present invention;

FIG. 58B is a cross-sectional view illustrating the method for producing the semiconductor device according to the present invention, which is taken along the line X-X';

FIG. 58C is a cross-sectional view illustrating the method for producing the semiconductor device according to the present invention, which is taken along the line Y-Y';

FIG. 59A is a plan view illustrating the method for producing the semiconductor device according to the present invention;

FIG. 59B is a cross-sectional view illustrating the method for producing the semiconductor device according to the present invention, which is taken along the line X-X';

FIG. 59C is a cross-sectional view illustrating the method for producing the semiconductor device according to the present invention, which is taken along the line Y-Y';

FIG. 60A is a plan view illustrating the method for producing the semiconductor device according to the present invention;

FIG. 60B is a cross-sectional view illustrating the method for producing the semiconductor device according to the present invention, which is taken along the line X-X';

FIG. 60C is a cross-sectional view illustrating the method for producing the semiconductor device according to the present invention, which is taken along the line Y-Y';

FIG. 61A is a plan view illustrating the method for producing the semiconductor device according to the present invention;

FIG. 61B is a cross-sectional view illustrating the method for producing the semiconductor device according to the present invention, which is taken along the line X-X';

FIG. 61C is a cross-sectional view illustrating the method for producing the semiconductor device according to the present invention, which is taken along the line Y-Y';

FIG. 62A is a plan view illustrating the method for producing the semiconductor device according to the present invention;

FIG. 62B is a cross-sectional view illustrating the method for producing the semiconductor device according to the present invention, which is taken along the line X-X';

FIG. 62C is a cross-sectional view illustrating the method for producing the semiconductor device according to the present invention, which is taken along the line Y-Y';

FIG. 63A is a plan view illustrating the method for producing the semiconductor device according to the present invention;

FIG. 63B is a cross-sectional view illustrating the method for producing the semiconductor device according to the present invention, which is taken along the line X-X';

FIG. 63C is a cross-sectional view illustrating the method for producing the semiconductor device according to the present invention, which is taken along the line Y-Y';

FIG. 64A is a plan view illustrating the method for producing the semiconductor device according to the present invention;

FIG. 64B is a cross-sectional view illustrating the method for producing the semiconductor device according to the present invention, which is taken along the line X-X';

FIG. 64C is a cross-sectional view illustrating the method for producing the semiconductor device according to the present invention, which is taken along the line Y-Y';

FIG. 65A is a plan view illustrating the method for producing the semiconductor device according to the present invention;

FIG. 65B is a cross-sectional view illustrating the method for producing the semiconductor device according to the present invention, which is taken along the line X-X';

FIG. 65C is a cross-sectional view illustrating the method for producing the semiconductor device according to the present invention, which is taken along the line Y-Y';

FIG. 66 is a diagram in which the semiconductor devices according to the present invention are arranged in two rows and two columns;

FIG. 67 is a diagram of a transistor layer of an apparatus in which the semiconductor devices according to the present invention are arranged in the two rows and the two columns;

FIG. 68 is a diagram of a contact layer and a first metal layer of the apparatus in which the semiconductor devices according to the present invention are arranged in the two rows and the two columns;

FIG. 69 is a diagram of first vias (contacts between first metals and second metals) and a second metal layer of the apparatus in which the semiconductor devices according to the present invention are arranged in the two rows and the two columns;

FIG. 70 is a diagram of second vias (contacts between the second metals and third metals) and a third metal layer of the apparatus in which the semiconductor devices according to the present invention are arranged in the two rows and the two columns;

FIG. 71 is a diagram of third vias (contacts between the third metals and fourth metals) and a fourth metal layer of the apparatus in which the semiconductor devices according to the present invention are arranged in the two rows and the two columns;

FIGS. 72A to 72C are diagrams in which views of the semiconductor device according to the present invention and an equivalent circuit corresponding to the views are illustrated; and FIG. 73 is a diagram in which a view of the semiconductor device according to the present invention and the equivalent circuit are illustrated in one-to-one manner.

DETAILED DESCRIPTION OF THE PREFERRED EMBODIMENTS

A planar structure and cross-sectional structures of a semiconductor device according to the present invention are illustrated in FIGS. 1A to 1C, respectively. FIG. 1A is a plan view, FIG. 1B is a cross-sectional view taken along the line X-X', and FIG. 1C is a cross-sectional view taken along the line Y-Y'. Furthermore, FIGS. 72A to 72C are diagrams in which views of the semiconductor device according to the present invention and an equivalent circuit corresponding to the views are illustrated. FIG. 73 is a diagram in which a view of the semiconductor device according to the present invention and the equivalent circuit are illustrated in one-to-one manner.

First Embodiment

In the present embodiment, a semiconductor device including a first inverter 501 arranged in a first row and a second column, a second inverter 502 arranged in a second row and a first column, a selection transistor 503 arranged in the first row and the first column, and a selection transistor 504 arranged in the second row and the second column is provided. The first inverter 501 includes the following: a first pillar that is formed by integrating, into one piece, a first p-type silicon region 137, a first n-type silicon region 104 whose polarity is different from the polarity of the first p-type silicon region 137, and a first insulating material 112 which is disposed between the first p-type silicon region 137 and the first n-type silicon region 104, and that vertically extends with respect to a substrate; a first n-type high-concentration silicon region 182 which is disposed on the first p-type silicon region 137 and whose polarity is different from the polarity of the first p-type silicon region 137; a second n-type high-concentration silicon region 141 which is disposed under the first p-type silicon region 137 and whose polarity is different from the polarity of the first p-type silicon region 137; a first p-type high-concentration silicon region 186 which is disposed on the first n-type silicon region 104 and whose polarity is different from the polarity of the first n-type silicon region 104; a second p-type high-concentration silicon region 143 which is disposed under the first n-type silicon region 104 and whose polarity is different from the polarity of the first n-type silicon region 104; a first gate insulating material 176 formed around the first pillar; and a first gate conductive material 167 formed around the first gate insulating material 176. The second inverter 502 includes the following: a second pillar that is formed by integrating, into one piece, a second p-type silicon region 138, a second n-type silicon region 105 whose polarity is different from the polarity of the second p-type silicon region 138, and a second insulating material 113 which is disposed between the second p-type silicon region 138 and the second n-type silicon region 105, and that vertically extends with respect to the substrate; a third n-type high-concentration silicon region 183 which is disposed on the second p-type silicon region 138 and whose polarity is different from the polarity of the second p-type silicon region 138; a fourth n-type high-concentration silicon region 140 which is disposed under the second p-type silicon region 138 and whose polarity is different from the polarity of the second p-type silicon region 138; a third p-type high-concentration silicon region 187 which is disposed on the second n-type silicon region 105 and whose polarity is different from the polarity of the second n-type silicon region 105; a fourth p-type high-concentration silicon region 144 which is disposed under the second n-type silicon region 105 and whose polarity is different from the polarity of the second n-type silicon region 105; a second gate insulating material 177 formed around the second pillar; a second gate conductive material 168 formed around the second gate insulating material 177. The selection transistor 503 includes the following: a third pillar that includes a third p-type silicon region 136; a fifth n-type high-concentration silicon region 181 which is disposed on the third p-type silicon region 136 and whose polarity is different from the polarity of the third p-type silicon region 136; a sixth n-type high-concentration silicon region 140 which is disposed under the third p-type silicon region 136 and whose polarity is different from the polarity of the third p-type silicon region 136; a third gate insulating material 175 formed around the third pillar; and a third gate conductive material 166 formed around the third gate insulating material 175. The selection transistor 504 includes the following: a fourth pillar that includes a fourth p-type silicon region 139; a seventh n-type high-concentration silicon region 184 which is disposed on the fourth p-type silicon region 139 and whose polarity is different from the polarity of the fourth p-type silicon region 139; an eighth n-type high-concentration silicon region 141 which is disposed under the fourth p-type silicon region 139 and whose polarity is different from the polarity of the fourth p-type silicon region 139; a fourth gate insulating material 178 formed around the fourth pillar; and a fourth gate conductive material 169 formed around the fourth gate insulating material 178. Note that, although the selection transistor 504 arranged in the second row and the second column is not described with reference to cross-sectional views, cross sections indicating the connection relationships between the selection transistor 504 arranged in the second row and the second column and the first inverter 501 and the second inverter 502 are easily understandable from FIGS. 1B and 1C. In other words, the cross section indicating the connection relationships between the selection transistor 504 arranged in the second row and the second column and the second inverter 502 is the same as a cross section that is obtained by disposing the first inverter 501 and the selection transistor 503 arranged in the first row and the first column, which are illustrated in FIG. 1B, so that the left and right positions of the first inverter 501 and the selection transistor 503 are swapped and by connecting the first inverter 501 and the selection transistor 503 to each other. Furthermore, the cross section indicating the connection relationships between the selection transistor 504 arranged in the second row and the second column and the first inverter 501 is the same as a cross section that is obtained by disposing the second inverter 502 and the selection transistor 503 arranged in the first row and the first column, which are illustrated in FIG. 1C, so that the upper and lower positions of the second inverter 502 and the selection transistor 503 are swapped and by connecting the second inverter 502 and the selection transistor 503 to each other. The second n-type high-concentration silicon region 141 and the second p-type high-concentration silicon region 143 of the first inverter 501 are connected to each other using a silicon-metal compound material 193. The silicon-metal compound material 193 is connected to the eighth n-type high-concentration silicon region 141. The eighth n-type high-concentration silicon region 141 is connected to a silicon-metal compound material 196. The fourth n-type high-concentration silicon region 140 and the fourth p-type high-concentration silicon region 144 of the second inverter 502 are connected to each other using a silicon-metal compound material 192. The silicon-metal compound material 192 is connected to the sixth n-type high-concentration silicon region 140. The sixth n-type high-concentration silicon region 140 is connected to a silicon-metal compound material 189. The first gate conductive material 167 of the first inverter 501 is connected to the silicon-metal compound material 189 via a contact 202. The second gate conductive material 168 of the second inverter 502 is connected to the silicon-metal compound material 196 via a contact 203.

Furthermore, the second p-type high-concentration silicon region 143, the second n-type high-concentration silicon region 141, and the eighth n-type high-concentration silicon region 141 are connected to one another. The eighth n-type high-concentration silicon region 141 and the second gate conductive material 168 are connected to each other. The fourth p-type high-concentration silicon region 144, the fourth n-type high-concentration silicon region 140, and the sixth n-type high-concentration silicon region 140 are connected to one another. The sixth n-type high-concentration silicon region 140 and the first gate conductive material 167 are connected to each other.

Hereinafter, an example of a production process for forming a structure of the semiconductor device according to the present invention will be described with reference to FIGS. 2A to 65C. Note that, in the drawings, the same elements are denoted by the same reference numerals. FIGS. 2A to 65C illustrate an example of production of the semiconductor device according to the present invention. FIGS. 2A to 65A are plan views, FIGS. 2B to 65B are cross-sectional views taken along the line X-X', and FIGS. 2C to 65C are cross-sectional views taken along the line Y-Y'.

Referring to FIGS. 2A to 2C, a resist 103 for forming n-type silicon regions is formed on a p-type silicon region 102 that is formed on an oxide film 101.

Referring to FIGS. 3A to 3C, impurities are implanted to form the first n-type silicon region 104 and a second n-type silicon region 105.

Referring to FIGS. 4A to 4C, the resist 103 is removed.

Referring to FIGS. 5A to 5C, an oxide film 106 and a nitride film 107 are stacked.

Figure 6C:
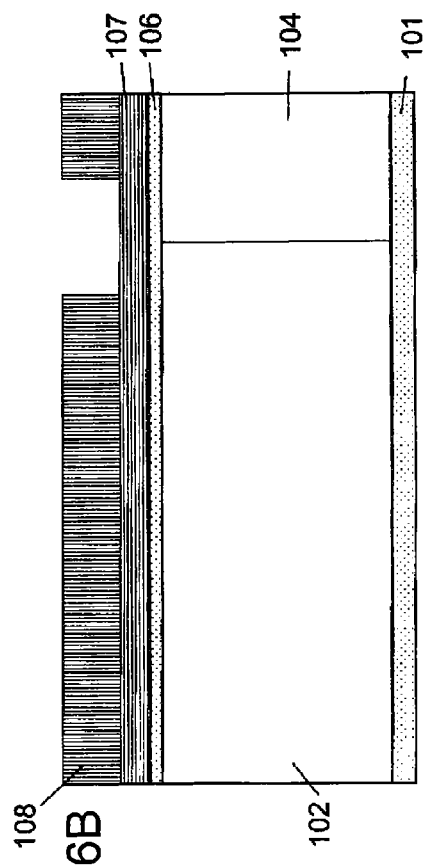
FIG. 6C is a cross-sectional view illustrating the method for producing the semiconductor device according to the present invention, which is taken along the line Y-Y'.
Figure 6A:
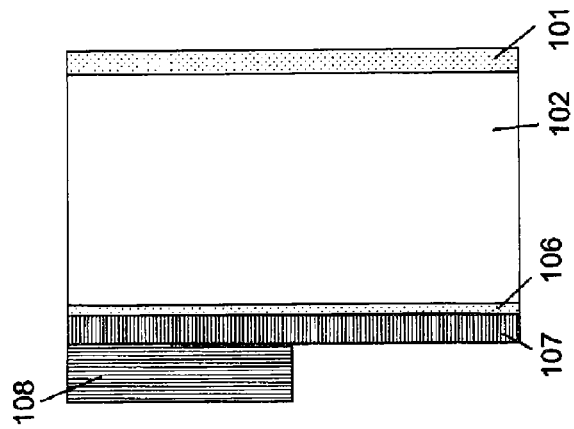
FIG. 6A is a plan view illustrating the method for producing the semiconductor device according to the present invention.
Figure 6B:
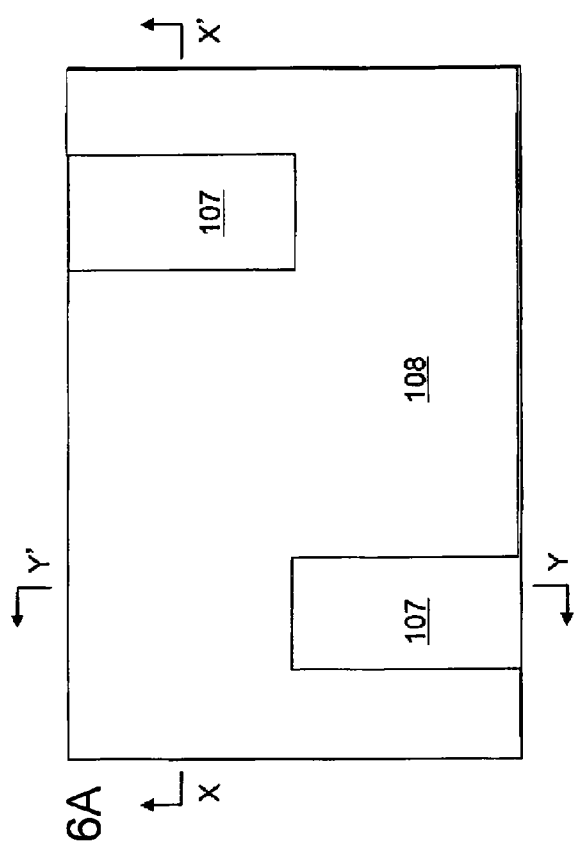
FIG. 6B is a cross-sectional view illustrating the method for producing the semiconductor device according to the present invention, which is taken along the line X-X'.

Referring to FIGS. 6A to 6C, a resist 108 for etching a nitride film is formed.

Referring to FIGS. 7A to 7C, the nitride film 107 is etched, and the oxide film 106 is etched.

Figure 8A:
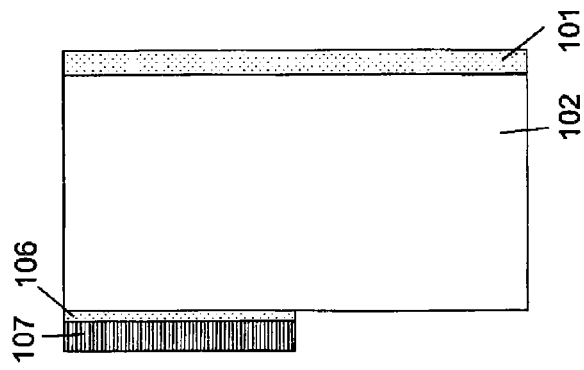
FIG. 8A is a plan view illustrating the method for producing the semiconductor device according to the present invention.
Figure 8B:
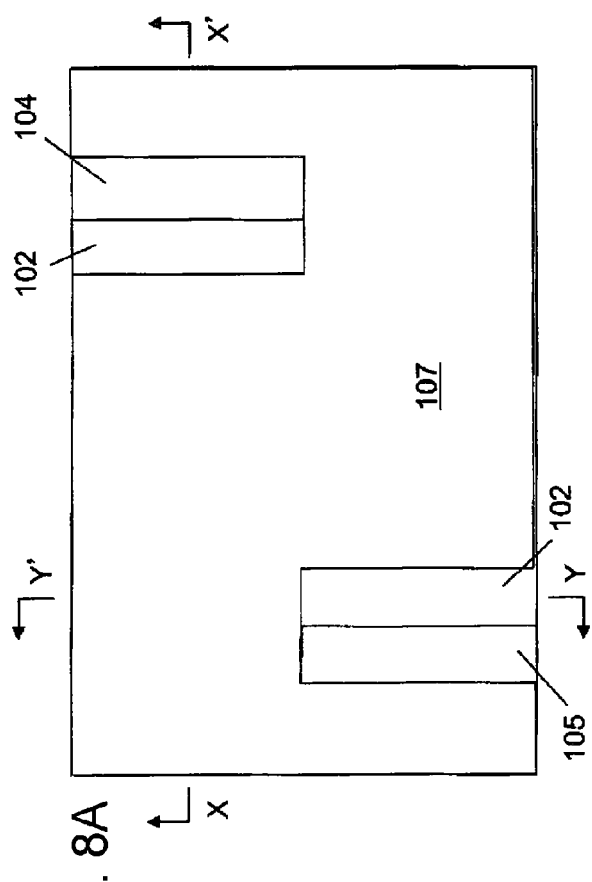
FIG. 8B is a cross-sectional view illustrating the method for producing the semiconductor device according to the present invention, which is taken along the line X-X'.
Figure 8C:
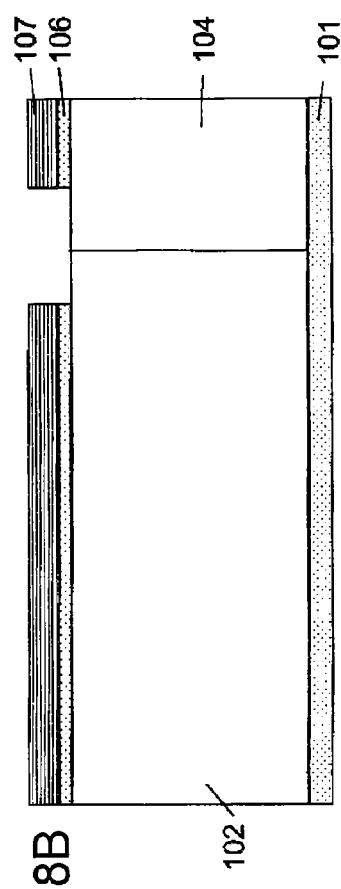
FIG. 8C is a cross-sectional view illustrating the method for producing the semiconductor device according to the present invention, which is taken along the line Y-Y'.

Referring to FIGS. 8A to 8C, the resist 108 is removed.

Referring to FIGS. 9A to 9C, a nitride film 109 is stacked.

Referring to FIGS. 10A to 10C, etching-back of the nitride film 109 is performed to form nitride-film sidewalls 110 and 111.

Figure 11C:
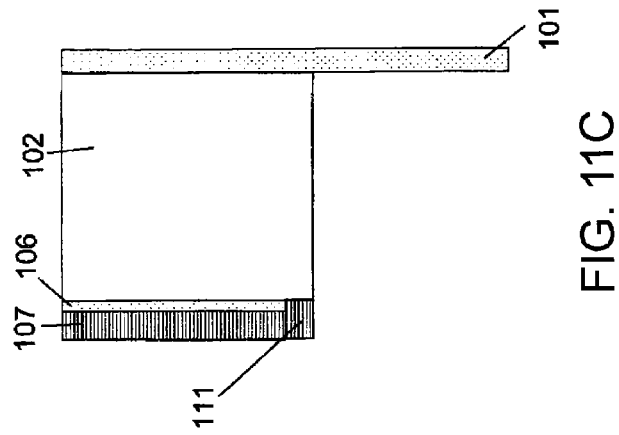
FIG. 11C is a cross-sectional view illustrating the method for producing the semiconductor device according to the present invention, which is taken along the line Y-Y'.
Figure 11A:
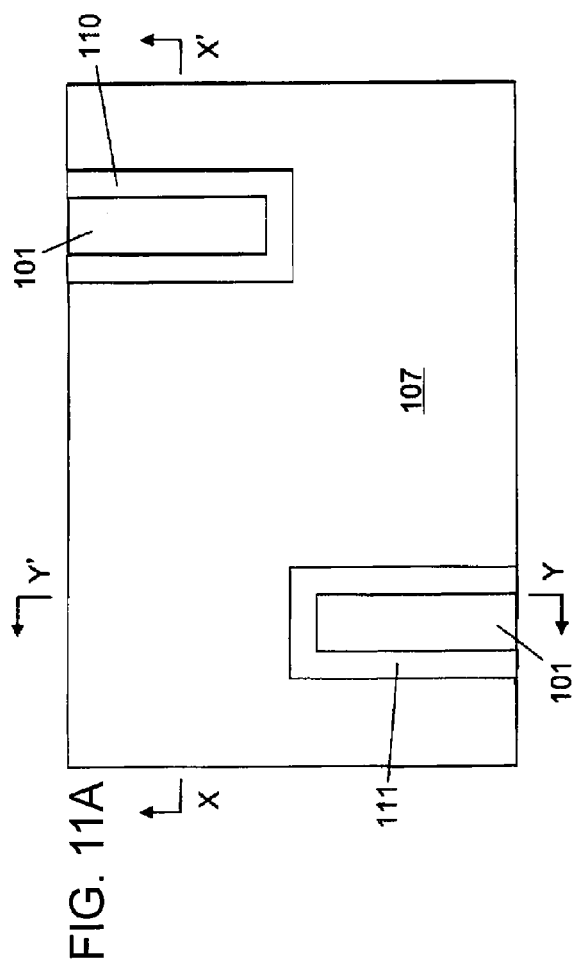
FIG. 11A is a plan view illustrating the method for producing the semiconductor device according to the present invention.
Figure 11B:
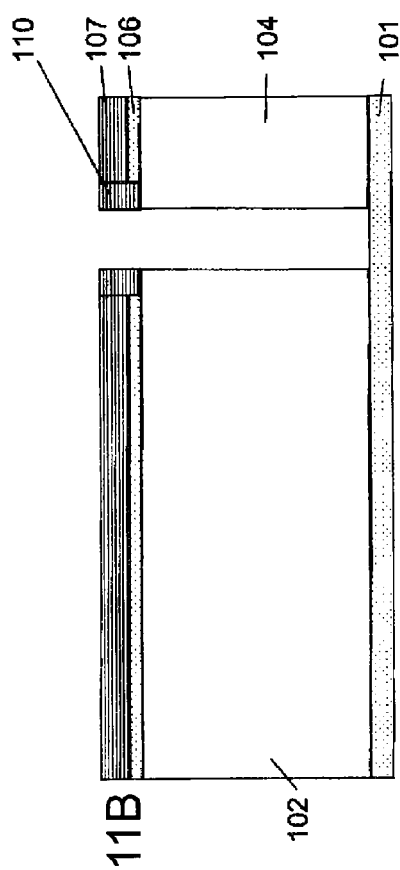
FIG. 11B is a cross-sectional view illustrating the method for producing the semiconductor device according to the present invention, which is taken along the line X-X'.

Referring to FIGS. 11A to 11C, the p-type silicon region 102, the first n-type silicon region 104, and the second n-type silicon region 105 are etched.

Figure 12C:
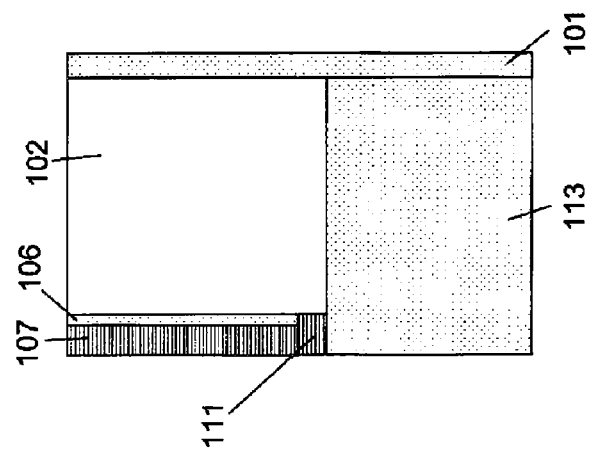
FIG. 12C is a cross-sectional view illustrating the method for producing the semiconductor device according to the present invention, which is taken along the line Y-Y'.
Figure 12A:
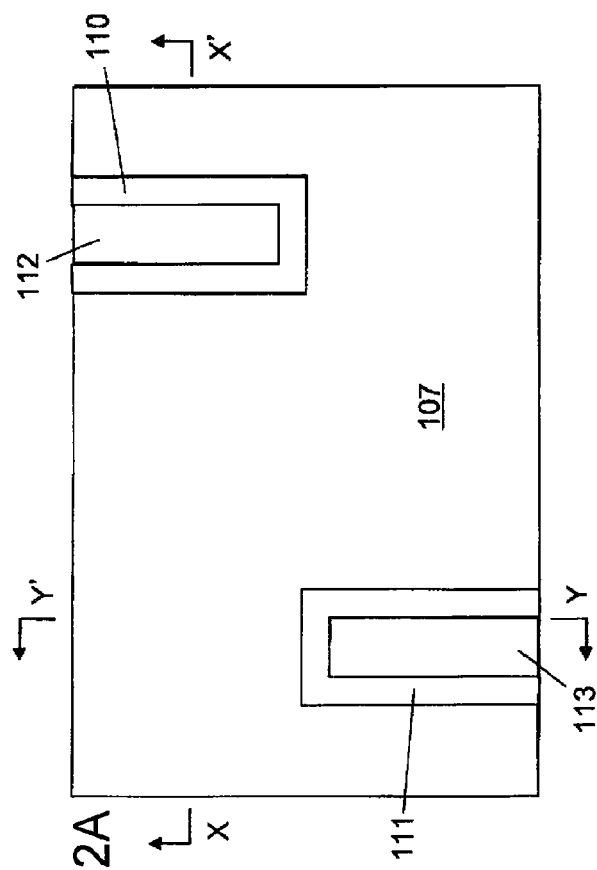
FIG. 12A is a plan view illustrating the method for producing the semiconductor device according to the present invention.
Figure 12B:
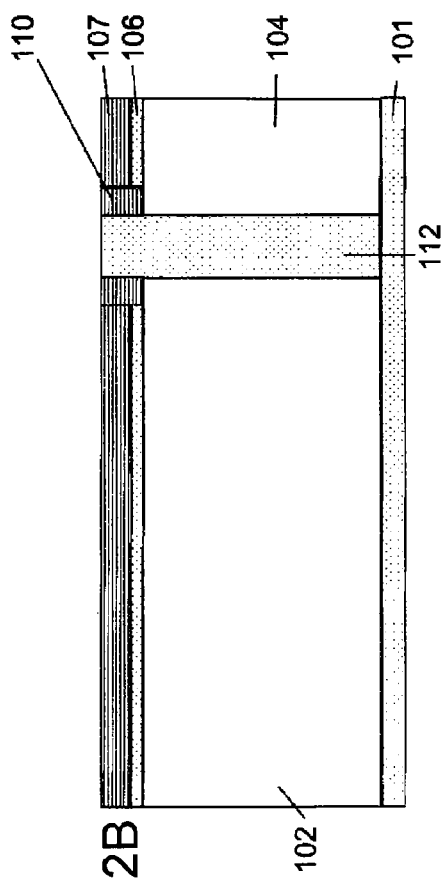
FIG. 12B is a cross-sectional view illustrating the method for producing the semiconductor device according to the present invention, which is taken along the line X-X'.

Referring to FIGS. 12A to 12C, insulating films are stacked and planarized to form the first insulating material 112 and the second insulating material 113.

Referring to FIGS. 13A to 13C, a nitride film 114 is stacked.

Referring to FIGS. 14A to 14C, resists 115 to 118 for forming pillars are formed.

Referring to FIGS. 15A to 15C, the nitride films 114 and 107 are etched to form nitride-film hard masks 119 to 122.

Referring to FIGS. 16A to 16C, the oxide film 106 is etched to form oxide films 123 and 124.

Referring to FIGS. 17A to 17C, the resists 115 to 118 are removed.

Referring to FIGS. 18A to 18C, the p-type silicon region 102, the first n-type silicon region 104, and the second n-type silicon region 105 are etched to form pillars.

Referring to FIGS. 19A to 19C, an oxide film 125 is stacked.

Referring to FIGS. 20A to 20C, the oxide film 125 is etched and caused to remain so as to have a sidewall shape, so that oxide-film sidewalls 126 to 129 are formed.

Referring to FIGS. 21A to 21C, resists 130 and 131 for isolating elements from each other are formed.

Referring to FIGS. 22A to 22C, the p-type silicon region 102, the first n-type silicon region 104, and the second n-type silicon region 105 are etched to isolate elements from each other, so that p-type silicon regions 132 and 133 are formed.

Referring to FIGS. 23A to 23C, the resists 130 and 131 are removed.

Figure 24C:
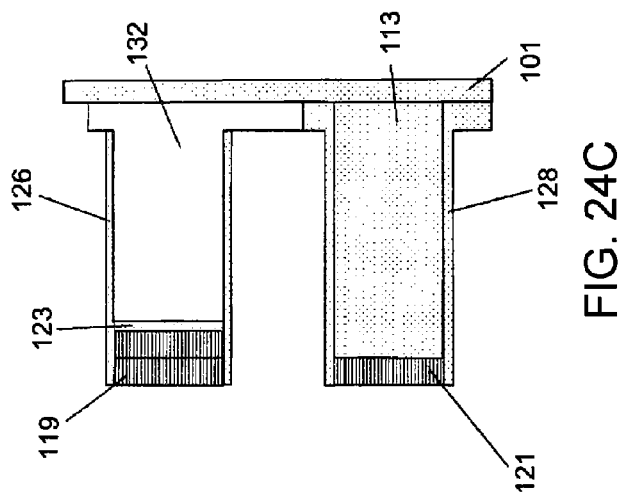
FIG. 24C is a cross-sectional view illustrating the method for producing the semiconductor device according to the present invention, which is taken along the line Y-Y'.
Figure 24A:
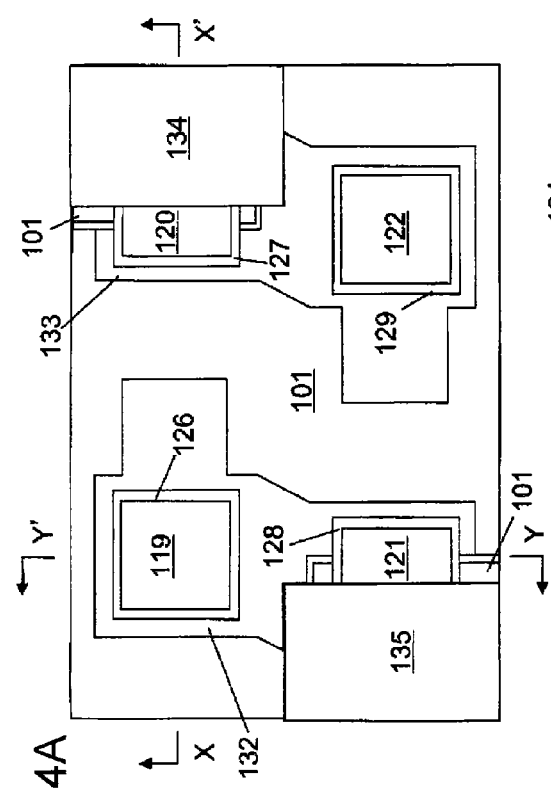
FIG. 24A is a plan view illustrating the method for producing the semiconductor device according to the present invention.
Figure 24B:
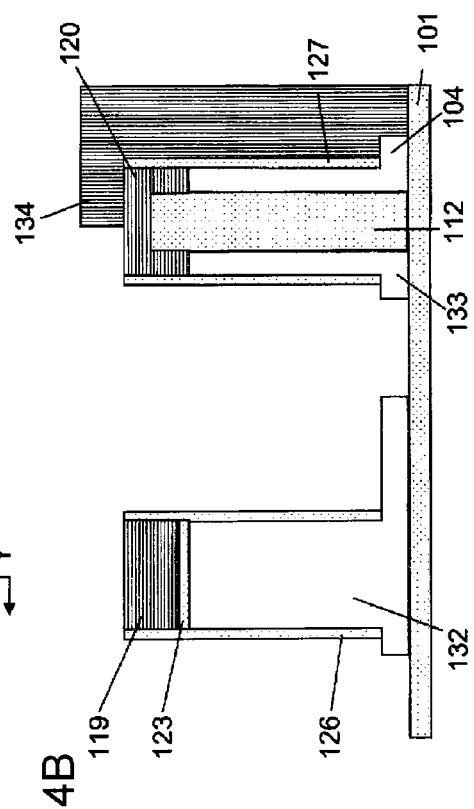
FIG. 24B is a cross-sectional view illustrating the method for producing the semiconductor device according to the present invention, which is taken along the line X-X'.

Referring to FIGS. 24A to 24C, resists 134 and 135 for implanting impurities are formed.

Referring to FIGS. 25A to 25C, impurities are implanted to form the fourth and sixth n-type high-concentration silicon regions 140 and the second and eighth n-type high-concentration silicon regions 141. The third p-type silicon region 136, the first p-type silicon region 137, the second p-type silicon region 138, and the fourth p-type silicon region 139 are formed.

Referring to FIGS. 26A to 26C, the resists 134 and 135 are removed.

Figure 27A:
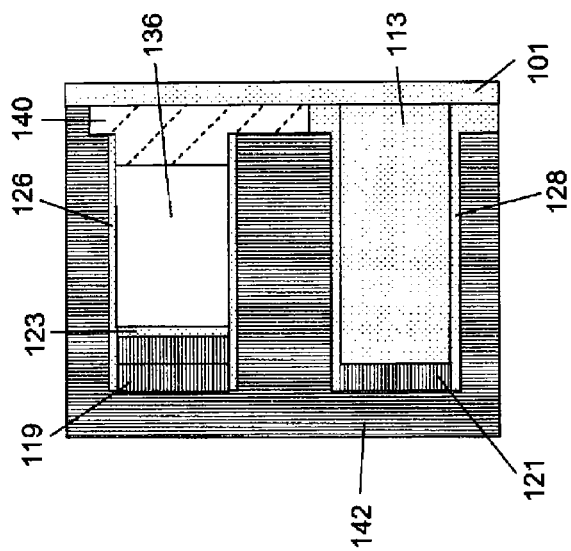
FIG. 27A is a plan view illustrating the method for producing the semiconductor device according to the present invention.
Figure 27B:
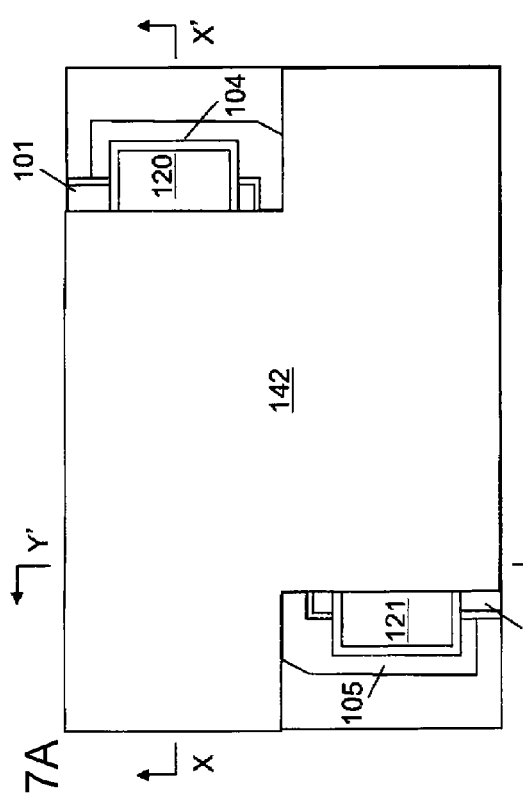
FIG. 27B is a cross-sectional view illustrating the method for producing the semiconductor device according to the present invention, which is taken along the line X-X'.
Figure 27C:
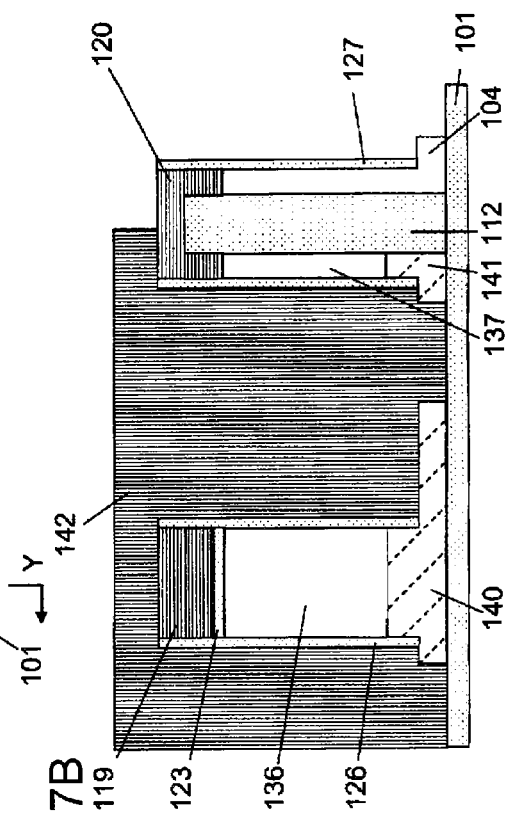
FIG. 27C is a cross-sectional view illustrating the method for producing the semiconductor device according to the present invention, which is taken along the line Y-Y'.

Referring to FIGS. 27A to 27C, a resist 142 for implanting impurities is formed.

Referring to FIGS. 28A to 28C, impurities are implanted to form the second p-type high-concentration silicon region 143 and the fourth p-type high-concentration silicon region 144.

Figure 29A:
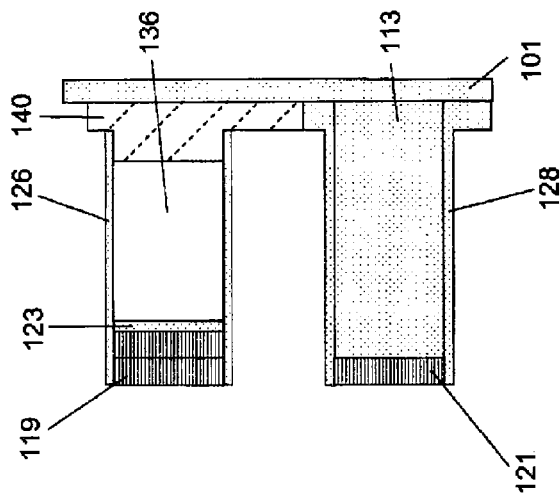
FIG. 29A is a plan view illustrating the method for producing the semiconductor device according to the present invention.
Figure 29B:
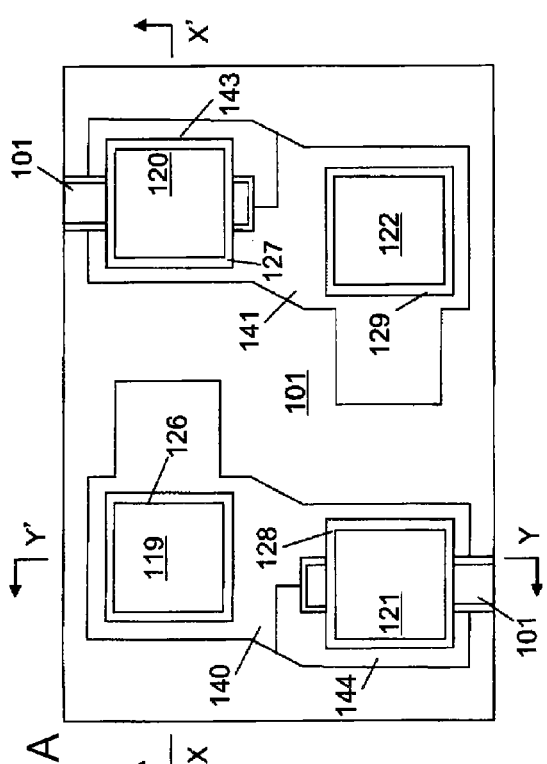
FIG. 29B is a cross-sectional view illustrating the method for producing the semiconductor device according to the present invention, which is taken along the line X-X'.
Figure 29C:
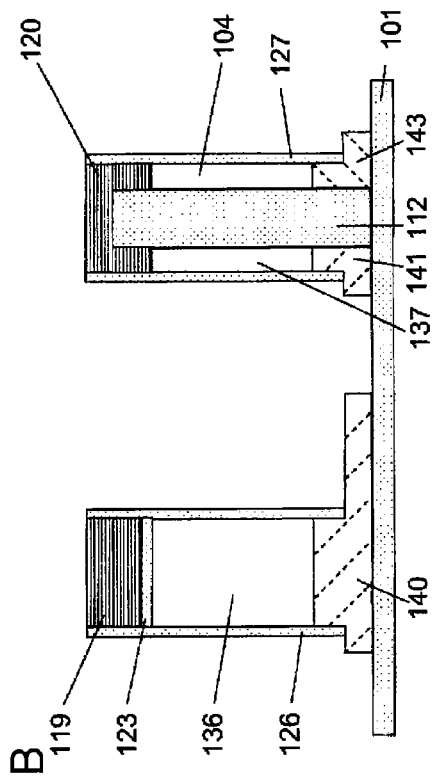
FIG. 29C is a cross-sectional view illustrating the method for producing the semiconductor device according to the present invention, which is taken along the line Y-Y'.

Referring to FIGS. 29A to 29C, the resist 142 is removed.

Figure 30C:
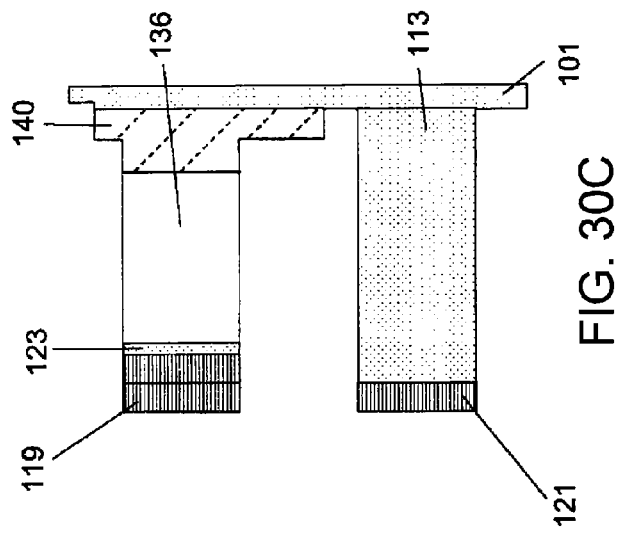
FIG. 30C is a cross-sectional view illustrating the method for producing the semiconductor device according to the present invention, which is taken along the line Y-Y'.
Figure 30A:
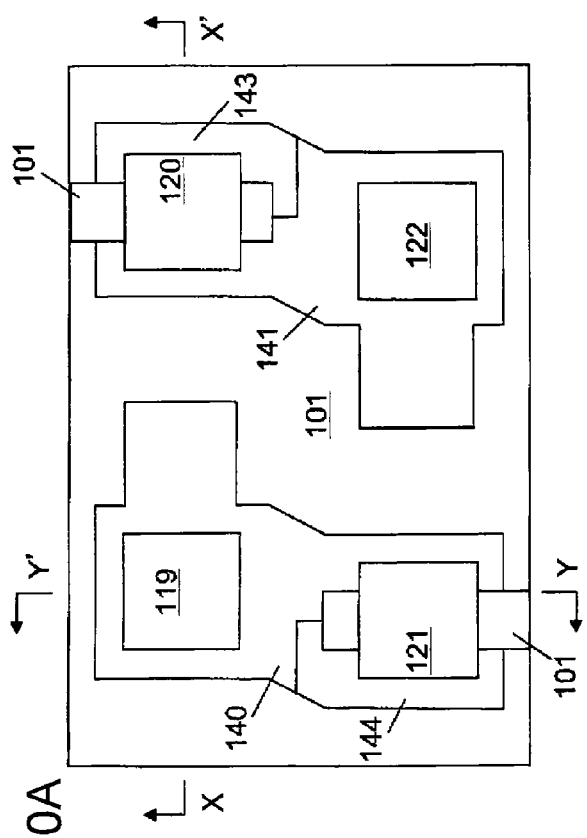
FIG. 30A is a plan view illustrating the method for producing the semiconductor device according to the present invention.
Figure 30B:
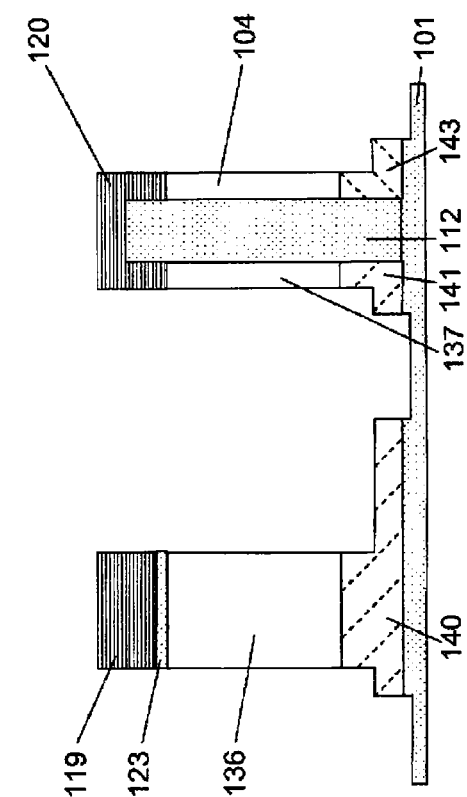
FIG. 30B is a cross-sectional view illustrating the method for producing the semiconductor device according to the present invention, which is taken along the line X-X'.

Referring to FIGS. 30A to 30C, the oxide-film sidewalls 126 to 129 are etched.

Figure 31A:
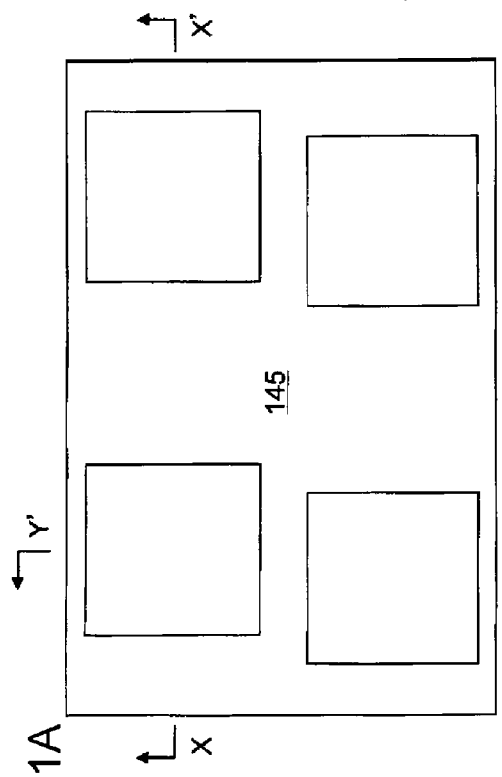
FIG. 31A is a plan view illustrating the method for producing the semiconductor device according to the present invention.
Figure 31C:
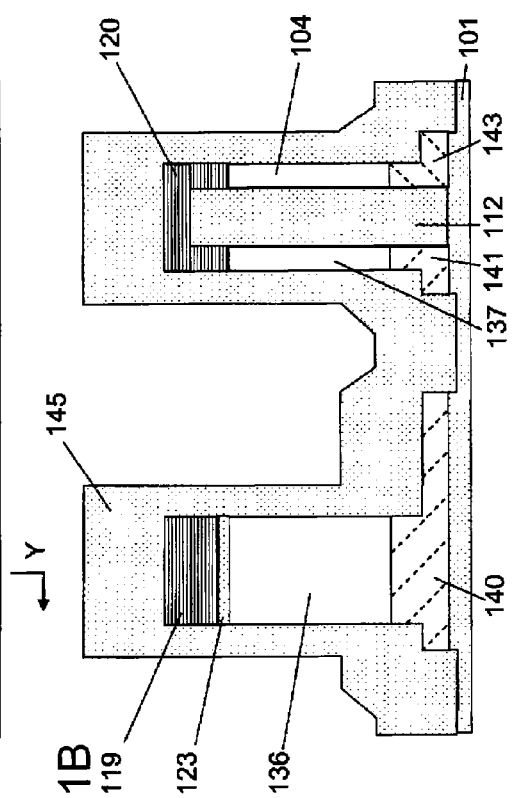
FIG. 31C is a cross-sectional view illustrating the method for producing the semiconductor device according to the present invention, which is taken along the line Y-Y'.
Figure 31B:
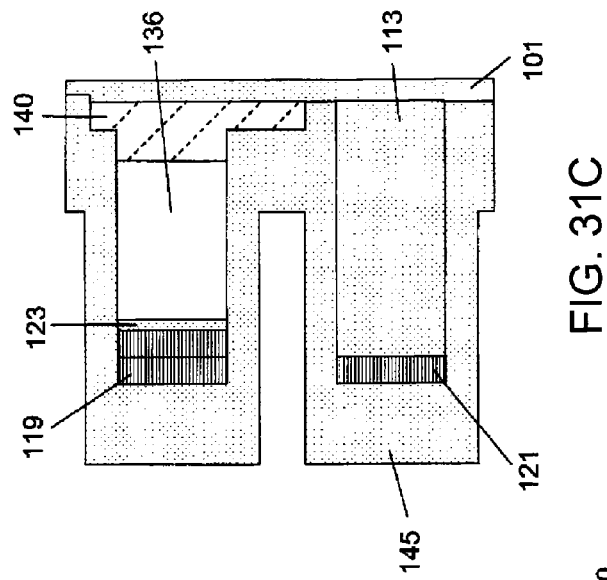
FIG. 31B is a cross-sectional view illustrating the method for producing the semiconductor device according to the present invention, which is taken along the line X-X'.

Referring to FIGS. 31A to 31C, an oxide film 145 is stacked.

Referring to FIGS. 32A to 32C, etching-back of the oxide film 145 is performed. In this case, oxide films 146 to 149 also remain on the nitride-film hard masks 119 to 122.

Referring to FIGS. 33A to 33C, a high dielectric film 150, which is a gate insulating film, and a metallic material 151, which is a gate conductive material, are stacked and planarized. When the planarization is performed, the oxide films 146 to 149 are etched.

Referring to FIGS. 34A to 34C, etching-back of the metallic material 151 is performed.

Referring to FIGS. 35A to 35C, an oxide film 152 is stacked and planarized.

Referring to FIGS. 36A to 36C, etching-back of the oxide film 152 is performed.

Referring to FIGS. 37A to 37C, a nitride film 153 is stacked.

Referring to FIGS. 38A to 38C, the nitride film 153 is etched and caused to remain so as to have a sidewall shape, so that nitride-film sidewalls 154 to 157 are formed.

Referring to FIGS. 39A to 39C, resists 158 to 161 for forming gate conductive materials are formed.

Referring to FIGS. 40A to 40C, the oxide film 152 is etched to form oxide films 162 to 165.

Referring to FIGS. 41A to 41C, the metallic material 151 is etched to form the third gate conductive material 166, the first gate conductive material 167, the second gate conductive material 168, and the fourth gate conductive material 169.

Referring to FIGS. 42A to 42C, the resists 158 to 161 are removed.

Figure 43A:
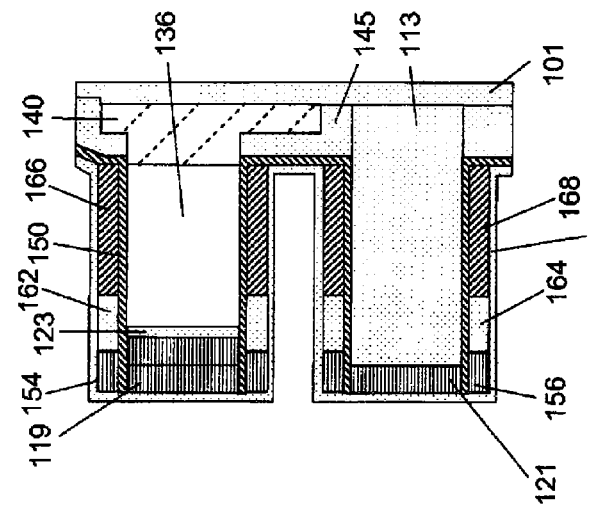
Figure 43B:
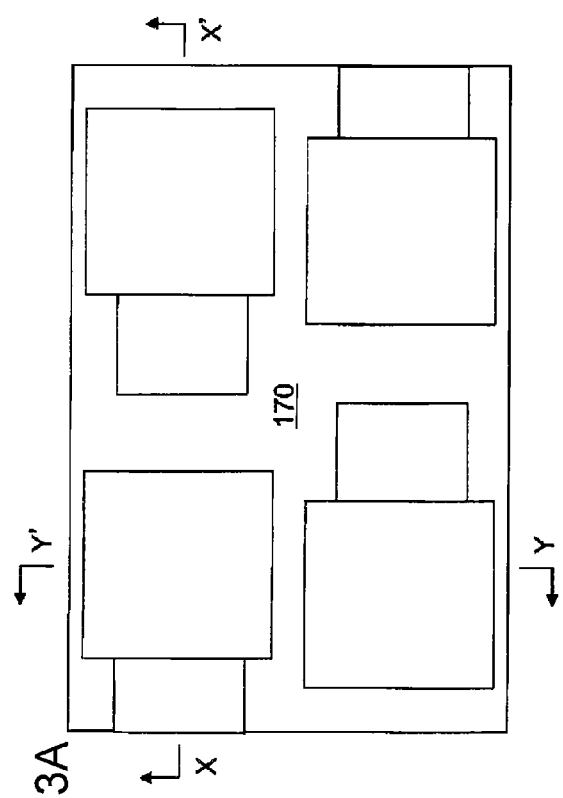
Figure 43C:
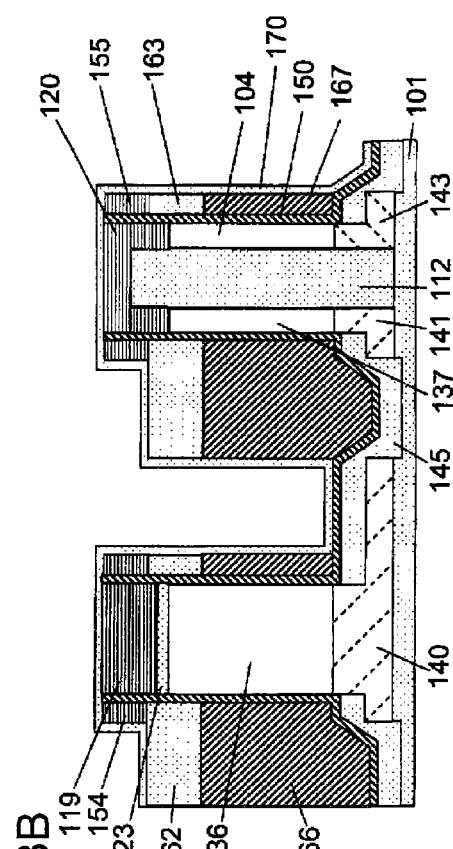

Referring to FIGS. 43A to 43C, an oxide film 170 is stacked.

Referring to FIGS. 44A to 44C, the oxide film 170 is etched and caused to remain so as to have a sidewall shape, so that oxide-film sidewalls 171 to 174 are formed.

Referring to FIGS. 45A to 45C, the high dielectric film 150 is etched to form the third gate insulating material 175, the first gate insulating material 176, the second gate insulating material 177, and the fourth gate insulating material 178.

Referring to FIGS. 46A to 46C, the nitride-film sidewalls 154 to 157 and the nitride-film hard masks 119 to 122 are etched.

Referring to FIGS. 47A to 47C, the third gate insulating material 175, the first gate insulating material 176, the second gate insulating material 177, and the fourth gate insulating material 178 that are formed using a high dielectric film are etched.

Referring to FIGS. 48A to 48C, the oxide film 145 is etched to expose the fourth n-type high-concentration silicon region 140, the second n-type high-concentration silicon region 141, the fourth p-type high-concentration silicon region 144, and the second p-type high-concentration silicon region 143.

Referring to FIGS. 49A to 49C, resists 179 and 180 for implanting impurities are formed.

Referring to FIGS. 50A to 50C, impurities are implanted to form the fifth n-type high-concentration silicon region 181, the first n-type high-concentration silicon region 182, the third n-type high-concentration silicon region 183, and the seventh n-type high-concentration silicon region 184.

Referring to FIGS. 51A to 51C, the resists 179 and 180 are removed.

Referring to FIGS. 52A to 52C, a resist 185 for implanting impurities is formed.

Referring to FIGS. 53A to 53C, impurities are implanted to form the first p-type high-concentration silicon region 186 and the third p-type high-concentration silicon region 187.

Referring to FIGS. 54A to 54C, the resist 185 is removed.

Referring to FIGS. 55A to 55C, silicon-metal compound materials 188 to 197 are formed.

Referring to FIGS. 56A to 56C, a nitride film 198 is stacked, and an oxide film 199 is stacked and planarized.

Referring to FIGS. 57A to 57C, contact holes 200 and 201 are formed.

Referring to FIGS. 58A to 58C, the contacts 202 and 203 are formed.

Referring to FIGS. 59A to 59C, an oxide film 204 is stacked and planarized.

Referring to FIGS. 60A to 60C, contact holes 205 and 206 are formed.

Referring to FIGS. 61A to 61C, contact holes 207 to 210 are formed.

Referring to FIGS. 62A to 62C, contact holes 211 and 212 are formed.

Referring to FIGS. 63A to 63C, the nitride film 198 is etched, and the oxide film 204 is etched.

Referring to FIGS. 64A to 64C, contacts 213 to 220 are formed.

Referring to FIGS. 65A to 65C, first metals 221 to 228 are formed. In the above manner, an SRAM memory cell is formed.

Hereinafter, an example of an apparatus in which the semiconductor devices according to the present invention are arranged in two rows and two columns will be described with reference to FIGS. 66 to 71. Note that, in the drawings, the same elements are denoted by the same reference numerals. FIG. 66 illustrates an apparatus in which the semiconductor devices according to the present invention are arranged in two rows and two columns. FIG. 67 illustrates a transistor layer. FIG. 68 illustrates a contact layer and a first metal layer. FIG. 69 illustrates first vias (contacts between first metals and second metals) and a second metal layer. FIG. 70 illustrates second vias (contacts between the second metals and third metals) and a third metal layer. FIG. 71 illustrates third vias (contacts between the third metals and fourth metals) and a fourth metal layer.

A selection transistor 301 is arranged in the first row and the first column. An inverter 302 is arranged in the first row and the second column. An inverter 305 is arranged in the second row and the first column. A selection transistor 306 is arranged in the second row and the second column. The inverter 305 and the selection transistor 301 are connected to each other using an output terminal 331. The inverter 302 and the selection transistor 306 are connected to each other using an output terminal 333. An input terminal 321 of the inverter 305 is connected to the output terminal 333 via a contact 341. An input terminal 318 of the inverter 302 is connected to the output terminal 331 via a contact 339. A selection transistor 304 is arranged in the first row and the fourth column. An inverter 303 is arranged in the first row and the third column. An inverter 308 is arranged in the second row and the fourth column. A selection transistor 307 is arranged in the second row and the third column. The inverter 303 and the selection transistor 307 are connected to each other using an output terminal 334. The inverter 308 and the selection transistor 304 are connected to each other using an output terminal 332. An input terminal 319 of the inverter 303 is connected to the output terminal 332 via a contact 340. An input terminal 323 of the inverter 308 is connected to the output terminal 334 via a contact 342. The selection transistor 301 includes a gate conductive material 317. The selection transistor 306 and the selection transistor 307 include a gate conductive material 322. The selection transistor 304 includes a gate conductive material 320. A selection transistor 310 is arranged in the third row and the second column. An inverter 309 is arranged in the third row and the first column. An inverter 314 is arranged in the fourth row and the second column. A selection transistor 313 is arranged in the fourth row and the first column. The inverter 309 and the selection transistor 313 are connected to each other using an output terminal 337. The inverter 314 and the selection transistor 310 are connected to each other using an output terminal 335. An input terminal 324 of the inverter 309 is connected to the output terminal 335 via a contact 343. An input terminal 328 of the inverter 314 is connected to the output terminal 337 via a contact 345. A selection transistor 311 is arranged in the third row and the third column. An inverter 312 is arranged in the third row and the fourth column. An inverter 315 is arranged in the fourth row and the third column. A selection transistor 316 is arranged in the fourth row and the fourth column. The inverter 315 and the selection transistor 311 are connected to each other using an output terminal 336. The inverter 312 and the selection transistor 316 are connected to each other using an output terminal 338. An input terminal 329 of the inverter 315 is connected to the output terminal 338 via a contact 346. An input terminal 326 of the inverter 312 is connected to the output terminal 336 via a contact 344. The selection transistor 313 includes a gate conductive material 327. The selection transistor 310 and the selection transistor 311 include a gate conductive material 325. The selection transistor 316 includes a gate conductive material 330.

A contact 349 is disposed on an nMOS transistor of the inverter 302. A contact 350 is disposed on a pMOS transistor of the inverter 302. A contact 357 is disposed on the selection transistor 306. A contact 356 is disposed on an nMOS transistor of the inverter 305. A contact 355 is disposed on a pMOS transistor of the inverter 305. A contact 348 is disposed on the selection transistor 301. A contact 352 is disposed on an nMOS transistor of the inverter 303. A contact 351 is disposed on a pMOS transistor of the inverter 303. A contact 359 is disposed on the selection transistor 307. A contact 360 is disposed on an nMOS transistor of the inverter 308. A contact 361 is disposed on a pMOS transistor of the inverter 308. A contact 353 is disposed on the selection transistor 304. A contact 347 is disposed on the gate conductive material 317. A contact 358 is disposed on the gate conductive material 322. A contact 354 is disposed on the gate conductive material 320. A contact 363 is disposed on an nMOS transistor of the inverter 309. A contact 362 is disposed on a pMOS transistor of the inverter 309. A contact 370 is disposed on the selection transistor 313. A contact 371 is disposed on an nMOS transistor of the inverter 314. A contact 372 is disposed on a pMOS transistor of the inverter 314. A contact 364 is disposed on the selection transistor 310. A contact 374 is disposed on an nMOS transistor of the inverter 315. A contact 373 is disposed on a pMOS transistor of the inverter 315. A contact 366 is disposed on the selection transistor 311. A contact 367 is disposed on an nMOS transistor of the inverter 312. A contact 368 is disposed on a pMOS transistor of the inverter 312. A contact 375 is disposed on the selection transistor 316. A contact 369 is disposed on the gate conductive material 327. A contact 365 is disposed on the gate conductive material 325. A contact 376 is disposed on the gate conductive material 330. A first metal 377 is connected to the contact 347. A first metal 378 is connected to the contact 348. A first metal 379 is connected to the contact 349. A first metal 380 is connected to the contacts 350 and 351. A first metal 381 is connected to the contact 352. A first metal 382 is connected to the contact 353. A first metal 383 is connected to the contact 354. A first metal 384 is connected to the contacts 355 and 362. A first metal 385 is connected to the contacts 356 and 363. A first metal 386 is connected to the contacts 357 and 364. A first metal 387 is connected to the contact 358. A first metal 388 is connected to the contact 365. A first metal 389 is connected to the contacts 359 and 366. A first metal 390 is connected to the contacts 360 and 367. A first metal 391 is connected to the contacts 361 and 368. A first metal 392 is connected to the contact 369. A first metal 393 is connected to the contact 370. A first metal 394 is connected to the contact 371. A first metal 395 is connected to the contacts 372 and 373. A first metal 396 is connected to the contact 374. A first metal 397 is connected to the contact 375. A first metal 398 is connected to the contact 376.

A first via 399 is disposed on the first metal 378. A first via 400 is disposed on the first metal 379. A first via 401 is disposed on the first metal 380. A first via 402 is disposed on the first metal 381. A first via 403 is disposed on the first metal 382. A first via 404 is disposed on the first metal 377. A first via 405 is disposed on the first metal 383. A first via 406 is disposed on the first metal 387. A first via 407 is disposed on the first metal 384. A first via 408 is disposed on the first metal 385. A first via 409 is disposed on the first metal 386. A first via 410 is disposed on the first metal 389. A first via 411 is disposed on the first metal 390. A first via 412 is disposed on the first metal 391. A first via 413 is disposed on the first metal 388. A first via 414 is disposed on the first metal 392. A first via 415 is disposed on the first metal 398. A first via 416 is disposed on the first metal 393. A first via 417 is disposed on the first metal 394. A first via 418 is disposed on the first metal 395. A first via 419 is disposed on the first metal 396. A first via 420 is disposed on the first metal 397. A second metal 421 is connected to the first via 399. A second metal 422 is connected to the first via 400. A second metal 423 is connected to the first via 401. A second metal 424 is connected to the first via 402. A second metal 425 is connected to the first via 403. A second metal 426 is connected to the first vias 404 to 406. A second metal 427 is connected to the first via 407. A second metal 428 is connected to the first via 408. A second metal 429 is connected to the first via 409. A second metal 430 is connected to the first via 410. A second metal 431 is connected to the first via 411. A second metal 432 is connected to the first via 412. A second metal 433 is connected to the first vias 413 to 415. A second metal 434 is connected to the first via 416. A second metal 435 is connected to the first via 417. A second metal 436 is connected to the first via 418. A second metal 437 is connected to the first via 419. A second metal 438 is connected to the first via 420.

A second via 439 is disposed on the second metal 421. A second via 440 is disposed on the second metal 422. A second via 441 is disposed on the second metal 423. A second via 442 is disposed on the second metal 424. A second via 443 is disposed on the second metal 425. A second via 444 is disposed on the second metal 427. A second via 445 is disposed on the second metal 428. A second via 446 is disposed on the second metal 429. A second via 447 is disposed on the second metal 430. A second via 448 is disposed on the second metal 431. A second via 449 is disposed on the second metal 432. A second via 450 is disposed on the second metal 434. A second via 451 is disposed on the second metal 435. A second via 452 is disposed on the second metal 436. A second via 453 is disposed on the second metal 437. A second via 454 is disposed on the second metal 438. A third metal 455 is connected to the second via 439. A third metal 458 is connected to the second vias 440, 442, 445, and 448. A third metal 456 is connected to the second via 441. A third metal 457 is connected to the second via 443. A third metal 461 is connected to the second vias 444, 449, and 452. A third metal 459 is connected to the second via 446. A third metal 460 is connected to the second via 447. A third metal 462 is connected to the second via 450. A third metal 463 is connected to the second via 451. A third metal 464 is connected to the second via 453. A third metal 465 is connected to the second via 454.

A third via 466 is disposed on the third metal 455. A third via 468 is disposed on the third metal 459. A third via 469 is disposed on the third metal 460. A third via 467 is disposed on the third metal 457. A third via 470 is disposed on the third metal 462. A third via 471 is disposed on the third metal 465. A fourth metal 472 is connected to the third vias 466 and 470. A fourth metal 473 is connected to the third via 468. A fourth metal 474 is connected to the third via 469. A fourth metal 475 is connected to the third vias 467 and 471.

What is claimed is:
1. A semiconductor device comprising:
two inverters; and
two selection transistors,
the two inverters and the two selection transistors being arranged in a matrix form on a substrate,
one of the two inverters being a first inverter arranged in a first row and a second column,
the first inverter including
a first pillar that is formed by integrating, into one piece, a first first-conductivity-type semiconductor, a first second-conductivity-type semiconductor whose polarity is different from a polarity of the first first-conductivity-type semiconductor, and a first insulating material which is disposed between the first first-conductivity-type semiconductor and the first second-conductivity-type semiconductor, and that vertically extends with respect to the substrate,
a first second-conductivity-type high-concentration semiconductor which is disposed on the first first-conductivity-type semiconductor and whose polarity is different from the polarity of the first first-conductivity-type semiconductor,
a second second-conductivity-type high-concentration semiconductor which is disposed under the first first- conductivity-type semiconductor and whose polarity is different from the polarity of the first first-conductivity-type semiconductor,
a first first-conductivity-type high-concentration semiconductor which is disposed on the first second-conductivity-type semiconductor and whose polarity is different from the polarity of the first second-conductivity-type semiconductor,
a second first-conductivity-type high-concentration semiconductor which is disposed under the first second-conductivity-type semiconductor and whose polarity is different from the polarity of the first second-conductivity-type semiconductor,
a first gate insulating material formed around the first pillar, and
a first gate conductive material formed around the first gate insulating material,
the other inverter being a second inverter arranged in a second row and a first column,
the second inverter including
a second pillar that is formed by integrating, into one piece, a second first-conductivity-type semiconductor, a second second-conductivity-type semiconductor whose polarity is different from a polarity of the second first-conductivity-type semiconductor, and a second insulating material which is disposed between the second first-conductivity-type semiconductor and the second second-conductivity-type semiconductor, and that vertically extends with respect to the substrate,
a third second-conductivity-type high-concentration semiconductor which is disposed on the second first-conductivity-type semiconductor and whose polarity is different from the polarity of the second first-conductivity-type semiconductor,
a fourth second-conductivity-type high-concentration semiconductor which is disposed under the second first-conductivity-type semiconductor and whose polarity is different from the polarity of the second first-conductivity-type semiconductor,
a third first-conductivity-type high-concentration semiconductor which is disposed on the second second-conductivity-type semiconductor and whose polarity is different from the polarity of the second second-conductivity-type semiconductor,
a fourth first-conductivity-type high-concentration semiconductor which is disposed under the second second-conductivity-type semiconductor and whose polarity is different from the polarity of the second second-conductivity-type semiconductor,
a second gate insulating material formed around the second pillar, and
a second gate conductive material formed around the second gate insulating material,
one of the two selection transistors being a selection transistor arranged in the first row and the first column,
the selection transistor, which is arranged in the first row and the first column, including
a third pillar that includes a third first-conductivity-type semiconductor,
a fifth second-conductivity-type high-concentration semiconductor which is disposed on the third first-conductivity-type semiconductor and whose polarity is different from a polarity of the third first-conductivity-type semiconductor,
a sixth second-conductivity-type high-concentration semiconductor which is disposed under the third first-conductivity-type semiconductor and whose polarity is different from the polarity of the third first-conductivity-type semiconductor,
a third gate insulating material formed around the third pillar, and
a third gate conductive material formed around the third gate insulating material,
the other selection transistor being a selection transistor arranged in the second row and the second column,
the selection transistor, which is arranged in the second row and the second column, including
a fourth pillar that includes a fourth first-conductivity-type semiconductor,
a seventh second-conductivity-type high-concentration semiconductor which is disposed on the fourth first-conductivity-type semiconductor and whose polarity is different from a polarity of the fourth first-conductivity-type semiconductor,
an eighth second-conductivity-type high-concentration semiconductor which is disposed under the fourth first-conductivity-type semiconductor and whose polarity is different from the polarity of the fourth first-conductivity-type semiconductor,
a fourth gate insulating material formed around the fourth pillar, and
a fourth gate conductive material formed around the fourth gate insulating material.

2. The semiconductor device according to claim 1, wherein the second first-conductivity-type high-concentration semiconductor, the second second-conductivity-type high-concentration semiconductor, and the eighth second-conductivity-type high-concentration semiconductor are connected to one another,
the eighth second-conductivity-type high-concentration semiconductor and the second gate conductive material are connected to each other,
the fourth first-conductivity-type high-concentration semiconductor, the fourth second-conductivity-type high-concentration semiconductor, and the sixth second-conductivity-type high-concentration semiconductor are connected to one another, and
the sixth second-conductivity-type high-concentration semiconductor and the first gate conductive material are connected to each other.

3. The semiconductor device according to claim 1, wherein the first to fourth first-conductivity-type semiconductors, the first and second second-conductivity-type semiconductors, the first to fourth first-conductivity-type high-concentration semiconductors, and the first to eighth second-conductivity-type high-concentration semiconductors are formed of silicon.

4. The semiconductor device according to claim 2, wherein the first to fourth first-conductivity-type semiconductors, the first and second second-conductivity-type semiconductors, the first to fourth first-conductivity-type high-concentration semiconductors, and the first to eighth second-conductivity-type high-concentration semiconductors are formed of silicon.

5. The semiconductor device according to claim 1, wherein the first conductivity type is p type and the second conductivity type is n type.

6. The semiconductor device according to claim 2, wherein the first conductivity type is p type and the second conductivity type is n type.

* * * * *